United States Patent
Yamazaki et al.

(10) Patent No.: US 12,256,597 B2
(45) Date of Patent: Mar. 18, 2025

(54) FUNCTIONAL PANEL, DISPLAY DEVICE, INPUT/OUTPUT DEVICE, AND DATA PROCESSING DEVICE

(71) Applicant: SEMICONDUCTOR ENERGY LABORATORY CO., LTD., Atsugi (JP)

(72) Inventors: Shunpei Yamazaki, Tokyo (JP); Daiki Nakamura, Kanagawa (JP); Ryo Hatsumi, Kanagawa (JP); Rai Sato, Tochigi (JP); Shingo Eguchi, Kanagawa (JP); Koji Kusunoki, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/533,282

(22) Filed: Dec. 8, 2023

(65) Prior Publication Data
US 2024/0107799 A1 Mar. 28, 2024

Related U.S. Application Data

(63) Continuation of application No. 17/624,593, filed as application No. PCT/IB2020/056110 on Jun. 29, 2020, now Pat. No. 11,844,236.

(30) Foreign Application Priority Data
Jul. 12, 2019 (JP) .................................. 2019-129808

(51) Int. Cl.
*H10K 50/858* (2023.01)
*G02B 1/11* (2015.01)
(Continued)

(52) U.S. Cl.
CPC ............. *H10K 50/858* (2023.02); *G02B 3/00* (2013.01); *G02B 3/0056* (2013.01);
(Continued)

(58) Field of Classification Search
CPC .......... G02B 1/11; G02B 3/00; G02B 3/0006; G02B 3/0056; G02B 27/0955;
(Continued)

(56) References Cited

U.S. PATENT DOCUMENTS 5,107,175 A 4/1992 Hirano et al.
5,124,204 A 6/1992 Yamashita et al.
(Continued)

FOREIGN PATENT DOCUMENTS

CN 001329369 A 1/2002
CN 101753861 A 6/2010
(Continued)

OTHER PUBLICATIONS

International Search Report (Application No. PCT/IB2020/056110) Dated Oct. 6, 2020.
(Continued)

*Primary Examiner* — Nitin Patel
*Assistant Examiner* — Cory A Almeida
(74) *Attorney, Agent, or Firm* — Fish & Richardson P.C.

(57) ABSTRACT

A novel functional panel that is highly convenient, useful, or reliable is provided. The functional panel includes a base material and a pair of pixels, and the base material covers the pair of pixels and has a light-transmitting property. The pair of pixels includes one pixel and another pixel, and the one pixel includes a light-emitting device and a first microlens. The light-emitting device emits light toward the base material, and the first microlens is interposed between the base material and the light emission and converges light. The first microlens includes a first surface and a second surface; the
(Continued)

second surface is closer to the light-emitting device than the first surface is; and the second surface has a smaller radius of curvature than the first surface. The other pixel includes a photoelectric conversion device and a second microlens. The second microlens is interposed between the base material and the photoelectric conversion and converges external light incident from the base material side. The second microlens includes a third surface and a fourth surface; the third surface is closer to the photoelectric conversion device than the fourth surface is; and the fourth surface has a smaller radius of curvature than the third surface.

18 Claims, 30 Drawing Sheets

(51) Int. Cl.
| | |
|---|---|
| G02B 3/00 | (2006.01) |
| G02B 27/09 | (2006.01) |
| G06F 3/0354 | (2013.01) |
| G06F 3/041 | (2006.01) |
| G06F 3/042 | (2006.01) |
| G06F 3/147 | (2006.01) |
| G06F 3/16 | (2006.01) |
| G09F 9/30 | (2006.01) |
| G09G 3/30 | (2006.01) |
| G09G 3/3225 | (2016.01) |
| H05B 33/02 | (2006.01) |
| H10K 50/00 | (2023.01) |
| H10K 59/00 | (2023.01) |
| H10K 59/12 | (2023.01) |
| H10K 59/131 | (2023.01) |
| H10K 59/60 | (2023.01) |
| H10K 59/80 | (2023.01) |

(52) U.S. Cl.
CPC ..... *G02B 27/0955* (2013.01); *G06F 3/03545* (2013.01); *G06F 3/0412* (2013.01); *G06F 3/042* (2013.01); *G06F 3/0421* (2013.01); *G06F 3/147* (2013.01); *G09F 9/30* (2013.01); *G09G 3/30* (2013.01); *G09G 3/3225* (2013.01); *H05B 33/02* (2013.01); *H10K 50/00* (2023.02); *H10K 59/00* (2023.02); *H10K 59/12* (2023.02); *H10K 59/60* (2023.02); *H10K 59/879* (2023.02); *G02B 1/11* (2013.01); *G02B 3/0006* (2013.01); *G06F 3/16* (2013.01); *H10K 59/131* (2023.02)

(58) Field of Classification Search
CPC .... G06F 3/03545; G06F 3/0412; G06F 3/042; G06F 3/9421; G06F 3/147; G06F 3/16; G06F 3/0421; G09F 9/30; G09G 3/30; G09G 3/32; G09G 3/3225; H05B 33/02; H10K 50/00; H10K 50/858; H10K 59/00; H10K 59/12; H10K 59/131; H10K 59/60; H10K 59/879
See application file for complete search history.

(56) References Cited

U.S. PATENT DOCUMENTS

| | | | |
|---|---|---|---|
| 5,189,405 | A | 2/1993 | Yamashita et al. |
| 5,315,377 | A | 5/1994 | Isono et al. |
| 5,317,349 | A | 5/1994 | Vanderwerf |
| 5,686,360 | A | 11/1997 | Harvey, III et al. |
| 5,693,956 | A | 12/1997 | Shi et al. |
| 5,771,562 | A | 6/1998 | Harvey, III et al. |
| 5,811,177 | A | 9/1998 | Shi et al. |
| 5,952,778 | A | 9/1999 | Haskal et al. |
| 5,962,962 | A | 10/1999 | Fujita et al. |
| 6,144,426 | A | 11/2000 | Yamazaki et al. |
| 6,146,225 | A | 11/2000 | Sheats et al. |
| 6,150,187 | A | 11/2000 | Zyung et al. |
| 6,198,217 | B1 | 3/2001 | Suzuki et al. |
| 6,198,220 | B1 | 3/2001 | Jones et al. |
| 6,219,113 | B1 | 4/2001 | Takahara |
| 6,268,695 | B1 | 7/2001 | Affinito |
| 6,274,887 | B1 | 8/2001 | Yamazaki et al. |
| 6,407,785 | B1 | 6/2002 | Yamazaki |
| 6,771,021 | B2 | 8/2004 | Cok |
| 6,847,163 | B1 | 1/2005 | Tsutsui et al. |
| 6,856,304 | B1 | 2/2005 | Hirakata et al. |
| 6,965,195 | B2 | 11/2005 | Yamazaki et al. |
| 6,987,613 | B2 | 1/2006 | Pocius et al. |
| 7,002,659 | B1 | 2/2006 | Yamazaki et al. |
| 7,068,246 | B2 | 6/2006 | Yamazaki et al. |
| 7,144,752 | B2 | 12/2006 | Yotsuya |
| 7,182,481 | B2 | 2/2007 | Shimura |
| 7,202,504 | B2 | 4/2007 | Ikeda et al. |
| 7,245,429 | B2 | 7/2007 | Yoshikawa et al. |
| 7,473,928 | B1 | 1/2009 | Yamazaki et al. |
| 7,515,125 | B2 | 4/2009 | Yamazaki et al. |
| 7,554,263 | B2 | 6/2009 | Takahashi |
| 7,663,312 | B2 | 2/2010 | Anandan |
| 7,692,199 | B2 | 4/2010 | Arai |
| 7,722,965 | B2 | 5/2010 | Juni et al. |
| 7,755,097 | B2 | 7/2010 | Kim |
| 7,859,627 | B2 | 12/2010 | Nishida et al. |
| 7,956,349 | B2 | 6/2011 | Tsutsui et al. |
| 8,003,993 | B2 | 8/2011 | Cho et al. |
| 8,004,003 | B2 | 8/2011 | Kim |
| 8,042,975 | B2 | 10/2011 | Shyu et al. |
| 8,455,884 | B2 | 6/2013 | Ikeda et al. |
| 8,496,341 | B2 | 7/2013 | Kawata et al. |
| 8,569,783 | B2 | 10/2013 | Aoyama et al. |
| 8,625,058 | B2 | 1/2014 | Kozuma et al. |
| 8,665,357 | B2 | 3/2014 | Ishiguro et al. |
| 8,686,630 | B2 | 4/2014 | Hiyama et al. |
| 8,764,504 | B2 | 7/2014 | Hamatani et al. |
| 8,829,786 | B2 | 9/2014 | Sumida et al. |
| 8,853,724 | B2 | 10/2014 | Seo et al. |
| 9,142,802 | B2 | 9/2015 | Miyamoto et al. |
| 9,401,498 | B2 | 7/2016 | Tanaka et al. |
| 9,450,133 | B2 | 9/2016 | Nakamura et al. |
| 9,751,267 | B2 | 9/2017 | Tanaka et al. |
| 9,977,152 | B2 | 5/2018 | Zhang et al. |
| 10,451,912 | B2 | 10/2019 | Yamazaki et al. |
| 10,683,233 | B2 | 6/2020 | Nomura et al. |
| 10,759,691 | B2 | 9/2020 | Nomura et al. |
| 11,024,651 | B2 | 6/2021 | Matsusaki et al. |
| 2001/0035713 | A1 | 11/2001 | Kimura |
| 2001/0053082 | A1 | 12/2001 | Chipalkatti et al. |
| 2002/0027229 | A1 | 3/2002 | Yamazaki et al. |
| 2003/0007359 | A1 | 1/2003 | Sugawara et al. |
| 2004/0217702 | A1 | 11/2004 | Garner et al. |
| 2005/0199599 | A1 | 9/2005 | Li et al. |
| 2006/0007552 | A1 | 1/2006 | Takakuwa et al. |
| 2006/0139953 | A1 | 6/2006 | Chou et al. |
| 2006/0237735 | A1 | 10/2006 | Naulin et al. |
| 2007/0222372 | A1 | 9/2007 | Cok et al. |
| 2008/0018231 | A1 | 1/2008 | Hirakata |
| 2008/0121918 | A1 | 5/2008 | Denbaars et al. |
| 2008/0129184 | A1 | 6/2008 | Nishida et al. |
| 2008/0129933 | A1 | 6/2008 | Nishida et al. |
| 2008/0130122 | A1 | 6/2008 | Egi et al. |
| 2008/0213931 | A1 | 9/2008 | Asabe |
| 2009/0162623 | A1 | 6/2009 | Foresti et al. |
| 2009/0267092 | A1 | 10/2009 | Fukshima et al. |
| 2010/0013372 | A1 | 1/2010 | Oikawa et al. |
| 2010/0019664 | A1 | 1/2010 | Mishima |
| 2010/0046236 | A1 | 2/2010 | Nishiwaki |
| 2010/0090234 | A1 | 4/2010 | Cho et al. |
| 2010/0110551 | A1 | 5/2010 | Lamansky et al. |
| 2010/0134735 | A1 | 6/2010 | Nakamura et al. |
| 2010/0295443 | A1 | 11/2010 | Roberts et al. |
| 2011/0032409 | A1 | 2/2011 | Rossi et al. |
| 2011/0038028 | A1 | 2/2011 | Dharmatilleke |

(56) References Cited

U.S. PATENT DOCUMENTS

| | | |
|---|---|---|
| 2011/0057221 A1 | 3/2011 | Sonoda |
| 2011/0147777 A1 | 6/2011 | Konno et al. |
| 2011/0205468 A1 | 8/2011 | Hirakata et al. |
| 2011/0210332 A1 | 9/2011 | Jintyou et al. |
| 2012/0097982 A1 | 4/2012 | Wakimoto et al. |
| 2012/0097991 A1 | 4/2012 | Ikeda et al. |
| 2012/0099331 A1 | 4/2012 | Yamazaki et al. |
| 2012/0126268 A1 | 5/2012 | Seo et al. |
| 2012/0204566 A1 | 8/2012 | Hartzell et al. |
| 2012/0242884 A1 | 9/2012 | Ishiguro et al. |
| 2012/0307123 A1 | 12/2012 | Cok et al. |
| 2015/0333108 A1 | 11/2015 | Miyamoto et al. |
| 2016/0043145 A1 | 2/2016 | Choi et al. |
| 2016/0132177 A1 | 5/2016 | Bae et al. |
| 2017/0351364 A1 | 12/2017 | Kim et al. |
| 2017/0355637 A1 | 12/2017 | Nomura et al. |
| 2017/0372669 A1 | 12/2017 | Takesue et al. |
| 2018/0045866 A1* | 2/2018 | Chae ................ G02F 1/133553 |
| 2019/0198573 A1 | 6/2019 | Kim et al. |
| 2019/0329803 A1 | 10/2019 | Beier et al. |
| 2019/0363107 A1 | 11/2019 | Matsusaki et al. |
| 2020/0064528 A1 | 2/2020 | Uto et al. |
| 2020/0119113 A1* | 4/2020 | Lee ........................ H10K 50/11 |
| 2020/0388790 A1 | 12/2020 | Yamazaki et al. |
| 2021/0335831 A1 | 10/2021 | Matsusaki et al. |

FOREIGN PATENT DOCUMENTS

| | | |
|---|---|---|
| CN | 102842027 A | 12/2012 |
| CN | 107111395 A | 8/2017 |
| CN | 107207324 A | 9/2017 |
| CN | 110199572 A | 9/2019 |
| EP | 1164641 A | 12/2001 |
| EP | 2223173 A | 9/2010 |
| JP | 11-074072 A | 3/1999 |
| JP | 2002-072963 A | 3/2002 |
| JP | 2003-264059 A | 9/2003 |
| JP | 2006-196197 A | 7/2006 |
| JP | 2007-207656 A | 8/2007 |
| JP | 2010-153834 A | 7/2010 |
| JP | 2011-054526 A | 3/2011 |
| JP | 2012-199868 A | 10/2012 |
| JP | 2013-016272 A | 1/2013 |
| JP | 2013-114772 A | 6/2013 |
| JP | 2015-069700 A | 4/2015 |
| JP | 2018-174246 A | 11/2018 |
| KR | 2006-0088082 A | 8/2006 |
| KR | 2010-0061393 A | 6/2010 |
| KR | 2015-0131944 A | 11/2015 |
| KR | 2017-0110619 A | 10/2017 |
| TW | 497274 | 8/2002 |
| TW | 200947007 | 11/2009 |
| TW | 201036151 | 10/2010 |
| TW | 201639800 | 11/2016 |
| WO | WO-2016/076592 | 5/2016 |
| WO | WO-2016/125792 | 8/2016 |
| WO | WO-2018/135189 | 7/2018 |
| WO | WO-2018/180577 | 10/2018 |
| WO | WO-2018/185585 | 10/2018 |

OTHER PUBLICATIONS

Written Opinion (Application No. PCT/IB2020/056110) Dated Oct. 6, 2020.

Reineke.S et al., "White organic light-emitting diodes with fluorescent tube efficiency", Nature, May 14, 2009, vol. 459, pp. 234-239.

Motoyama.Y et al., "High-efficiency OLED microdisplay with microlens array", J. Soc. Inf. Display (Journal of the Society for Information Display), Apr. 16, 2019, vol. 27, No. 6, pp. 354-360.

Park.Y et al., "A Highly Mass-producible Nano-lens Array Technology for Optically Efficient Full-color Organic Light Emitting Diode Display Applications", SID Digest '19 : SID International Symposium Digest of Technical Papers, May 12, 2019, vol. 50, No. 1, pp. 149-152.

Chen.C et al., "3D Pixel Configurations for Optical Out-Coupling of OLED Displays—Part II: Experimental Validation", SID Digest '19 : SID International Symposium Digest of Technical Papers, May 12, 2019, vol. 50, No. 1, pp. 145-148.

Hwang.C et al., "Unique Belt Plane Source Evaporation Techniques for the Mass Production of 2250ppi AMOLED and 77" QD OLED TV", SID Digest '19 : SID International Symposium Digest of Technical Papers, May 12, 2019, vol. 50, No. 1, pp. 949-952.

* cited by examiner

FUNCTIONAL PANEL, DISPLAY DEVICE, INPUT/OUTPUT DEVICE, AND DATA PROCESSING DEVICE

CROSS REFERENCE TO RELATED APPLICATIONS

This application is a is a continuation of U.S. application Ser. No. 17/624,593, filed Jan. 4, 2022, now allowed, which is incorporated by reference and is a U.S. National Phase Application under 35 U.S.C. § 371 of International Application PCT/IB2020/056110, filed on Jun. 29, 2020, which is incorporated by reference and claims the benefit of a foreign priority application filed in Japan on Jul. 12, 2019, as Application No. 2019-129808.

TECHNICAL FIELD

One embodiment of the present invention relates to a functional panel, a display device, an input/output device, a data processing device, or a semiconductor device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Thus, more specifically, examples of the technical field of one embodiment of the present invention disclosed in this specification include a semiconductor device, a display device, a light-emitting apparatus, a power storage device, a memory device, a driving method thereof, and a manufacturing method thereof.

BACKGROUND ART

A high-efficiency organic EL microdisplay that focuses on the increase in out-coupling efficiency using a microlens array and has an efficiency three times that of a conventional organic light-emitting diode is known (Non-Patent Document 1).

There is known a technique for increasing the current efficiency of a red organic light-emitting diode by 1.57 times using a nanolens array formed by a vacuum evaporation process (Non-Patent Document 2).

There is also known a technique for increasing the efficiency of extracting light from an organic light-emitting diode with the use of a concave structure that is formed by filling the inner side of a bank with a high-index filler (Non-Patent Document 3).

There is also known a technique for forming a high-definition organic light-emitting diode on a large-sized glass substrate by using a belt-shaped evaporation source (Non-Patent Document 4).

REFERENCES

Non-Patent Documents

[Non-Patent Document 1] Yosuke Motoyama et al., Journal of the Society for Information Display, 2019, pp. 1-7.
[Non-Patent Document 2] Young-Sam Park et al., "SID Symposium Digest of Technical Papers", 2019, volume 50, issue 1, pp. 149-152.
[Non-Patent Document 3] Chung-China Chen et al., "SID Symposium Digest of Technical Papers", 2019, volume 50, issue 1, pp. 145-148.
[Non-Patent Document 4] Changhun Hwang et al., "SID Symposium Digest of Technical Papers", 2019, volume 50, issue 1, pp. 949-952.

SUMMARY OF THE INVENTION

Problems to be Solved by the Invention

An object of one embodiment of the present invention is to provide a novel functional panel that is highly convenient, useful, or reliable. Another object is to provide a novel display device that is highly convenient, useful, or reliable. Another object is to provide a novel input/output device that is highly convenient, useful, or reliable. Another object is to provide a novel data processing device that is highly convenient, useful, or reliable. Another object is to provide a novel functional panel, a novel display device, a novel input/output device, a novel data processing device, or a novel semiconductor device.

Note that the description of these objects does not preclude the existence of other objects. One embodiment of the present invention does not have to achieve all these objects. Other objects will be apparent from the description of the specification, the drawings, the claims, and the like, and other objects can be derived from the description of the specification, the drawings, the claims, and the like.

Means for Solving the Problems (1) One embodiment of the present invention is a functional panel including a base material and a pair of pixels.

The base material covers the pair of pixels and the base material has a light-transmitting property.

The pair of pixels includes one pixel and another pixel; the one pixel includes a light-emitting device and a first microlens; and the light-emitting device emits light toward the base material.

The first microlens is interposed between the base material and the light-emitting device and the first microlens converges light. The first microlens includes a first surface and a second surface. The second surface is closer to the light-emitting device than the first surface is, and the second surface has a smaller radius of curvature than the first surface.

The other pixel includes a photoelectric conversion device and a second microlens.

The second microlens is interposed between the base material and the photoelectric conversion device and the second microlens converges external light incident from the base material side. The second microlens includes a third surface and a fourth surface. The third surface is closer to the photoelectric conversion device than the fourth surface is, and the fourth surface has a smaller radius of curvature than the third surface.

Thus, the direction of the light emitted from the light-emitting device can be changed in the one pixel. The incident angle of the light to the base material can be changed. The proportion of light traveling inside the base material in the light can be reduced. The light can be extracted efficiently. In the other pixel, external light can be efficiently received by the photoelectric conversion device. As a result, a novel functional panel that is highly convenient, useful, or reliable can be provided.

(2) Another embodiment of the present invention is the above functional panel in which the other pixel includes a third microlens.

The third microlens is interposed between the base material and the second microlens and the third microlens converges external light.

The third microlens includes a fifth surface and a sixth surface, and the sixth surface is closer to the photoelectric conversion device than the fifth surface is. The sixth surface has a smaller radius of curvature than the fifth surface.

Thus, in the other pixel, external light can be guided to the second microlens through the third microlens. External light can be efficiently received by the photoelectric conversion device. As a result, a novel functional panel that is highly convenient, useful, or reliable can be provided.

(3) Another embodiment of the present invention is the above functional panel in which the one pixel includes a fourth microlens.

The fourth microlens is interposed between the first microlens and the light-emitting device and the fourth microlens converges light.

The fourth microlens includes a seventh surface and an eighth surface and the seventh surface is closer to the light-emitting device than the eighth surface is. The eighth surface has a smaller radius of curvature than the seventh surface.

Thus, in the pixel, the light emitted from the light-emitting device can be guided to the first microlens through the fourth microlens. The direction of the light can be changed. The incident angle of the light to the base material can be changed. The proportion of light traveling inside the base material in the light can be reduced. As a result, a novel functional panel that is highly convenient, useful, or reliable can be provided.

(4) Another embodiment of the present invention is the above functional panel in which the one pixel includes a first pixel circuit and the other pixel includes a second pixel circuit $530S(i, j)$.

The light-emitting device is electrically connected to the first pixel circuit and the photoelectric conversion device is electrically connected to the second pixel circuit.

(5) Another embodiment of the present invention is the above functional panel including a functional layer.

The functional layer includes the first pixel circuit, and the first pixel circuit includes a first transistor.

The functional layer includes the second pixel circuit and the second pixel circuit includes a second transistor.

The functional layer includes a driver circuit and the driver circuit includes a third transistor.

The first transistor includes a semiconductor film, the second transistor includes a semiconductor film that can be formed in the step of forming the semiconductor film, and the third transistor also includes a semiconductor film that can be formed in the step of forming the semiconductor film.

Thus, the pixel circuit can be formed in the functional layer. The semiconductor film used in the pixel circuit can be formed in the step of forming the semiconductor film used in the pixel circuit, for example. The manufacturing process of the functional panel can be simplified. As a result, a novel functional panel that is highly convenient, useful, or reliable can be provided.

(6) One embodiment of the present invention is a display device including the above functional panel and a control portion.

The control portion is supplied with image data and control data; the control portion generates data on the basis of the image data; the control portion generates a control signal on the basis of the control data; and the control portion supplies the data and the control signal.

The functional panel is supplied with the data and the control signal, and the pixel emits light in response to the data.

Thus, the image data can be displayed using the light-emitting device. Thus, a novel display device that is highly convenient, useful, or reliable can be provided.

(7) One embodiment of the present invention is an input/output device including an input portion and a display portion.

The display portion includes the above functional panel.

The input portion includes a sensing region, and the input portion senses an object approaching the sensing region. The sensing region includes a region overlapping with the pixel.

Thus, the object approaching the region overlapping with a display portion 230 can be sensed while image data VI is displayed on the display portion 230. A finger or the like approaching the display portion 230 can be used as a pointer to input position data. The position data can be associated with the image data VI displayed on the display portion 230. Thus, a novel input/output device that is highly convenient, useful, or reliable can be provided.

(8) One embodiment of the present invention is a data processing device including an arithmetic device and an input/output device.

The arithmetic device is supplied with input data or sensing data, the arithmetic device generates control data and image data on the basis of the input data or the sensing data, and the arithmetic device supplies the control data and the image data.

The input/output device supplies the input data and the sensing data, the input/output device is supplied with the control data and the image data, and the input/output device includes a display portion, an input portion, and a sensing portion.

The display portion includes the above functional panel, the display portion displays the image data on the basis of the control data, the input portion generates the input data, and the sensing portion generates the sensing data.

Thus, the control data can be generated on the basis of the input data or the sensing data. The image data can be displayed on the basis of the input data or the sensing data. Thus, a novel data processing device that is highly convenient, useful, or reliable can be provided.

(9) One embodiment of the present invention is a data processing device including the above functional panel and one or more of a keyboard, a hardware button, a pointing device, a touch sensor, an illuminance sensor, an imaging device, an audio input device, an eye-gaze input device, and an attitude detection device.

Thus, the arithmetic device can generate the image data or the control data on the basis of the data supplied using a variety of input devices. Thus, a novel data processing device that is highly convenient, useful, or reliable can be provided.

In a block diagram shown in the drawings attached to this specification, components are classified according to their functions and shown as independent blocks; however, it is difficult to separate actual components completely according to their functions, and it is possible for one component to relate to a plurality of functions.

In this specification, the names of a source and a drain of a transistor interchange with each other depending on the polarity of the transistor and the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, for the sake of convenience, the connection relationship of a transistor is sometimes described assuming that the source and the drain are fixed; in reality, the source and the drain interchange with each other according to the above relationship of the potentials.

In this specification, a source of a transistor means a source region that is part of a semiconductor film functioning as an active layer or a source electrode connected to the semiconductor film. Similarly, a drain of a transistor means a drain region that is part of the semiconductor film or a drain electrode connected to the semiconductor film. Moreover, a gate means a gate electrode.

In this specification, a state in which transistors are connected in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification, connection means electrical connection and corresponds to a state in which a current, a voltage, or a potential can be supplied or transmitted. Accordingly, a state of being connected does not necessarily mean a state of being directly connected and also includes, in its category, a state of being indirectly connected through a circuit element such as a wiring, a resistor, a diode, or a transistor that allows a current, a voltage, or a potential to be supplied or transmitted.

In this specification, even when independent components are connected to each other in a circuit diagram, there is actually a case where one conductive film has functions of a plurality of components, such as a case where part of a wiring functions as an electrode, for example. Connection in this specification also includes such a case where one conductive film has functions of a plurality of components, in its category.

Furthermore, in this specification, one of a first electrode and a second electrode of a transistor refers to a source electrode and the other refers to a drain electrode.

Effect of the Invention

According to one embodiment of the present invention, a novel functional panel that is highly convenient, useful, or reliable can be provided. A novel display device that is highly convenient, useful, or reliable can be provided. A novel input/output device that is highly convenient, useful, or reliable can be provided. A novel data processing device that is highly convenient, useful, or reliable can be provided. A novel functional panel, a novel display device, a novel input/output device, a novel data processing device, or a novel semiconductor device can be provided.

Note that the description of these effects does not preclude the existence of other effects. One embodiment of the present invention does not have to have all of these effects. Other effects will be apparent from the description of the specification, the drawings, the claims, and the like and other effects can be derived from the description of the specification, the drawings, the claims, and the like.

MODE FOR CARRYING OUT THE INVENTION

Figure 1A:
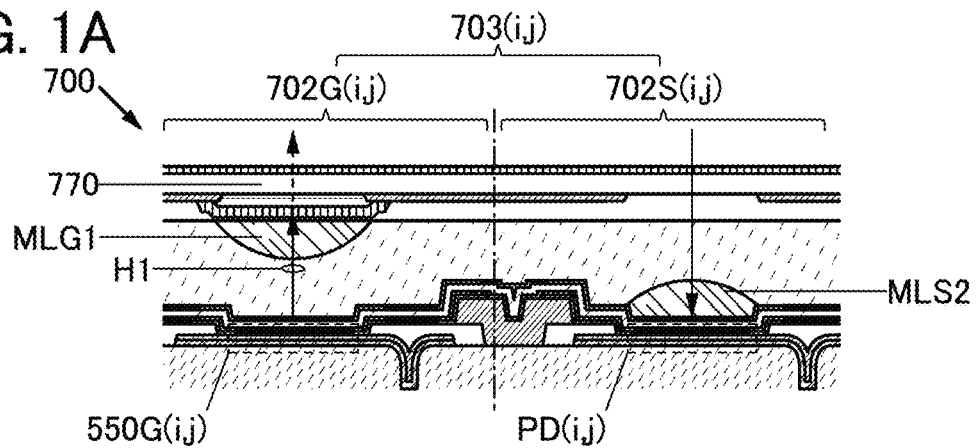
FIG. 1A to FIG. 1C are diagrams illustrating a structure of a functional panel of an embodiment.

A functional panel of one embodiment of the present invention includes a base material and a pair of pixels. The base material covers the pair of pixels and the base material has a light-transmitting property.

The pair of pixels includes one pixel and another pixel and the one pixel includes a light-emitting device and a first microlens. The light-emitting device emits light H1 toward the base material; the first microlens is interposed between the base material and the light-emitting device; and the first microlens converges light. Note that the first microlens includes a first surface and a second surface; the second surface is closer to the light-emitting device than the first surface is; and the second surface has a smaller radius of curvature than the first surface.

The other pixel includes a photoelectric conversion device and a second microlens. The second microlens is interposed between the base material and the photoelectric conversion device and the second microlens converges external light incident from the base material side. The second microlens includes a third surface and a fourth surface; the third surface is closer to the photoelectric conversion device than the fourth surface is; and the fourth surface has a smaller radius of curvature than the third surface.

Thus, the direction of the light emitted from the light-emitting device can be changed in the one pixel. The incident angle of the light to the base material can be changed. The proportion of light traveling inside the base material in the light can be reduced. The light can be extracted efficiently. In the other pixel, external light can be efficiently received by the photoelectric conversion device. As a result, a novel functional panel that is highly convenient, useful, or reliable can be provided.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments. Note that in structures of the invention described below, the same portions or portions having similar functions are denoted by the same reference numerals in different drawings, and a description thereof is not repeated.

Embodiment 1

In this embodiment, structures of a functional panel of one embodiment of the present invention will be described with reference to FIG. 1 to FIG. 3 and FIG. 27 to FIG. 30.

Figure 1B:
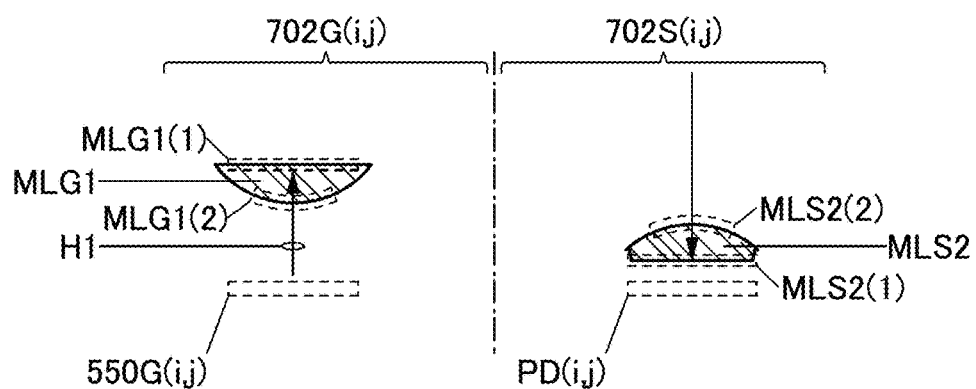
Figure 1C:
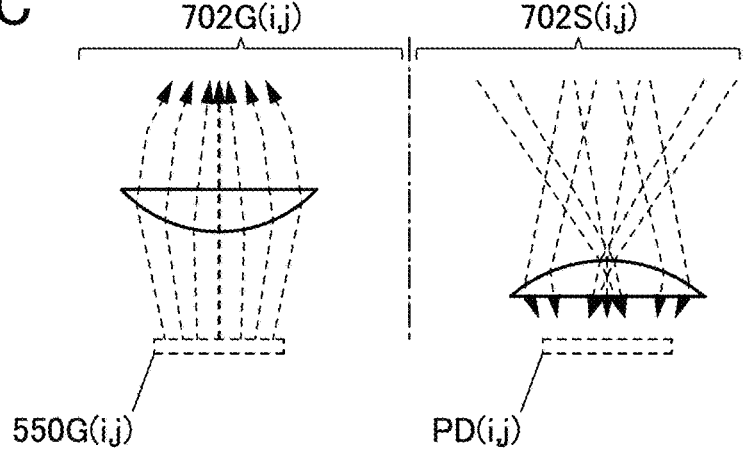

FIG. 1 is a diagram illustrating a structure of the functional panel of one embodiment of the present invention. FIG. 1A is a cross-sectional view illustrating a structure of pixels in the functional panel of one embodiment of the present invention; FIG. 1B is a diagram illustrating part of FIG. 1A; and FIG. 1C is a schematic view illustrating light beams in the pixels.

Figure 2A:
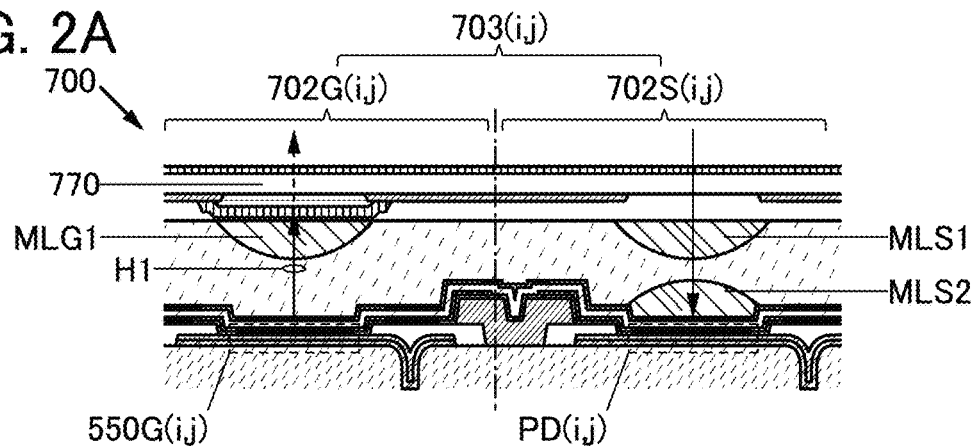
FIG. 2A to FIG. 2C are diagrams illustrating a structure of a functional panel of an embodiment.
Figure 2B:
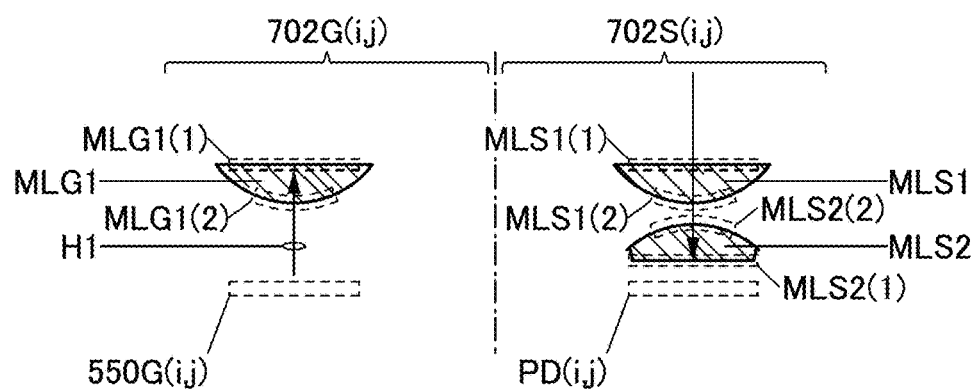
Figure 2C:
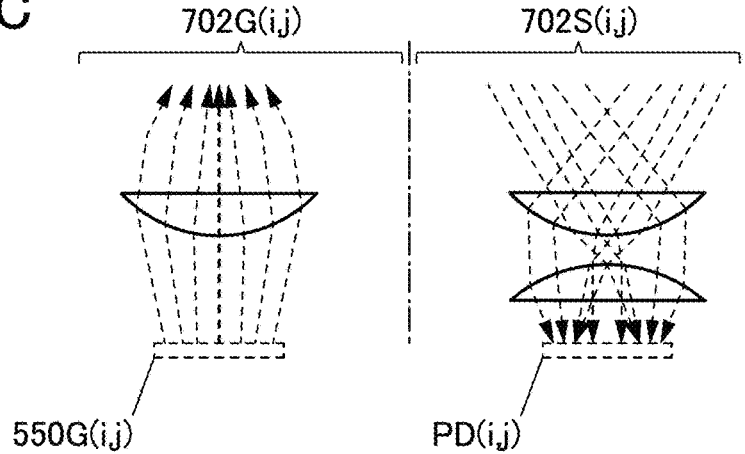

FIG. 2 is a diagram illustrating a structure of the functional panel of one embodiment of the present invention. FIG. 2A is a cross-sectional view illustrating a structure of pixels in the functional panel of one embodiment of the present invention; FIG. 2B is a diagram illustrating part of FIG. 2A; and FIG. 2C is a schematic view illustrating light beams in the pixels.

Figure 3A:
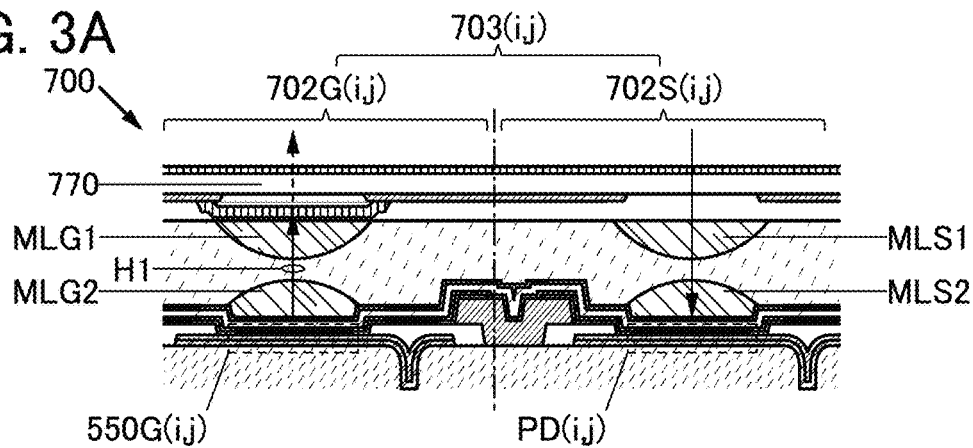
FIG. 3A to FIG. 3C are diagrams illustrating a structure of a functional panel of an embodiment.
Figure 3B:
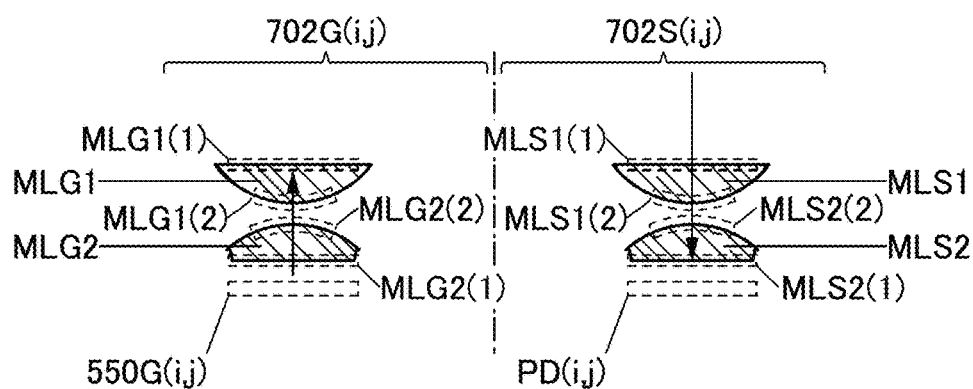
Figure 3C:
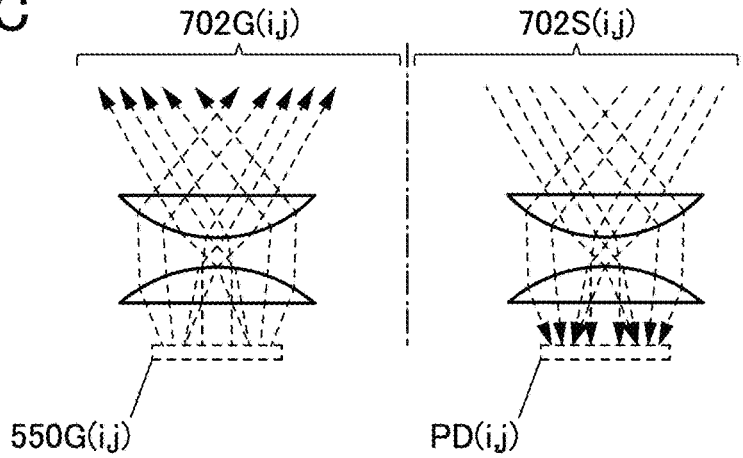

FIG. 3 is a diagram illustrating a structure of the functional panel of one embodiment of the present invention. FIG. 3A is a cross-sectional view illustrating a structure of pixels in the functional panel of one embodiment of the present invention; FIG. 3B is a diagram illustrating part of FIG. 3A; and FIG. 3C is a schematic view illustrating light beams in the pixels.

Figure 27A:
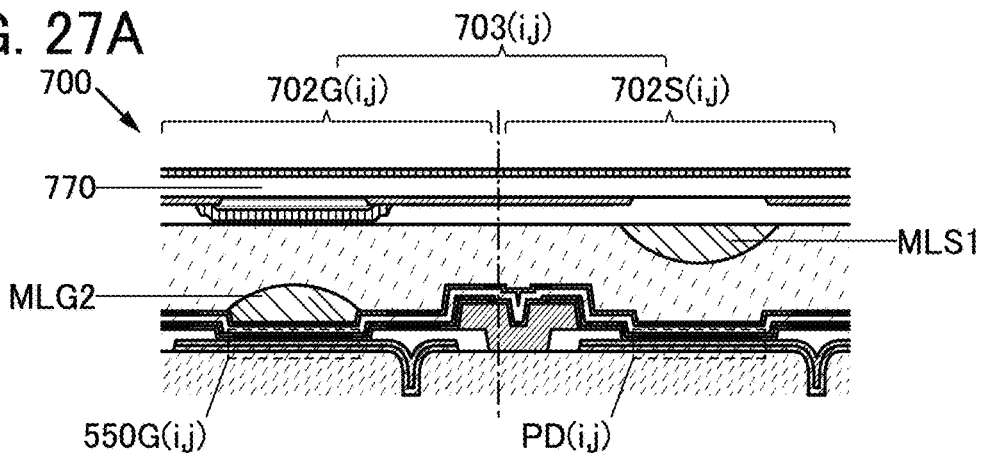
FIG. 27A to FIG. 27C are diagrams illustrating structures of a functional panel of an embodiment.
Figure 27B:
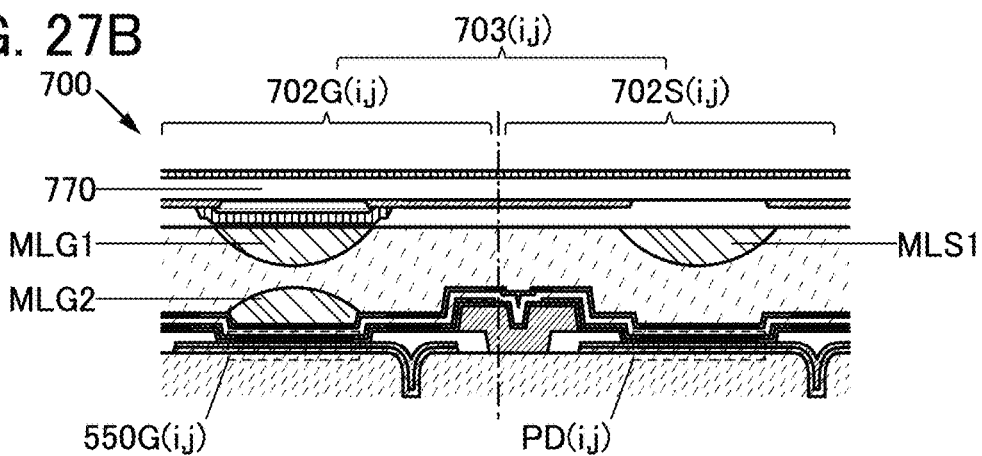
Figure 27C:
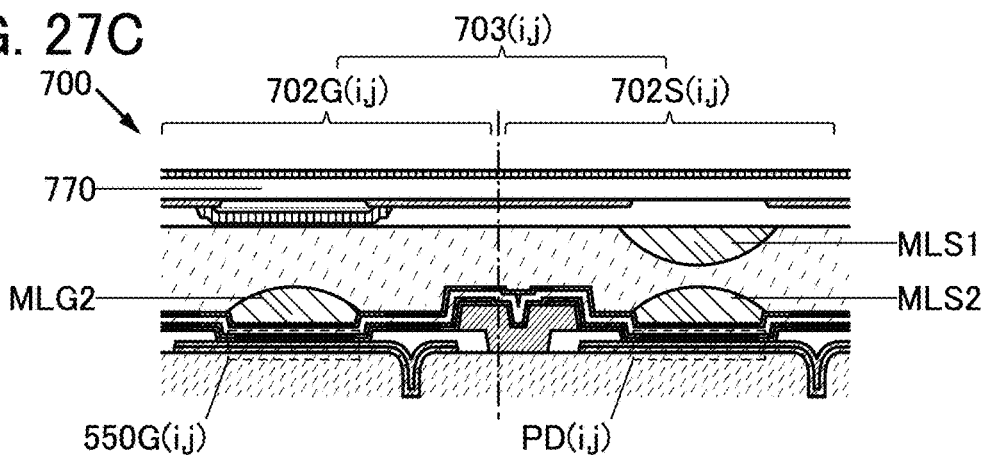

FIG. 27 is a diagram illustrating a structure of the functional panel of one embodiment of the present invention. FIG. 27A to FIG. 27C are cross-sectional views illustrating modification examples of the functional panel of one embodiment of the present invention.

Figure 28A:
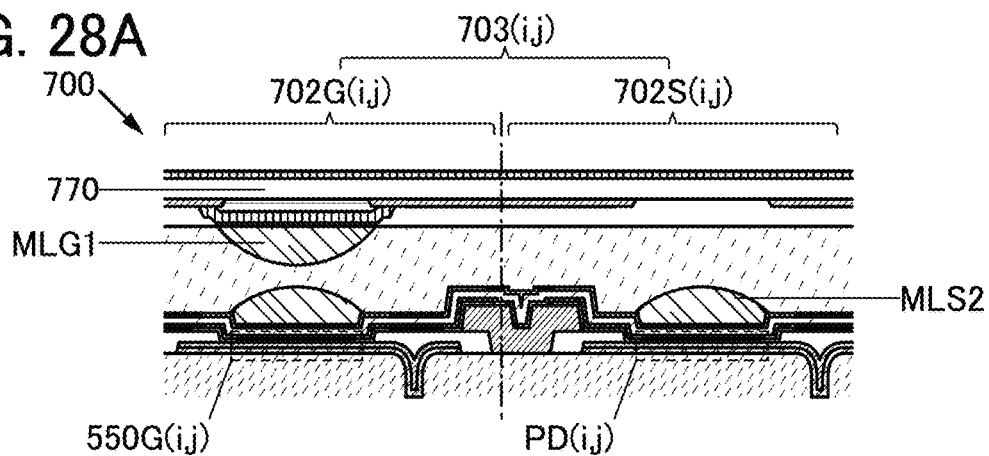
FIG. 28A to FIG. 28C are diagrams illustrating structures of a functional panel of an embodiment.
Figure 28B:
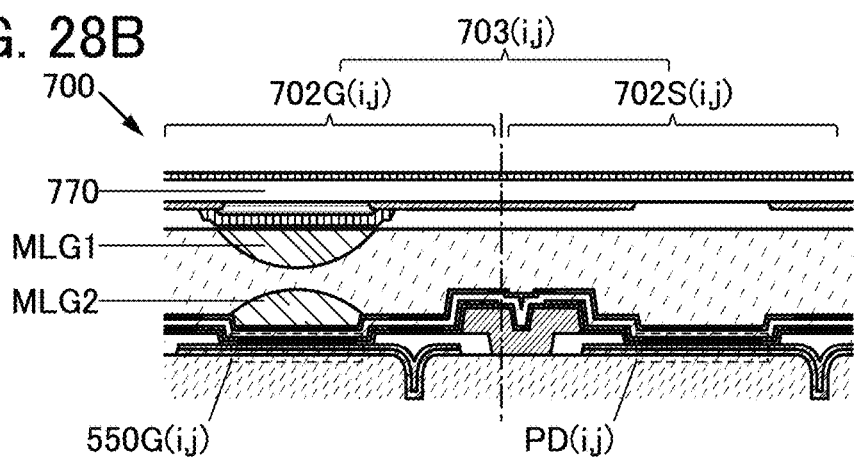
Figure 28C:
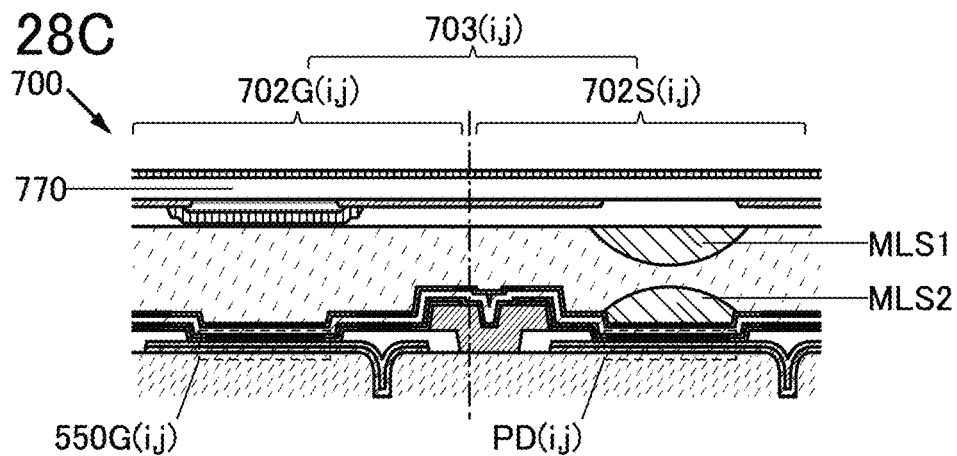
Figure 29A:
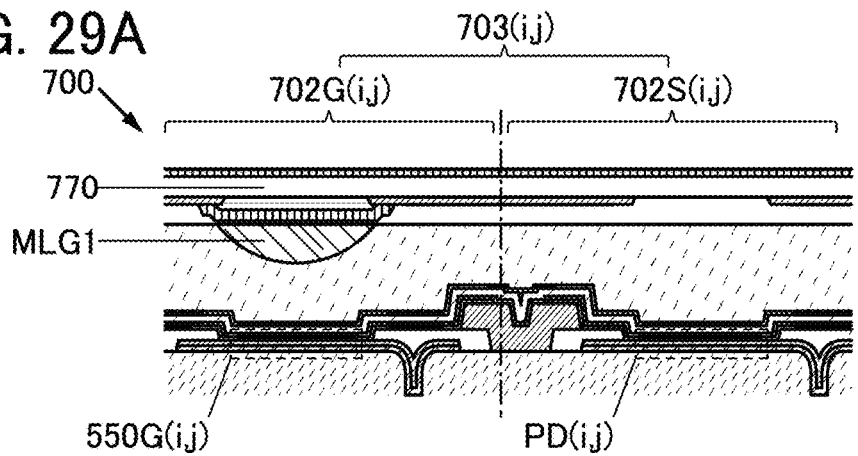
FIG. 29A to FIG. 29C are diagrams illustrating structures of a functional panel of an embodiment.
Figure 29B:
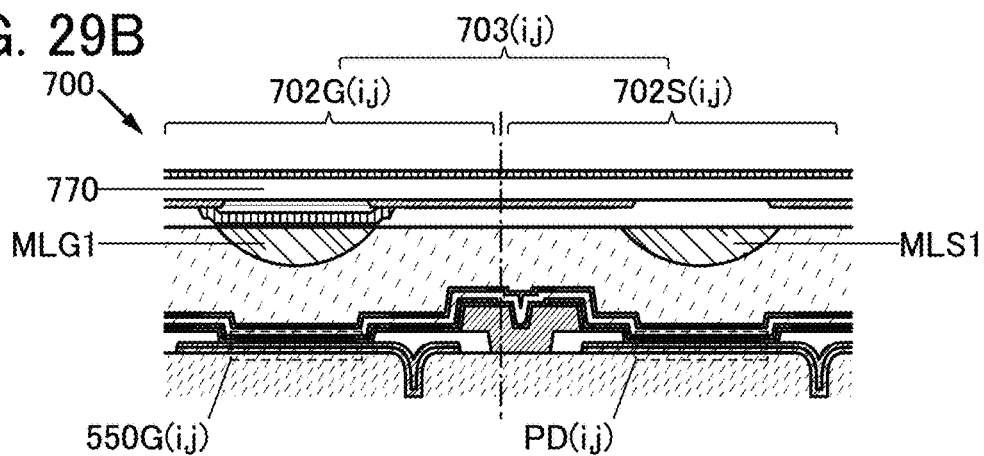
Figure 29C:
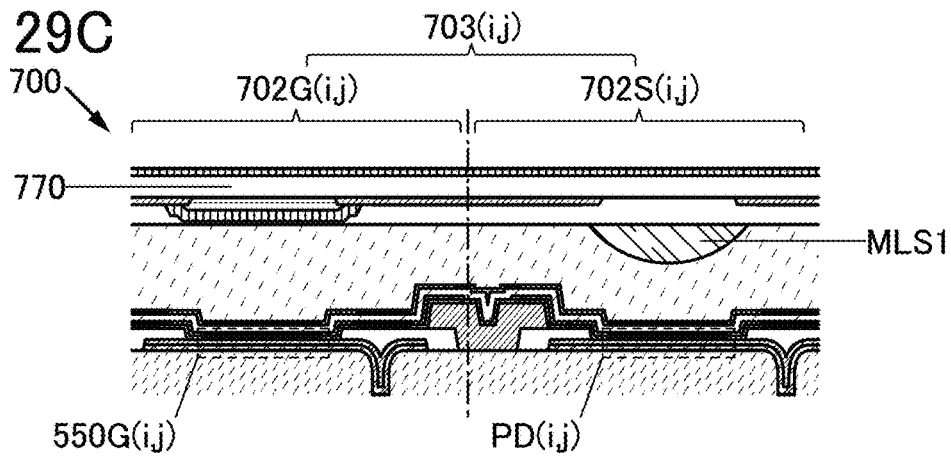

FIG. 28 is a diagram illustrating a structure of the functional panel of one embodiment of the present invention. FIG. 28A to FIG. 28C are cross-sectional views illustrating modification examples of the functional panel of one embodiment of the present invention. FIG. 29 is a diagram illustrating a structure of the functional panel of one embodiment of the present invention. FIG. 29A to FIG. 29C are cross-sectional views illustrating modification examples of the functional panel of one embodiment of the present invention.

Figure 30A:
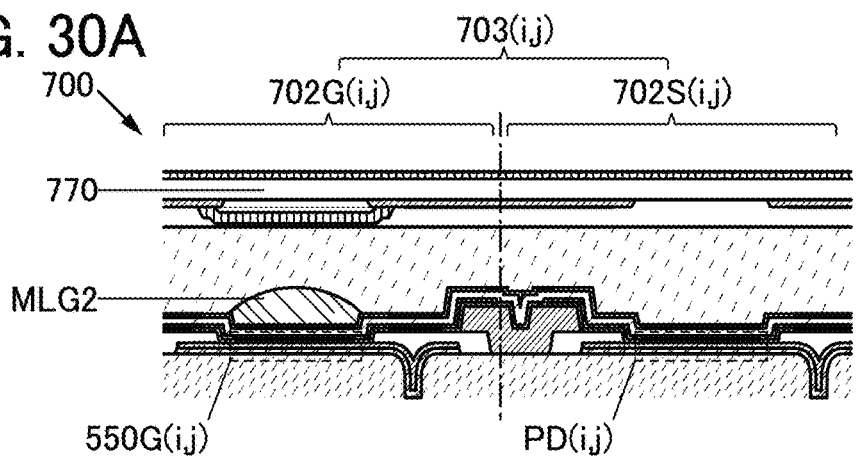
FIG. 30A to FIG. 30C are diagrams illustrating structures of a functional panel of an embodiment.
Figure 30B:
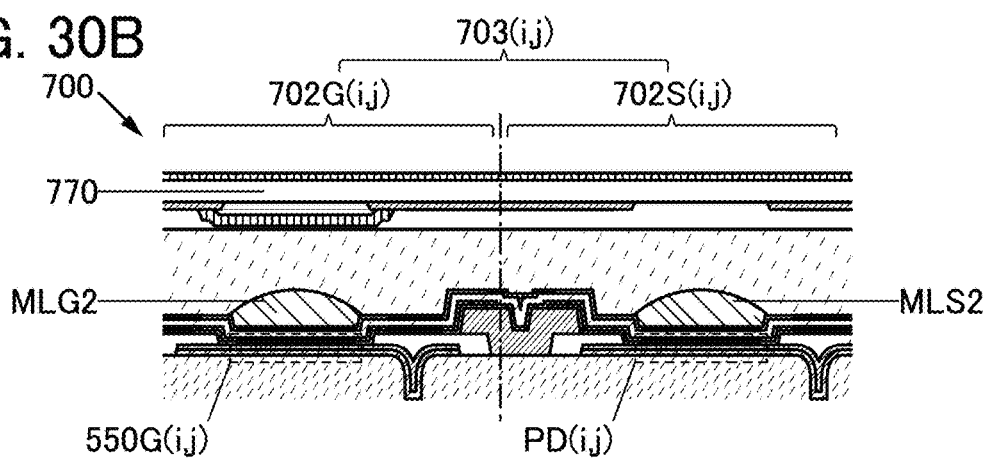
Figure 30C:
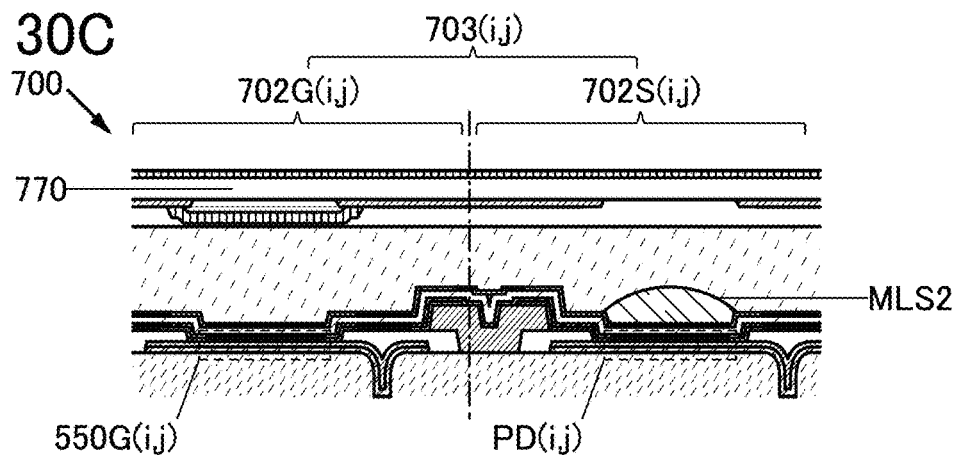

FIG. 30 is a diagram illustrating a structure of the functional panel of one embodiment of the present invention. FIG. 30A to FIG. 30C are cross-sectional views illustrating modification examples of the functional panel of one embodiment of the present invention.

Note that in this specification, an integer variable of 1 or more is sometimes used in reference numerals. For example, (p) where p is an integer variable of 1 or more is sometimes used in part of a reference numeral that specifies any of p components at a maximum. As another example, (m, n) where m and n are each an integer variable of 1 or more is sometimes used in part of a reference numeral that specifies any of m×n components at a maximum.

<Structure Example 1 of Functional Panel 700>

A functional panel 700 of one embodiment of the present invention includes a base material 770 and a pair of pixels 703($i, j$) (see FIG. 1A).

<<Structure Example 1 of Base Material 770>>

The base material 770 covers the pair of pixels 703($i, j$) and has a light-transmitting property.

<<Structure Example 1 of Pair of Pixels 703($i, j$)>>

The pair of pixels 703($i, j$) includes a pixel 702G(i, j) and a pixel 702S(i, j).

<<Structure Example 1 of Pixel 702G(i, j)>>

The pixel 702G(i, j) includes a light-emitting device 550G(i, j) and a microlens MLG1.

The light-emitting device 550G(i, j) emits light H1 toward the base material 770.

The microlens MLG1 is interposed between the base material 770 and the light-emitting device 550G(i, j) and converges the light H1 (see FIG. 1C).

The microlens MLG1 includes a surface MLG1(1) and a surface MLG1(2), and the surface MLG1(2) is closer to the light-emitting device 550G(i, j) than the surface MLG1(1) is. The surface MLG1(2) has a smaller radius of curvature than the surface MLG1(1) (see FIG. 1B).

Note that the surface MLG1(1) has a larger area than an area of the light-emitting device 550G(i, j) where light is emitted.

<<Structure Example 1 of Pixel 702S(i, j)>>

The pixel 702S(i, j) includes a photoelectric conversion device PD(i, j) and a microlens MLS2 (see FIG. 1A).

The microlens MLS2 is interposed between the base material 770 and the photoelectric conversion device PD(i, j) and converges external light incident from the base material 770 side (see FIG. 1C).

The microlens MLS2 includes a surface MLS2(1) and a surface MLS2(2), and the surface MLS2(1) is closer to the photoelectric conversion device PD(i, j) than the surface MLS2(2) is. The surface MLS2(2) has a smaller radius of curvature than the surface MLS2(1) (see FIG. 1B).

Note that the surface MLS2(1) has a larger area than an area of the photoelectric conversion device PD(i, j) where light is received.

Thus, the direction of the light H1 emitted from the light-emitting device 550G(i, j) can be changed in the pixel 702G(i, j). The incident angle of the light H1 to the base material 770 can be changed. The proportion of light traveling inside the base material 770 in the light H1 can be reduced. The light H1 can be extracted efficiently. In the pixel 702S(i, j), external light can be efficiently received by the photoelectric conversion device PD(i, j). As a result, a novel functional panel that is highly convenient, useful, or reliable can be provided.

<<Structure Example 2 of Pixel 702S(i, j)>>

The pixel 702S(i, j) includes a microlens MLS1 (see FIG. 2A). The microlens MLS1 is interposed between the base material 770 and the microlens MLS2 and converges external light (see FIG. 2C).

The microlens MLS1 includes a surface MLS1(1) and a surface MLS1(2), and the surface MLS1(2) is closer to the photoelectric conversion device PD(i, j) than the surface MLS1(1) is (see FIG. 2B). The surface MLS1(2) has a smaller radius of curvature than the surface MLS1(1).

Note that the surface MLS1(1) has a larger area than an area of the photoelectric conversion device PD(i, j) where light is received.

Thus, in the pixel 702S(i, j), external light can be guided to the second microlens MLS2 through the third microlens MLS1. External light can be efficiently received by the photoelectric conversion device PD(i, j). As a result, a novel functional panel that is highly convenient, useful, or reliable can be provided.

<<Structure Example 2 of Pixel 702G(i, j)>>

The pixel 702G(i, j) includes a microlens MLG2, and the microlens MLG2 is interposed between the microlens MLG1 and the light-emitting device 550G(i, j) (see FIG. 3A). The microlens MLG2 converges the light H1.

The microlens MLG2 includes a surface MLG2(1) and a surface MLG2(2), and the surface MLG2(1) is closer to the light-emitting device 550G(i, j) than the surface MLG2(2) is (see FIG. 3C). The surface MLG2(2) has a smaller radius of curvature than the surface MLG2(1) (see FIG. 3B).

Note that the surface MLG2(1) has a larger area than an area of the light-emitting device 550G(i, j) where light is emitted.

Thus, in the pixel 702G(i, j), the light H1 emitted from the light-emitting device 550G(i, j) can be guided to the first microlens MLG1 through the fourth microlens MLG2. The direction of the light H1 can be changed. The incident angle of the light H1 to the base material 770 can be changed. The proportion of light traveling inside the base material 770 in the light H1 can be reduced. As a result, a novel functional panel that is highly convenient, useful, or reliable can be provided.

<Structure Example 2 of Functional Panel 700>

For another example, the functional panel 700 can employ a structure in which the pixel 702G(i, j) includes the microlens MLG2 and the pixel 702S(i, j) includes the microlens MLS1 (see FIG. 27A).

The functional panel 700 can employ a structure in which the pixel 702G(i, j) includes the microlens MLG1 and the microlens MLG2 and the pixel 702S(i, j) includes the microlens MLS1 (see FIG. 27B).

The functional panel 700 can employ a structure in which the pixel 702G(i, j) includes the microlens MLG2 and the pixel 702S(i, j) includes the microlens MLS1 and the microlens MLS2 (see FIG. 27C).

<Structure Example 3 of Functional Panel 700>

For another example, the functional panel 700 can employ a structure in which the pixel 702G(i, j) includes the microlens MLG1 and the microlens MLG2 and the pixel 702S(i, j) includes the microlens MLS2 (see FIG. 28A).

The functional panel 700 can employ a structure in which the pixel 702G(i, j) includes the microlens MLG1 and the microlens MLG2 (see FIG. 28B).

The functional panel 700 can employ a structure in which the pixel 702S(i, j) includes the microlens MLS1 and the microlens MLS2 (see FIG. 28C).

<Structure Example 4 of Functional Panel 700>

For another example, the functional panel 700 can employ a structure in which the pixel 702G(i, j) includes the microlens MLG1 (see FIG. 29A).

The functional panel 700 can employ a structure in which the pixel 702G(i, j) includes the microlens MLG1 and the pixel 702S(i, j) includes the microlens MLS1 (see FIG. 29B).

The functional panel 700 can employ a structure in which the pixel 702S(i, j) includes the microlens MLS1 (see FIG. 29C).

<Structure Example 5 of Functional Panel 700>

For another example, the functional panel 700 can employ a structure in which the pixel 702G(i, j) includes the microlens MLG2 (see FIG. 30A).

The functional panel 700 can employ a structure in which the pixel 702G(i, j) includes the microlens MLG2 and the pixel 702S(i, j) includes the microlens MLS2 (see FIG. 30B).

The functional panel 700 can employ a structure in which the pixel 702S(i, j) includes the microlens MLS2 (see FIG. 30C).

Note that this embodiment can be combined with any of the other embodiments in this specification as appropriate.

Embodiment 2

In this embodiment, structures of a functional panel of one embodiment of the present invention will be described with reference to FIG. 4.

Figure 4A:
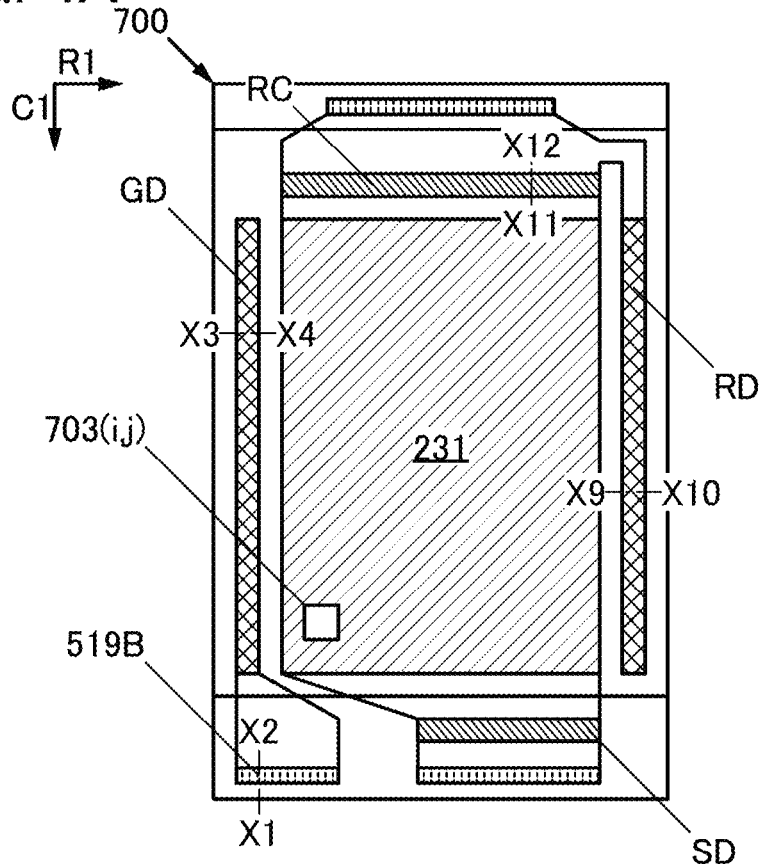
FIG. 4A and FIG. 4B are diagrams illustrating a structure of a functional panel of an embodiment.
Figure 4B:
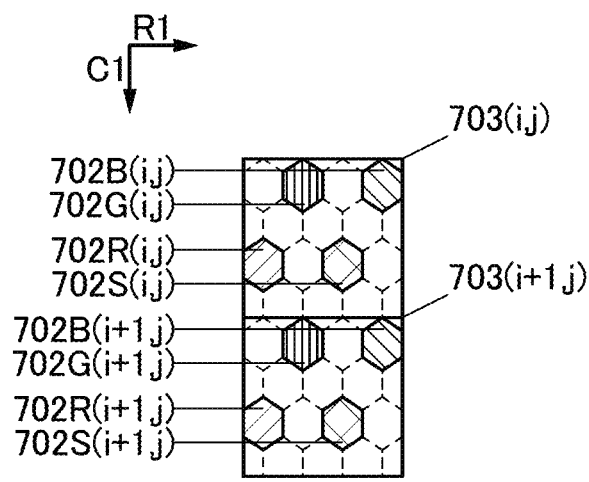

FIG. 4 is a diagram illustrating a structure of the functional panel of one embodiment of the present invention. FIG. 4A is a top view illustrating the structure of the functional panel of one embodiment of the present invention and FIG. 4B is a diagram illustrating part of FIG. 4A.

Figure 5A:
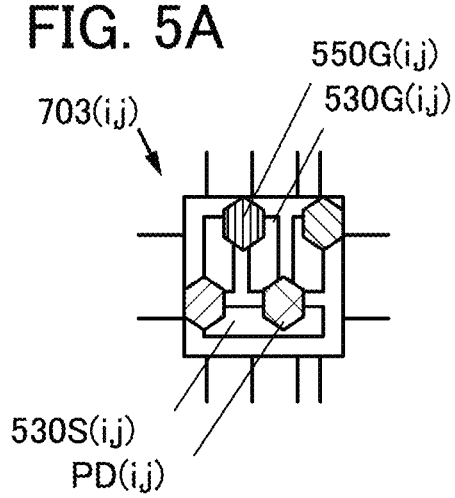
FIG. 5A to FIG. 5C are diagrams illustrating a structure of a functional panel of an embodiment.
Figure 5B:
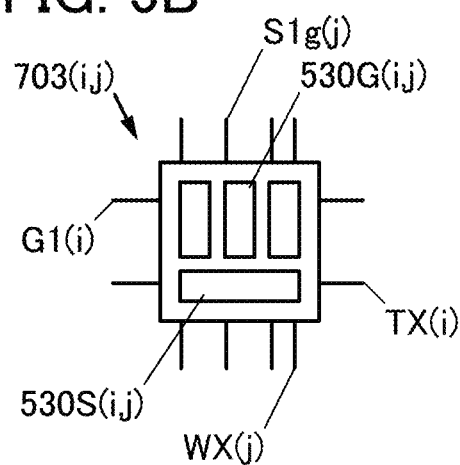
Figure 5C:
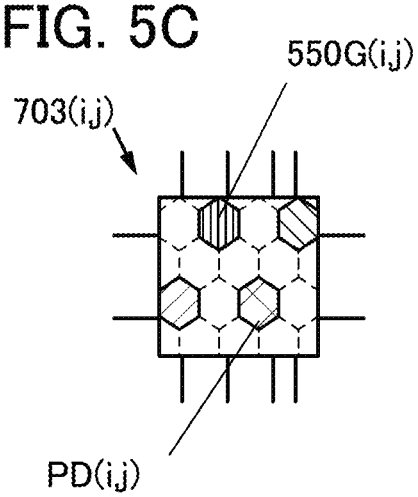

FIG. 5A is a diagram illustrating part of FIG. 4A, FIG. 5B is a diagram illustrating part of FIG. 5A, and FIG. 5C is a diagram illustrating another part of FIG. 5A.

Figure 6:
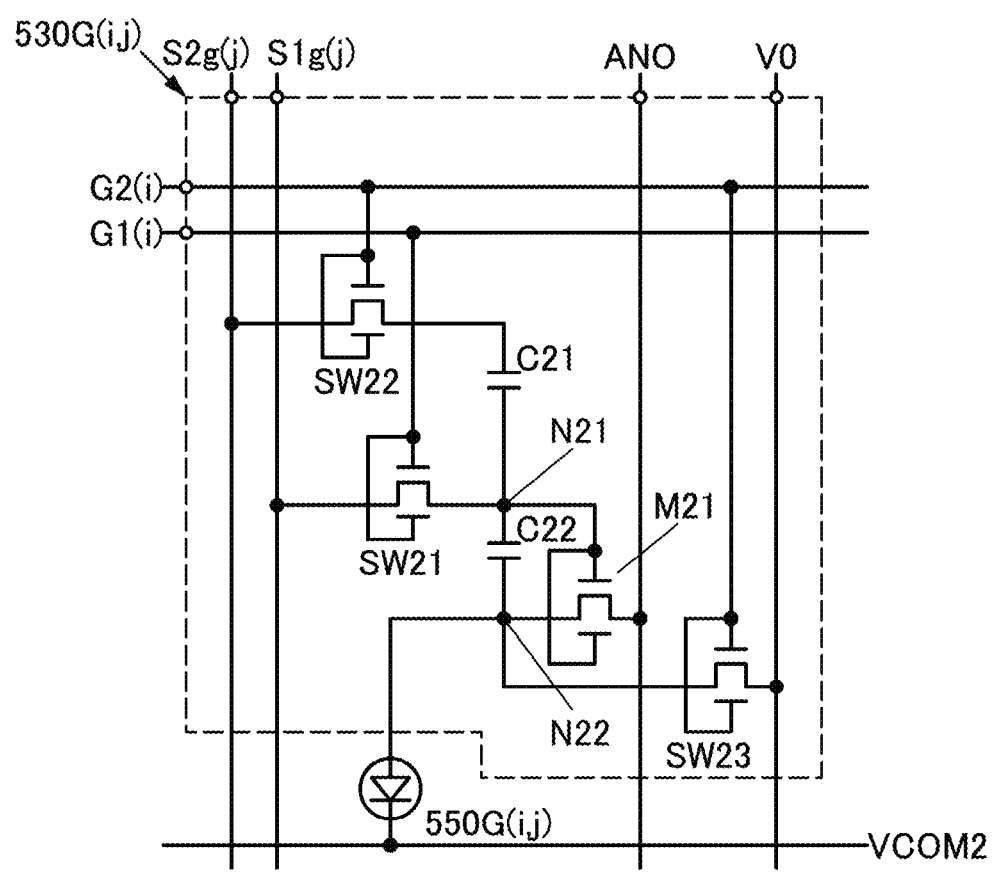
FIG. 6 is a circuit diagram illustrating a structure of a functional panel of an embodiment.

FIG. 6 is a diagram illustrating a structure of the functional panel of one embodiment of the present invention. FIG. 6 is a diagram illustrating a structure of the pixel circuit.

Figure 7:
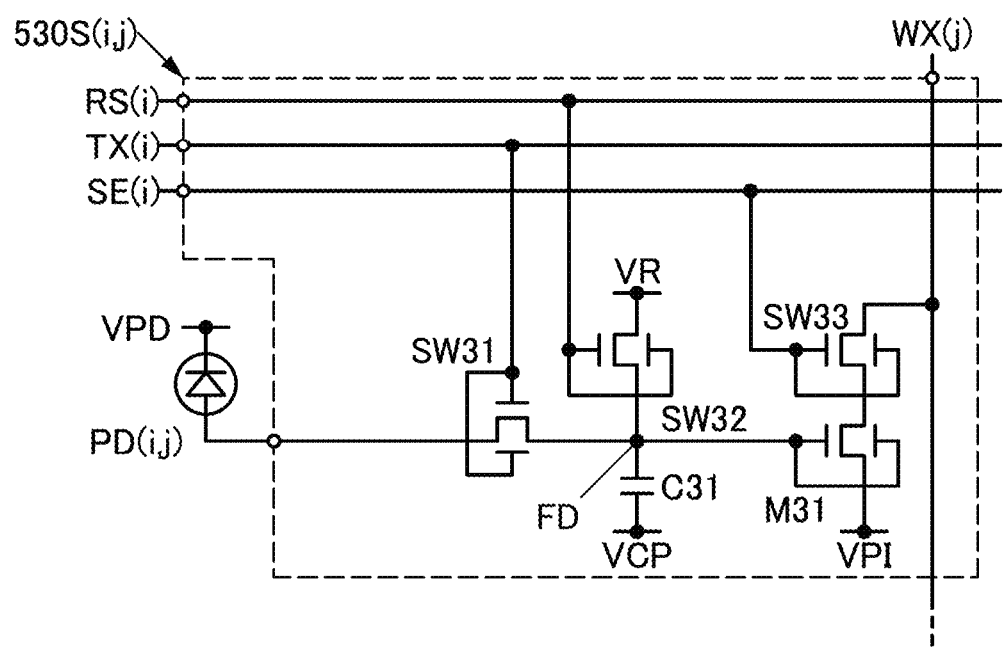
FIG. 7 is a circuit diagram illustrating a structure of a functional panel of an embodiment.

FIG. 7 is a diagram illustrating a structure of the functional panel of one embodiment of the present invention.

FIG. 7 is a circuit diagram illustrating a structure of a pixel circuit in the functional panel of one embodiment of the present invention.

<Structure Example 1 of Functional Panel 700>

The functional panel 700 of one embodiment of the present invention includes a pair of pixels 703($i, j$) (see FIG. 4A).

<<Structure Example 1 of Pixel 703($i, j$)>>

The pair of pixels 703($i, j$) includes the pixel 702G(i, j)(see FIG. 4B). The pixel 702G(i, j) includes a pixel circuit 530G(i, j) and the light-emitting device 550G(i, j), and the light-emitting device 550G(i, j) is electrically connected to the pixel circuit 530G(i, j) (see FIG. 5A).

<<Structure Example 1 of Pixel Circuit 530G(i, j)>>

The pixel circuit 530G(i, j) includes a switch SW21, a switch SW22, a transistor M21, a capacitor C21, and a node N21 (see FIG. 6).

The transistor M21 includes a gate electrode electrically connected to the node N21, a first electrode electrically connected to the light-emitting device 550G(i, j), and a second electrode electrically connected to a conductive film ANO.

The switch SW1 includes a first terminal electrically connected to the node N21 and a second terminal electrically connected to a conductive film S1g(j), and has a function of controlling the conduction state or the non-conduction state on the basis of a potential of a conductive film G1($i$).

The switch SW22 includes a first terminal electrically connected to a conductive film S2g(j), and has a function of controlling the conduction state or the non-conduction state on the basis of a potential of a conductive film G2($i$).

The capacitor C21 includes a conductive film electrically connected to the node N21 and a conductive film electrically connected to a second electrode of the switch SW22.

Thus, an image signal can be stored in the node N21. A potential of the node N21 can be changed using the switch SW22. The intensity of light emitted from the light-emitting device 550G(i, j) can be controlled with the potential of the node N21. Thus, a novel functional panel that is highly convenient, useful, or reliable can be provided.

<<Structure Example 1 of Light-Emitting Device 550G(i, j)>>

For example, an organic electroluminescence element, an inorganic electroluminescence element, a light-emitting diode, a QDLED (Quantum Dot LED), or the like can be used as the light-emitting device 550G(i, j).

<<Structure Example 2 of Pixel 703($i, j$)>>

The pixel 703($i, j$) includes the pixel circuit 530S(i, j) and the photoelectric conversion device PD(i, j), and the photoelectric conversion device PD(i, j) is electrically connected to the pixel circuit 530S(i, j).

<<Structure Example 1 of Pixel Circuit 530S(i, j)>>

The pixel circuit 530S(i, j) includes a switch SW31, a switch SW32, a switch SW33, a transistor M31, a capacitor C31, and a node FD (see FIG. 7).

The switch SW31 includes a first terminal electrically connected to the photoelectric conversion device PD(i, j) and a second terminal electrically connected to the node FD, and has a function of controlling the conduction state or the non-conduction state on the basis of a potential of a conductive film TX(i).

The switch SW32 includes a first terminal electrically connected to the node FD and a second terminal electrically connected to a conductive film VR, and has a function of controlling the conduction state or the non-conduction state on the basis of a potential of a conductive film RS(i).

The capacitor C31 includes a conductive film electrically connected to the node FD and a conductive film electrically connected to a conductive film VCP.

The transistor M31 includes a gate electrode electrically connected to the node FD and a first electrode electrically connected to a conductive film VPI.

The switch SW33 includes a first terminal electrically connected to a second electrode of the transistor M31 and a second terminal electrically connected to a conductive film WX(U), and has a function of controlling the conduction state or the non-conduction state on the basis of a potential of a conductive film SE(i).

Thus, an imaging signal generated by the photoelectric conversion device PD(i, j) can be transferred to the node FD using the switch SW31. The imaging signal generated by the photoelectric conversion device PD(i, j) can be stored in the node FD using the switch SW31. Electrical continuity between the pixel circuit 530S(i, j) and the photoelectric conversion device PD(i, j) can be broken by the switch SW31. A correlated double sampling method can be used. Noise included in the imaging signal can be reduced. Thus, a novel functional panel that is highly convenient, useful, or reliable can be provided.

<<Structure Example 1 of Photoelectric Conversion Device PD(i, j)>>

For example, a heterojunction photoelectric conversion device, a bulk heterojunction photoelectric conversion device, or the like can be used as the photoelectric conversion device PD(i, j).

<<Structure Example 3 of Pixel 703($i, j$)>>

A plurality of pixels can be used in the pixel 703($i, j$)). For example, a plurality of pixels capable of displaying colors with different hues can be used. Note that a plurality of pixels can be referred to as subpixels. A set of subpixels can be rephrased as a pixel.

This enables additive mixture or subtractive mixture of colors displayed by the plurality of pixels. It is possible to display a color of a hue that an individual pixel cannot display.

Specifically, a pixel 702B(i, j) displaying blue, the pixel 702G(i, j) displaying green, and a pixel 702R(i, j) displaying red can be used in the pixel 703($i, j$). The pixel 702B(i, j), the pixel 702G(i, j), and the pixel 702R(i, j) can each be referred to as a subpixel (see FIG. 4B).

A pixel displaying white or the like can be used in addition to the above set in the pixel 703($i, j$), for example. A pixel displaying cyan, a pixel displaying magenta, and a pixel displaying yellow can be used in the pixel 703($i, j$).

A pixel emitting infrared rays can be used in addition to the above set in the pixel 703($i, j$), for example. Specifically, a pixel that emits light including light with a wavelength of greater than or equal to 650 nm and less than or equal to 1000 nm can be used in the pixel 703($i, j$).

Note that this embodiment can be combined with any of the other embodiments in this specification as appropriate.

Embodiment 3

In this embodiment, structures of a functional panel of one embodiment of the present invention will be described with reference to FIG. 8 to FIG. 11.

Figure 8:
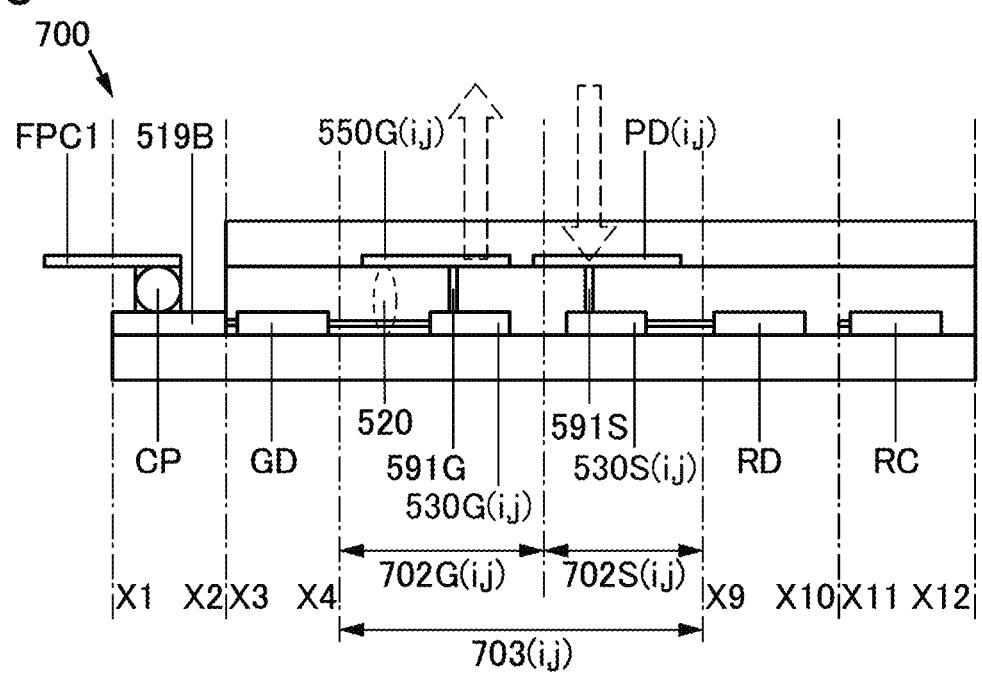
FIG. 8 is a cross-sectional view illustrating a structure of a functional panel of an embodiment.

FIG. 8 is a diagram illustrating a structure of the functional panel of one embodiment of the present invention. FIG. 8 is a cross-sectional view taken along cutting lines X1-X2, X3-X4, X9-X10, and X11-X12 in FIG. 4A and in a pixel.

Figure 9A:
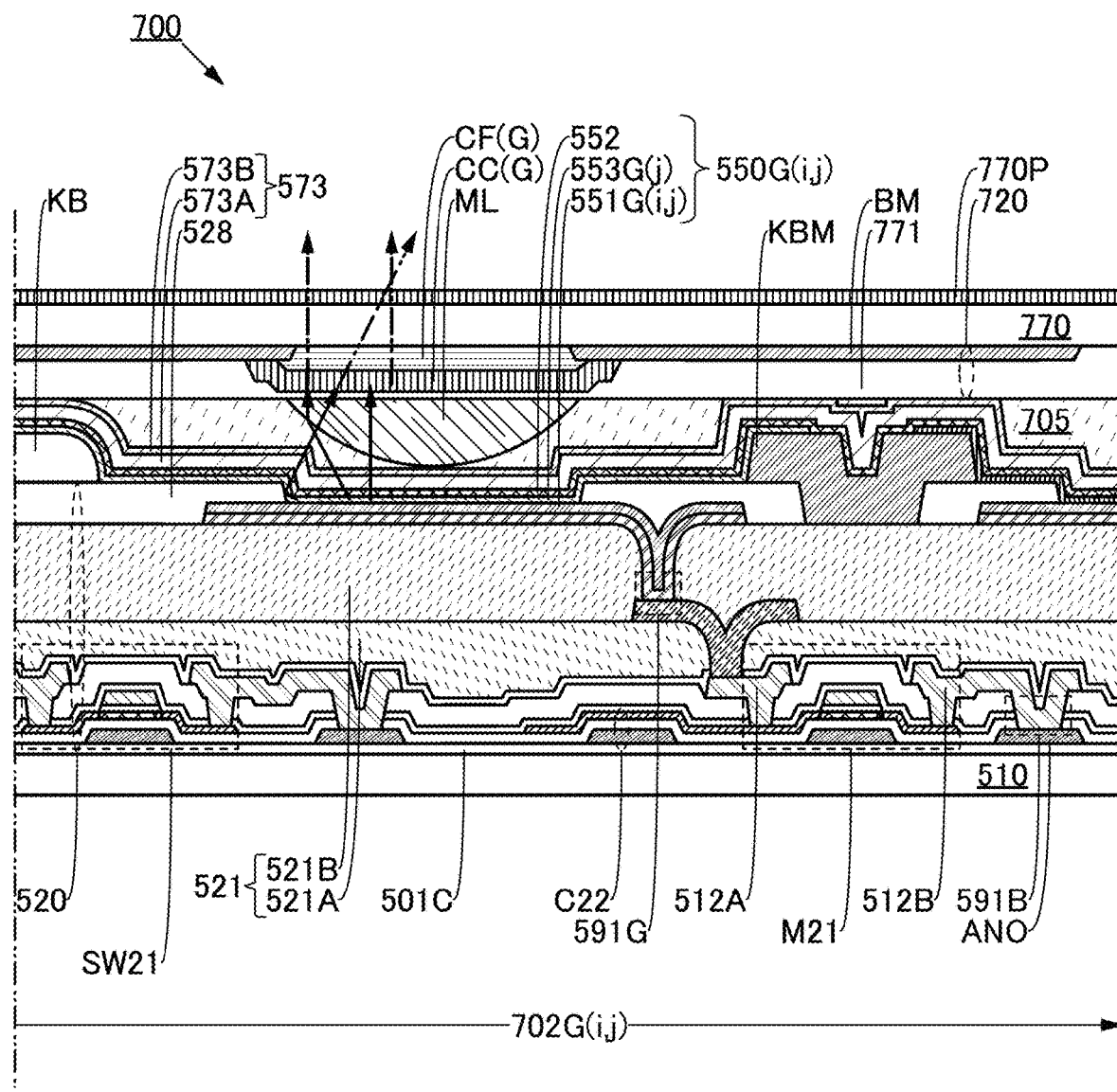
FIG. 9A and FIG. 9B are cross-sectional views illustrating a structure of a functional panel of an embodiment.
Figure 9B:
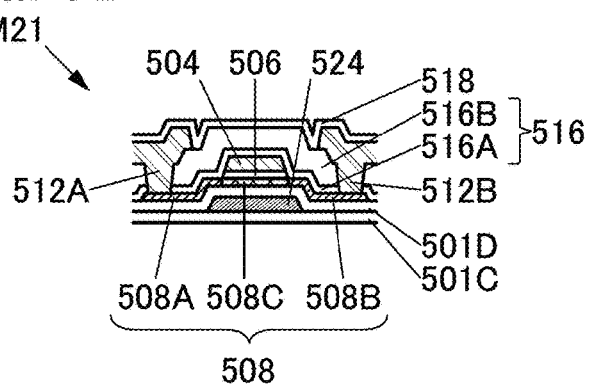

FIG. 9 is a diagram illustrating a structure of the functional panel of one embodiment of the present invention. FIG. 9A is a cross-sectional view of the pixel 702G(i, j) shown in FIG. 4B. FIG. 9B is a cross-sectional view illustrating part of FIG. 9A.

Figure 10A:
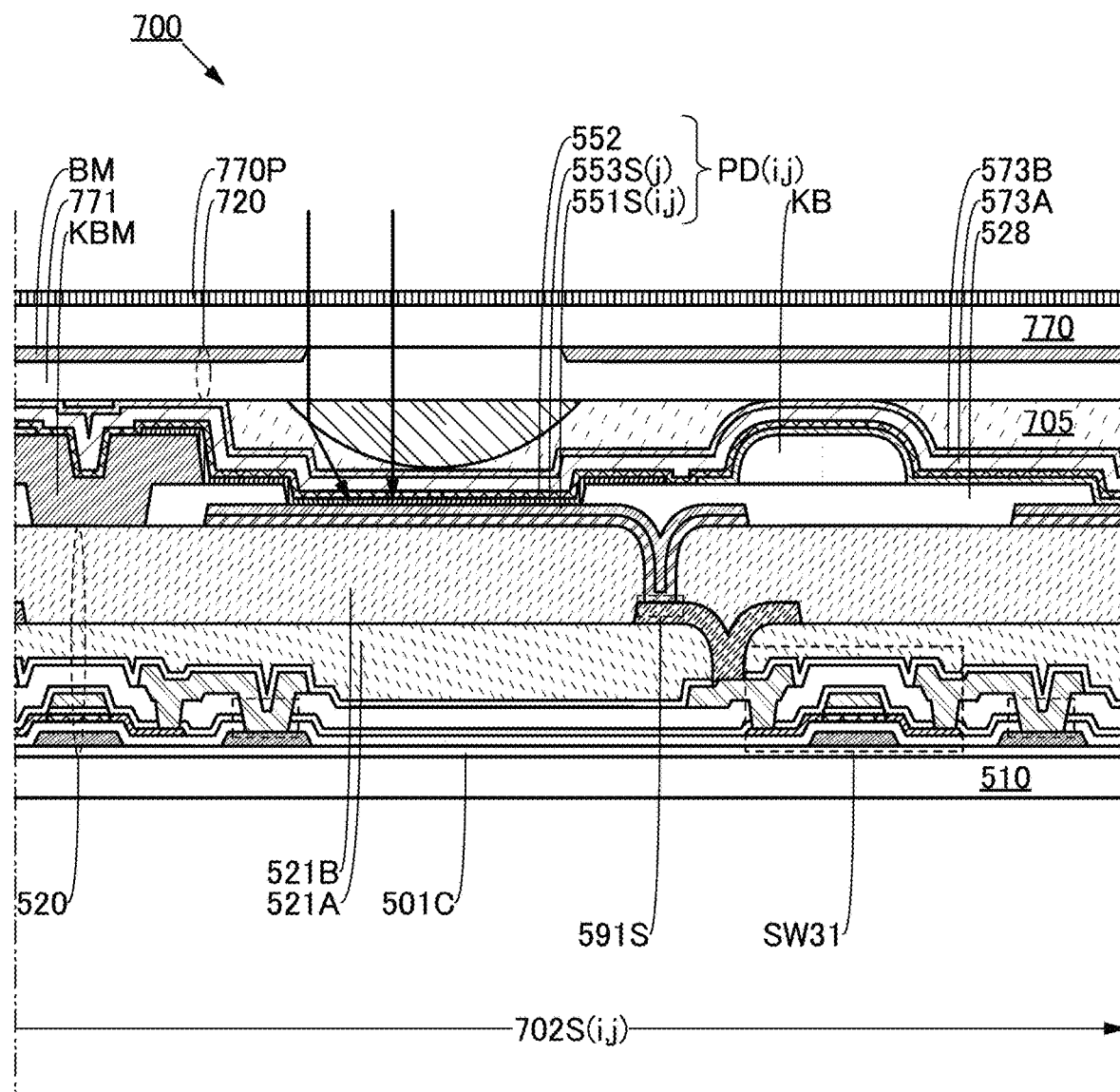
FIG. 10A and FIG. 10B are cross-sectional views illustrating a structure of a functional panel of an embodiment.
Figure 10B:
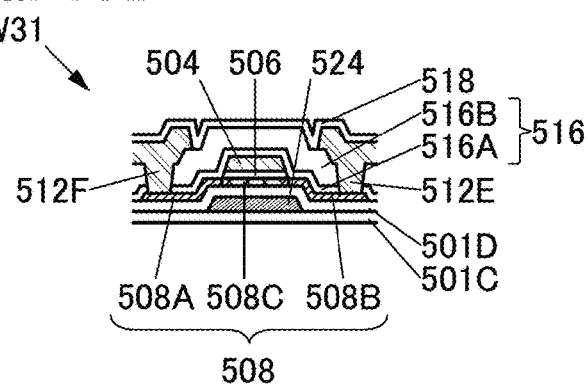

FIG. 10 is a diagram illustrating a structure of the functional panel of one embodiment of the present invention. FIG. 10A is a cross-sectional view of the pixel 702S(i, j) shown in FIG. 4B. FIG. 10B is a cross-sectional view illustrating part of FIG. 10A.

Figure 11A:
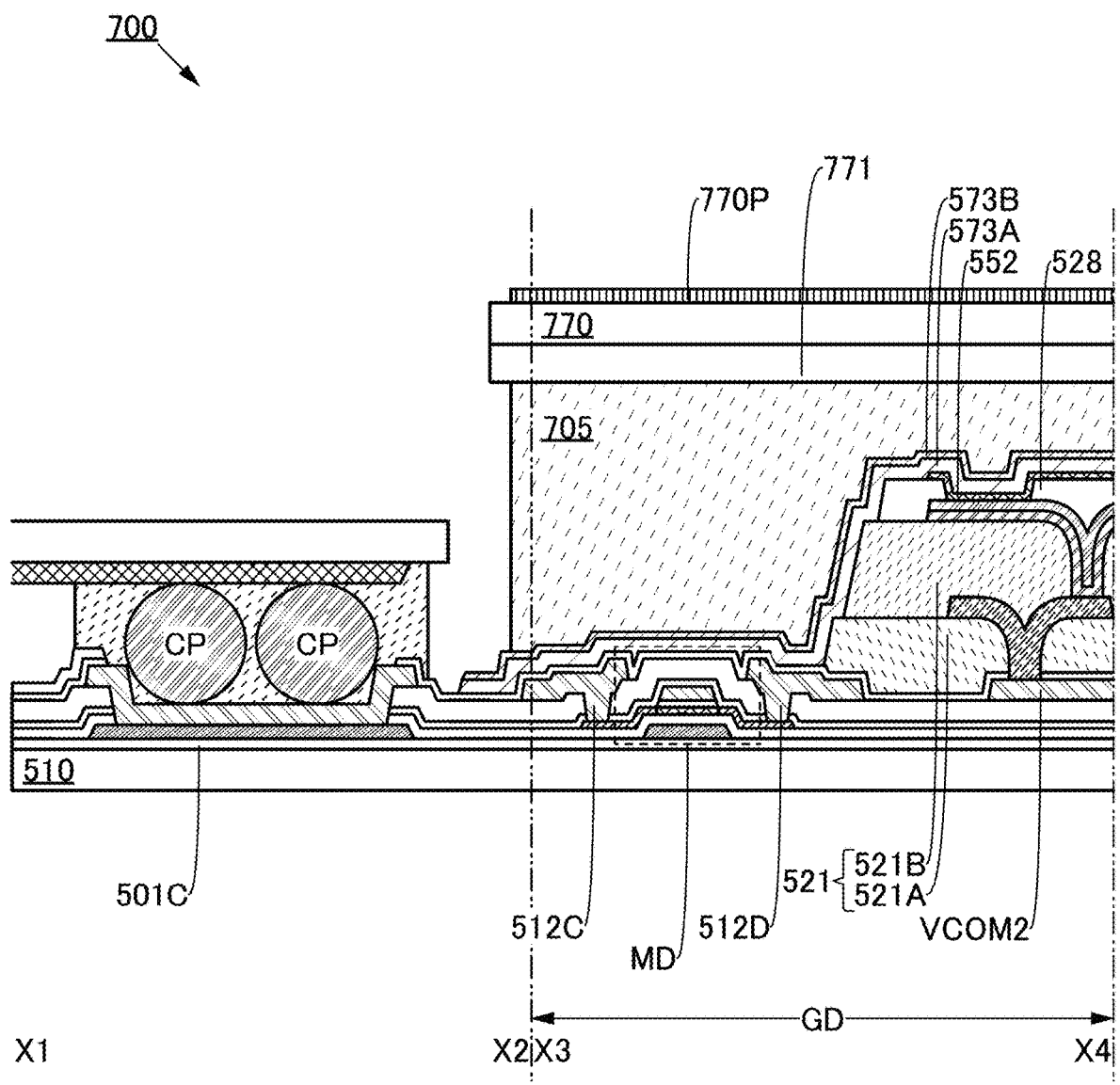
FIG. 11A and FIG. 11B are cross-sectional views illustrating a structure of a functional panel of an embodiment.
Figure 11B:
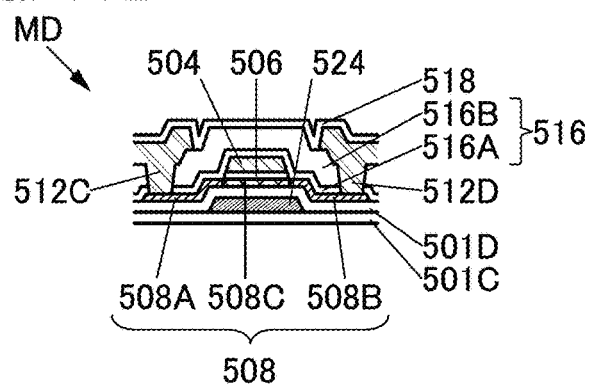

FIG. 11 is a diagram illustrating a structure of the functional panel of one embodiment of the present invention. FIG. 11A is a cross-sectional view taken along cutting lines X1-X2 and X3-X4 in FIG. 4A, and FIG. 11B is a diagram illustrating part of FIG. 11A.

<Structure Example 1 of Functional Panel 700>

The functional panel of one embodiment of the present invention includes a functional layer 520 (see FIG. 8).

<<Structure Example 1 of Functional Layer 520>>

The functional layer 520 includes the pixel circuit 530G(i, j) (see FIG. 8). The functional layer 520 includes, for example, the transistor M21 used in the pixel circuit 530G(i, j) (see FIG. 6 and FIG. 9A).

The functional layer 520 has an opening portion 591G. The pixel circuit 530G(i, j) is electrically connected to the light-emitting device 550G(i, j) through the opening portion 591G (see FIG. 8 and FIG. 9A).

<<Structure Example 2 of Functional Layer 520>>

The functional layer 520 includes the pixel circuit 530S(i, j) (see FIG. 8). The functional layer 520 includes a transistor used as the switch SW31 in the pixel circuit 530S(i, j) (see FIG. 8 and FIG. 10A).

The functional layer 520 has an opening portion 591S, and the pixel circuit 530S(i, j) is electrically connected to the photoelectric conversion device PD(i, j) through the opening portion 591S (see FIG. 8 and FIG. 10A).

Thus, the pixel circuit 530G(i, j) can be formed in the functional layer 520. The pixel circuit 530S(i, j) can be formed in the functional layer 520. The semiconductor film used in the pixel circuit 530S(i, j) can be formed in the step of forming a semiconductor film used in the pixel circuit 530G(i, j), for example. The manufacturing process of the functional panel can be simplified. Thus, a novel functional panel that is highly convenient, useful, or reliable can be provided.

<<Structure Example 3 of Functional Layer 520>>

The functional layer 520 includes a driver circuit GD (see FIG. 4A and FIG. 8). The functional layer 520 includes, for example, a transistor MD used in the driver circuit GD (see FIG. 8 and FIG. 11A).

The functional layer 520 includes a driver circuit RD and a reading circuit RC (see FIG. 8).

Thus, the semiconductor film used in the driver circuit GD can be formed in the step of forming the semiconductor film used in the pixel circuit 530G(i, j), for example. Semiconductor films used in the driver circuit RD and the reading circuit RC can be formed in the step of forming the semiconductor film used in the pixel circuit 530G(i, j). The manufacturing process of the functional panel can be simplified. Thus, a novel functional panel that is highly convenient, useful, or reliable can be provided.

<<Structure Example of Transistor>>

A bottom-gate transistor, a top-gate transistor, or the like can be used in the functional layer 520. Specifically, a transistor can be used as a switch.

The transistor includes a semiconductor film 508, a conductive film 504, a conductive film 512A, and a conductive film 512B (see FIG. 9B).

The semiconductor film 508 includes a region 508A electrically connected to the conductive film 512A and a region 508B electrically connected to the conductive film 512B. The semiconductor film 508 includes a region 508C between the region 508A and the region 508B.

The conductive film 504 includes a region overlapping with the region 508C, and the conductive film 504 has a function of a gate electrode.

An insulating film 506 includes a region interposed between the semiconductor film 508 and the conductive film 504. The insulating film 506 has a function of a gate insulating film.

The conductive film 512A has one of a function of a source electrode and a function of a drain electrode, and the conductive film 512B has the other of the function of the source electrode and the function of the drain electrode.

A conductive film 524 can be used for the transistor. The semiconductor film 508 is interposed between a region of the conductive film 524 and the conductive film 504. The conductive film 524 has a function of a second gate electrode.

Note that the semiconductor film used in the transistor of the driver circuit can be formed in the step of forming the semiconductor film used in the transistor of the pixel circuit.

<<Structure Example 1 of Semiconductor Film 508>>

A semiconductor containing a Group 14 element can be used for the semiconductor film 508, for example. Specifically, a semiconductor containing silicon can be used for the semiconductor film 508.

[Hydrogenated Amorphous Silicon]

For example, hydrogenated amorphous silicon can be used for the semiconductor film 508. Alternatively, microcrystalline silicon or the like can be used for the semiconductor film 508. Thus, a functional panel having less display unevenness than a functional panel using polysilicon for the semiconductor film 508, for example, can be provided. The size of the functional panel can be easily increased.

[Polysilicon]

For example, polysilicon can be used for the semiconductor film 508. In this case, the field-effect mobility of the transistor can be higher than that of a transistor using hydrogenated amorphous silicon for the semiconductor film 508, for example. The driving capability can be higher than that of a transistor using hydrogenated amorphous silicon for the semiconductor film 508, for example. The aperture ratio of the pixel can be higher than that in the case of using a transistor that uses hydrogenated amorphous silicon for the semiconductor film 508, for example.

The reliability of the transistor can be higher than that of a transistor using hydrogenated amorphous silicon for the semiconductor film 508, for example.

The temperature required for fabrication of the transistor can be lower than that required for a transistor using single crystal silicon, for example.

The semiconductor film used in the transistor of the driver circuit can be formed in the same step as the semiconductor film used in the transistor of the pixel circuit. The driver circuit can be formed over the same substrate where the pixel circuit is formed. The number of components included in an electronic device can be reduced.

[Single Crystal Silicon]

For example, single crystal silicon can be used for the semiconductor film 508. In this case, a functional panel with higher resolution than a functional panel using hydrogenated amorphous silicon for the semiconductor film 508, for example, can be provided. A functional panel having less display unevenness than a functional panel using polysilicon for the semiconductor film 508, for example, can be provided. Smart glasses or a head-mounted display can be provided, for example.

<<Structure Example 2 of Semiconductor Film 508>>

For example, a metal oxide can be used for the semiconductor film 508. In this case, the pixel circuit can hold an image signal for a longer time than a pixel circuit utilizing a transistor using amorphous silicon for a semiconductor film. Specifically, a selection signal can be supplied at a frequency of lower than 30 Hz, preferably lower than 1 Hz, and further preferably less than once per minute with the suppressed occurrence of flickers. Consequently, fatigue accumulation in a user of a data processing device can be reduced. Moreover, power consumption for driving can be reduced.

The pixel circuit can hold an imaging signal for a longer time than a pixel circuit utilizing a transistor using amorphous silicon for a semiconductor film. Specifically, a second selection signal can be supplied at a frequency lower than 30 Hz, preferably lower than 1 Hz, and further preferably less than once per minute. Accordingly, an image can be taken by a global shutter method. An image of a moving object can be taken while distortion is inhibited.

A transistor using an oxide semiconductor can be used, for example. Specifically, an oxide semiconductor containing indium or an oxide semiconductor containing indium, gallium, and zinc can be used for the semiconductor film.

A transistor having a lower leakage current in an off state than a transistor using amorphous silicon for a semiconductor film can be used, for example. Specifically, a transistor using an oxide semiconductor for a semiconductor film can be used as a switch or the like. In that case, a potential of a floating node can be held for a longer time than in a circuit in which a transistor using amorphous silicon is used as a switch.

A 25-nm-thick film containing indium, gallium, and zinc can be used as the semiconductor film 508, for example.

A conductive film in which a 10-nm-thick film containing tantalum and nitrogen and a 300-nm-thick film containing copper are stacked can be used as the conductive film 504, for example. Note that the film containing tantalum and nitrogen is interposed between a region of the film containing copper and the insulating film 506.

A stacked film in which a 400-nm-thick film containing silicon and nitrogen and a 200-nm-thick film containing silicon, oxygen, and nitrogen are stacked can be used as the insulating film 506, for example. Note that the film containing silicon, oxygen, and nitrogen is interposed between a region of the film containing silicon and nitrogen and the semiconductor film 508.

A conductive film in which a 50-nm-thick film containing tungsten, a 400-nm-thick film containing aluminum, and a 100-nm-thick film containing titanium are stacked in this order can be used as the conductive film 512A or the conductive film 512B, for example. Note that the film containing tungsten includes a region in contact with the semiconductor film 508.

A manufacturing line for a bottom-gate transistor using amorphous silicon for a semiconductor can be easily remodeled into a manufacturing line for a bottom-gate transistor using an oxide semiconductor for a semiconductor, for example. Furthermore, a manufacturing line for a top-gate transistor using polysilicon for a semiconductor can be easily remodeled into a manufacturing line for a top-gate transistor using an oxide semiconductor for a semiconductor, for example. In either remodeling, an existing manufacturing line can be effectively utilized.

Accordingly, flickering of a display can be inhibited. Power consumption can be reduced. A moving image with quick movements can be smoothly displayed. A photograph and the like can be displayed with a wide range of grayscale. Thus, a novel functional panel that is highly convenient, useful, or reliable can be provided.

<<Structure Example 3 of Semiconductor Film 508>>

For example, a compound semiconductor can be used for the semiconductor of the transistor. Specifically, a semiconductor containing gallium arsenide can be used.

For example, an organic semiconductor can be used for the semiconductor of the transistor. Specifically, an organic semiconductor containing any of polyacenes or graphene can be used for the semiconductor film.

<<Structure Example of Capacitor>>

A capacitor includes one conductive film, a different conductive film, and an insulating film. The insulating film includes a region interposed between the one conductive film and the different conductive film.

For example, a conductive film used as the source electrode or the drain electrode of the transistor, a conductive film used as the gate electrode, and an insulating film used as the gate insulating film can be used for the capacitor.

<<Structure Example 2 of Functional Layer 520>>

The functional layer 520 includes an insulating film 521, an insulating film 518, an insulating film 516, the insulating film 506, an insulating film 501C, and the like (see FIG. 9A and FIG. 9B).

The insulating film 521 includes a region interposed between the pixel circuit 530G(i, j) and the light-emitting device 550G(i, j).

The insulating film 518 includes a region interposed between the insulating film 521 and the insulating film 501C.

The insulating film 516 includes a region interposed between the insulating film 518 and the insulating film 501C.

The insulating film 506 includes a region interposed between the insulating film 516 and the insulating film 501C.

[Insulating Film 521]

An insulating inorganic material, an insulating organic material, or an insulating composite material containing an inorganic material and an organic material, for example, can be used for the insulating film 521.

Specifically, an inorganic oxide film, an inorganic nitride film, an inorganic oxynitride film, or the like, or a stacked-layer material in which a plurality of films selected from these films are stacked can be used as the insulating film 521.

For example, a film including a silicon oxide film, a silicon nitride film, a silicon oxynitride film, an aluminum oxide film, or the like, or a film including a stacked-layer material in which a plurality of films selected from these films are stacked can be used as the insulating film 521. Note that the silicon nitride film is a dense film and has an excellent function of inhibiting diffusion of impurities.

For example, for the insulating film 521, polyester, polyolefin, polyamide, polyimide, polycarbonate, polysiloxane, an acrylic resin, or the like, or a stacked-layer material, a composite material, or the like of a plurality of resins selected from these resins can be used. Note that polyimide is excellent in thermal stability, insulating property, toughness, low dielectric constant, low coefficient of thermal expansion, chemical resistance, and other properties compared with other organic materials. Accordingly, in particular, polyimide can be suitably used for the insulating film 521 or the like.

The insulating film 521 may be formed using a photosensitive material. Specifically, a film formed using photosensitive polyimide, a photosensitive acrylic resin, or the like can be used as the insulating film 521.

Thus, the insulating film 521 can eliminate a level difference due to various components overlapping with the insulating film 521, for example.

[Insulating Film 518]

The material that can be used for the insulating film 521, for example, can be used for the insulating film 518.

For example, a material having a function of inhibiting diffusion of oxygen, hydrogen, water, an alkali metal, an alkaline earth metal, and the like can be used for the insulating film 518. Specifically, a nitride insulating film can be used as the insulating film 518. For example, silicon nitride, silicon nitride oxide, aluminum nitride, aluminum nitride oxide, or the like can be used for the insulating film 518. Thus, diffusion of impurities into the semiconductor film of the transistor can be inhibited.

[Insulating Film 516]

The material that can be used for the insulating film 521, for example, can be used for the insulating film 516.

Specifically, a film formed by a fabrication method different from that of the insulating film 518 can be used as the insulating film 516.

[Insulating Film 506]

The material that can be used for the insulating film 521, for example, can be used for the insulating film 506.

Specifically, a film including a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film can be used as the insulating film 506.

[Insulating Film 501D]

An insulating film 501D includes a region interposed between the insulating film 501C and the insulating film 516.

The material that can be used for the insulating film 506, for example, can be used for the insulating film 501D.

[Insulating Film 501C]

The material that can be used for the insulating film 521, for example, can be used for the insulating film 501C. Specifically, a material containing silicon and oxygen can be used for the insulating film 501C. Thus, diffusion of impurities into the pixel circuit, the light-emitting element, the photoelectric conversion element, or the like can be inhibited.

<<Structure Example 3 of Functional Layer 520>>

The functional layer 520 includes a conductive film, a wiring, and a terminal. A material having conductivity can be used for the wiring, an electrode, the terminal, the conductive film, and the like.

[Wiring and the Like]

For example, an inorganic conductive material, an organic conductive material, a metal, a conductive ceramic, or the like can be used for the wiring and the like.

Specifically, a metal element selected from aluminum, gold, platinum, silver, copper, chromium, tantalum, titanium, molybdenum, tungsten, nickel, iron, cobalt, palladium, and manganese, or the like can be used for the wiring and the like. Alternatively, an alloy containing the above-described metal element, or the like can be used for the wiring and the like. In particular, an alloy of copper and manganese is suitable for microfabrication using a wet etching method.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure of a titanium film, an aluminum film stacked over the titanium film, and a titanium film further formed thereover, or the like can be used for the wiring and the like.

Specifically, a conductive oxide such as indium oxide, indium tin oxide, indium zinc oxide, zinc oxide, or zinc oxide to which gallium is added can be used for the wiring and the like.

Specifically, a film containing graphene or graphite can be used for the wiring and the like.

For example, a film containing graphene oxide is formed and the film containing graphene oxide is reduced, so that a film containing graphene can be formed. As a reducing method, a method with application of heat, a method using a reducing agent, or the like can be given.

For example, a film including a metal nanowire can be used for the wiring and the like. Specifically, a nanowire containing silver can be used.

Specifically, a conductive polymer can be used for the wiring and the like.

Note that a terminal 519B can be electrically connected to a flexible printed circuit FPC1 using a conductive material, for example (see FIG. 8). Specifically, the terminal 519B can be electrically connected to the flexible printed circuit FPC1 using a conductive material CP.

<Structure Example 2 of Functional Panel 700>

The functional panel 700 includes a base material 510, the base material 770, and a sealant 705 (see FIG. 9A). In addition, the functional panel 700 includes a structure body KB.

<<Base Material 510 and Base Material 770>>

A material having a light-transmitting property can be used for the base material 510 or the base material 770.

For example, a flexible material can be used for the base material 510 or the base material 770. Thus, a flexible functional panel can be provided.

For example, a material with a thickness less than or equal to 0.7 mm and greater than or equal to 0.1 mm can be used. Specifically, a material polished to a thickness of approximately 0.1 mm can be used. Thus, the weight can be reduced.

A glass substrate of the 6th generation (1500 mm×1850 mm), the 7th generation (1870 mm×2200 mm), the 8th generation (2200 mm×2400 mm), the 9th generation (2400 mm×2800 mm), the 10th generation (2950 mm×3400 mm), or the like can be used as the base material 510 or the base material 770. Thus, a large-sized display device can be fabricated.

For the base material 510 or the base material 770, an organic material, an inorganic material, a composite material of an organic material and an inorganic material, or the like can be used.

For example, an inorganic material such as glass, ceramic, or a metal can be used. Specifically, non-alkali glass, soda-lime glass, potash glass, crystal glass, aluminosilicate glass, tempered glass, chemically tempered glass, quartz, sapphire, or the like can be used for the base material 510 or the base material 770. Aluminosilicate glass, tempered glass, chemically tempered glass, sapphire, or the like can be suitably used for the base material 510 or the base material 770 that is provided on the side close to a user of the functional panel. Thus, the functional panel can be prevented from being broken or damaged by the use thereof.

Specifically, an inorganic oxide film, an inorganic nitride film, an inorganic oxynitride film, or the like can be used. For example, a silicon oxide film, a silicon nitride film, a silicon oxynitride film, an aluminum oxide film, or the like can be used. Stainless steel, aluminum, or the like can be used for the base material 510 or the base material 770.

For example, a single crystal semiconductor substrate or a polycrystalline semiconductor substrate of silicon or silicon carbide, a compound semiconductor substrate of silicon germanium or the like, an SOI substrate, or the like can be used as the base material 510 or the base material 770. Thus, a semiconductor element can be formed on the base material 510 or the base material 770.

For example, an organic material such as a resin, a resin film, or plastic can be used for the base material 510 or the base material 770. Specifically, a material containing polyester, polyolefin, polyamide (e.g., nylon or aramid), polyimide, polycarbonate, polyurethane, an acrylic resin, an epoxy resin, or a resin having a siloxane bond, such as silicone, can be used for the base material 510 or the base material 770. For example, a resin film, a resin plate, a stacked-layer material, or the like containing any of these materials can be used. Thus, the weight can be reduced. The frequency of occurrence of breakage or the like due to dropping can be reduced, for example.

Specifically, polyethylene terephthalate (PET), polyethylene naphthalate (PEN), polyethersulfone (PES), a cycloolefin polymer (COP), a cycloolefin copolymer (COC), or the like can be used for the base material 510 or the base material 770.

For example, a composite material formed by attaching a metal plate, a thin glass plate, or a film of an inorganic material or the like and a resin film or the like to each other can be used for the base material 510 or the base material 770. For example, a composite material formed by dispersing a fibrous or particulate metal, glass, an inorganic material, or the like into a resin can be used for the base material 510 or the base material 770. For example, a composite material formed by dispersing a fibrous or particulate resin, an organic material, or the like into an inorganic material can be used for the base material 510 or the base material 770.

Furthermore, a single-layer material or a material in which a plurality of layers are stacked can be used for the base material 510 or the base material 770. For example, a material in which insulating films and the like are stacked can be used. Specifically, a material in which one or a plurality of films selected from a silicon oxide layer, a silicon nitride layer, a silicon oxynitride layer, and the like are stacked can be used. Thus, diffusion of impurities contained in the base materials can be prevented, for example. Diffusion of impurities contained in glass or a resin can be prevented. Diffusion of impurities that pass through a resin can be prevented.

Furthermore, paper, wood, or the like can be used for the base material 510 or the base material 770.

For example, a material having heat resistance high enough to withstand heat treatment in the fabricating process can be used for the base material 510 or the base material 770. Specifically, a material having heat resistance to heat applied in the formation process of directly forming the transistor, the capacitor, or the like can be used for the base material 510 or the base material 770.

For example, it is possible to employ a method in which an insulating film, a transistor, a capacitor, or the like is formed on a process substrate having heat resistance to heat applied in the fabricating process, and the formed insulating film, transistor, capacitor, or the like is transferred to the base material 510 or the base material 770. Accordingly, an insulating film, a transistor, a capacitor, or the like can be formed on a flexible substrate, for example.

<Sealant 705>>

The sealant 705 includes a region interposed between the functional layer 520 and the base material 770 and has a function of bonding the functional layer 520 and the base material 770 together (see FIG. 9A).

An inorganic material, an organic material, a composite material of an inorganic material and an organic material, or the like can be used for the sealant 705.

For example, an organic material such as a thermally fusible resin or a curable resin can be used for the sealant 705.

For example, an organic material such as a reactive curable adhesive, a photocurable adhesive, a thermosetting adhesive, and/or an anaerobic adhesive can be used for the sealant 705.

Specifically, an adhesive containing an epoxy resin, an acrylic resin, a silicone resin, a phenol resin, a polyimide resin, an imide resin, a PVC (polyvinyl chloride) resin, a PVB (polyvinyl butyral) resin, an EVA (ethylene vinyl acetate) resin, or the like can be used for the sealant 705.

<<Structure Body KB>>

The structure body KB includes a region interposed between the functional layer 520 and the base material 770. The structure body KB has a function of providing a predetermined space between the functional layer 520 and the base material 770.

Note that this embodiment can be combined with any of the other embodiments in this specification as appropriate.

Embodiment 4

In this embodiment, structures of a functional panel of one embodiment of the present invention will be described with reference to FIG. 9 to FIG. 11.

<Structure Example 1 of Functional Panel 700>

The functional panel 700 includes the light-emitting device 550G(i, j) (see FIG. 9).

<<Structure Example 2 of Light-Emitting Device 550G(i, j)>>

An electrode 551G(i, j), an electrode 552, and a layer 553G(j) containing a light-emitting material can be used in the light-emitting device 550G(i, j). The layer 553G(j) containing a light-emitting material includes a region interposed between the electrode 551G(i, j) and the electrode 552.

[Structure Example 1 of Layer 553G(j) Containing Light-Emitting Material]

A stacked-layer material can be used for the layer 553G(j) containing a light-emitting material, for example.

For example, a material emitting blue light, a material emitting green light, a material emitting red light, a material emitting infrared rays, or a material emitting ultraviolet rays can be used for the layer 553G(j) containing a light-emitting material.

[Structure Example 2 of Layer 553G(j) Containing Light-Emitting Material]

A stacked-layer material stacked to emit white light can be used for the layer 553G(j) containing a light-emitting material, for example.

Specifically, a plurality of materials emitting light with different hues can be used for the layer 553G(j) containing a light-emitting material.

For example, a stacked-layer material in which a layer containing a light-emitting material containing a fluorescent material that emits blue light and a layer containing materials that are other than fluorescent materials and emit green light and red light are stacked can be used for the layer 553G(j) containing a light-emitting material. A stacked-layer material in which a layer containing a light-emitting material containing a fluorescent material that emits blue light and a layer containing a material that is other than a fluorescent material and emits yellow light are stacked can be used for the layer 553G(j) containing a light-emitting material.

Note that a coloring film CF(G) can be used to overlap with the layer 553G(j) containing a light-emitting material, for example. Thus, light of a predetermined hue can be extracted from white light.

[Structure Example 3 of Layer 553G(j) Containing Light-Emitting Material]

A stacked-layer material stacked to emit blue light or ultraviolet rays can be used for the layer 553G(j) containing a light-emitting material, for example. A color conversion layer CC(G) can be used to overlap with the layer 553G(j) containing a light-emitting material, for example.

[Structure Example 4 of Layer 553G(j) Containing Light-Emitting Material]

The layer 553G(j) containing a light-emitting material includes a light-emitting unit. The light-emitting unit includes one region where electrons injected from one side are recombined with holes injected from the other side. The light-emitting unit contains a light-emitting material, and the light-emitting material releases energy generated by recombination of electrons and holes as light. Note that a hole-transport layer and an electron-transport layer can be used in the light-emitting unit. The hole-transport layer is placed closer to the positive electrode than the electron-transport layer is, and has higher hole mobility than the electron-transport layer.

A plurality of light-emitting units and an intermediate layer can be used for the layer 553G(j) containing a light-emitting material, for example. The intermediate layer includes a region interposed between two light-emitting units. The intermediate layer includes a charge-generation region, and the intermediate layer has functions of supplying holes to the light-emitting unit placed on the cathode side and supplying electrons to the light-emitting unit placed on the anode side. Note that a structure including a plurality of light-emitting units and an intermediate layer is referred to as a tandem light-emitting element in some cases.

Accordingly, the current efficiency of light emission can be increased. The density of current flowing through the light-emitting element at the same luminance can be reduced. The reliability of the light-emitting element can be increased.

For example, a light-emitting unit containing a material emitting light with one hue and a light-emitting unit containing a material emitting light with a different hue can be stacked and used for the layer 553G(j) containing a light-emitting material. A light-emitting unit containing a material emitting light with one hue and a light-emitting unit containing a material emitting light with the same hue can be stacked and used for the layer 553G(j) containing a light-emitting material. Specifically, two light-emitting units each containing a material emitting blue light can be stacked and used.

For the layer 553G(j) containing a light-emitting material, a high molecular compound (e.g., an oligomer, a dendrimer, or a polymer), a middle molecular compound (a compound between a low molecular compound and a high molecular compound with a molecular weight greater than or equal to 400 and less than or equal to 4000), or the like can be used.

[Electrode 551G(i, j) and Electrode 552]

The material that can be used for the wiring or the like, for example, can be used for the electrode 551G(i, j) or the electrode 552. Specifically, a material having a visible-light-transmitting property can be used for the electrode 551G(i, j) or the electrode 552.

For example, a conductive oxide, a conductive oxide containing indium, indium oxide, indium tin oxide, indium zinc oxide, zinc oxide, zinc oxide to which gallium is added, or the like can be used. Alternatively, a metal film thin enough to transmit light can be used. Alternatively, a material having a visible-light-transmitting property can be used.

For example, a metal film that transmits part of light and reflects another part of the light can be used for the electrode 551G(i, j) or the electrode 552. The distance between the electrode 551G(i, j) and the electrode 552 is adjusted using the layer 553G(j) containing a light-emitting material, for example.

Thus, a microcavity structure can be provided in the light-emitting device 550G(i, j). Light of a predetermined wavelength can be extracted more efficiently than other light. Light with a narrow half width of a spectrum can be extracted. Light of a bright color can be extracted.

A film that efficiently reflects light, for example, can be used for the electrode 551G(i, j) or the electrode 552. Specifically, a material containing silver, palladium, and the like or a material containing silver, copper, and the like can be used for the metal film.

The electrode 551G(i, j) is electrically connected to the pixel circuit 530G(i, j) through the opening portion 591G (see FIG. 10A). For example, the electrode 551G(i, j) overlaps with the opening portion formed in the insulating film 528, and the insulating film 528 is at the periphery 30 of the electrode 551G(i, j).

Thus, a short circuit between the electrode 551G(i, j) and the electrode 552 can be prevented.

<<Structure Example 2 of Photoelectric Conversion Device PD(i, j)>>

The photoelectric conversion device PD(i, j) includes an electrode 551S(i, j), the electrode 552, and a layer 553S(j) containing a photoelectric conversion material (see FIG. 10A).

For example, a heterojunction photoelectric conversion device, a bulk heterojunction photoelectric conversion device, or the like can be used as the photoelectric conversion device PD(i, j).

[Structure Example 1 of Layer 553S(j) Containing Photoelectric Conversion Material]

For example, a stacked-layer film in which a p-type semiconductor film and an n-type semiconductor film are stacked in contact with each other can be used as the layer 553S(j) containing a photoelectric conversion material. Note that the photoelectric conversion device PD(i, j) in which a stacked-layer film with such a structure is used as the layer 553S(j) containing a photoelectric conversion material can be referred to as a PN photodiode.

For example, a stacked-layer film in which a p-type semiconductor film, an i-type semiconductor film, and an n-type semiconductor film are stacked such that the i-type semiconductor film is interposed between the p-type semiconductor film and the n-type semiconductor film can be used as the layer 553S(j) containing a photoelectric conversion material. Note that the photoelectric conversion device PD(i, j) in which a stacked-layer film with such a structure is used as the layer 553S(j) containing a photoelectric conversion material can be referred to as a PIN photodiode.

For example, a stacked-layer film in which a p+-type semiconductor film, a p-type semiconductor film, a p-type semiconductor film, and an n-type semiconductor film are stacked such that the p-type semiconductor film is interposed between the p+-type semiconductor film and the n-type semiconductor film and the p-type semiconductor film is interposed between the p-type semiconductor film and the n-type semiconductor film can be used as the layer 553S(U) containing a photoelectric conversion material. Note that the photoelectric conversion device PD(i, j) in which a stacked-layer film with such a structure is used as the layer 553S(j) containing a photoelectric conversion material can be referred to as an avalanche photodiode.

[Structure Example 2 of Layer 553S(j) Containing Photoelectric Conversion Material]

For example, a semiconductor containing a Group 14 element can be used for the layer 553S(j) containing a photoelectric conversion material. Specifically, a semiconductor containing silicon can be used for the layer 553S(j) containing a photoelectric conversion material. For example, hydrogenated amorphous silicon, microcrystalline silicon, polysilicon, single crystal silicon, or the like can be used for the layer 553S(j) containing a photoelectric conversion material.

For example, an organic semiconductor can be used for the layer 553S(j) containing a photoelectric conversion material. Specifically, part of the layer used as the layer 553G(j) containing a light-emitting material can be used as part of the layer 553S(j) containing a photoelectric conversion material.

Specifically, a hole-transport layer and an electron-transport layer that are used in the layer 553G(j) containing a light-emitting material can be used in the layer 553S(j) containing a photoelectric conversion material. This can simplify the manufacturing process.

For example, an electron-accepting organic semiconductor material such as fullerene (e.g., $C_{60}$ or $C_{70}$) or the derivative thereof can be used for the n-type semiconductor film.

For example, an electron-donating organic semiconductor material such as copper(II) phthalocyanine (CuPc) or tetraphenyldibenzoperiflanthene (DBP) can be used for the p-type semiconductor film.

For example, a film obtained by co-evaporation of an electron-accepting semiconductor material and an electron-donating semiconductor material can be used as the i-type semiconductor film.

<Structure Example 2 of Functional Panel 700>

The functional panel 700 includes the insulating film 528 and an insulating film 573 (see FIG. 9A).

<<Insulating Film 528>>

The insulating film 528 includes a region interposed between the functional layer 520 and the base material 770, and the insulating film 528 has an opening portion in a region overlapping with the light-emitting device 550G(i, j) (see FIG. 9A).

The material that can be used for the insulating film 521, for example, can be used for the insulating film 528. Specifically, a silicon oxide film, a film containing an acrylic resin, a film containing polyimide, or the like can be used as the insulating film 528.

<<Insulating Film 573>>

The light-emitting device 550G(i, j) is interposed between a region of the insulating film 573 and the functional layer 520 (see FIG. 9A).

For example, a single film or a stacked film in which a plurality of films are stacked can be used as the insulating film 573. Specifically, a stacked film including an insulating film 573A, which can be formed by a method that hardly damages the light-emitting device 550G(i, j), and a dense insulating film 573B with a few defects, can be used as the insulating film 573. Thus, diffusion of impurities into the light-emitting device 550G(i, j) can be inhibited. The reliability of the light-emitting device 550G(i, j) can be increased.

<Structure Example 3 of Functional Panel 700>

The functional panel 700 includes a functional layer 720 (see FIG. 9A).

<<Functional Layer 720>>

The functional layer 720 includes a light-blocking film BM, the coloring film CF(G), a color conversion layer CC(G), and an insulating film 771.

<<Light-Blocking Film BM>>

The light-blocking film BM has an opening portion in a region overlapping with the pixel 702G(i, j). The light-blocking film BM has an opening portion in a region overlapping with the pixel 702S(i, j).

A material of a dark color can be used for the light-blocking film BM, for example. Thus, the display contrast can be increased.

<<Coloring Film CF(G)>>

The coloring film CF(G) includes a region interposed between the base material 770 and the light-emitting device 550G(i, j). A material that selectively transmits light of a predetermined color, for example, can be used for the coloring film CF(G). Specifically, a material that transmits red light, green light, or blue light can be used for the coloring film CF(G).

<<Structure Example of Insulating Film 771>>

The insulating film 771 includes a region interposed between the base material 770 and the light-emitting device 550G(i, j).

The insulating film 771 includes a region interposed between the base material 770 and a microlens ML.

The color conversion layer CC(G), the light-blocking layer BM, or the coloring film CF(G) is interposed between a region of the insulating film 771 and the base material 770. Thus, unevenness due to the thickness of the color conversion layer CC(G), the light-blocking layer BM, or the coloring film CF(G) can be reduced.

<<Color Conversion Layer CC(G)>>

The color conversion layer CC(G) includes a region interposed between the base material 770 and the light-emitting device 550G(i, j).

For example, a material that emits light with a wavelength longer than a wavelength of incident light can be used for the color conversion layer CC(G). For example, a material that absorbs blue light or ultraviolet rays, converts it into green light, and emits the green light, a material that absorbs blue light or ultraviolet rays, converts it into red light, and emits the red light, or a material that absorbs ultraviolet rays, converts it into blue light, and emits the blue light can be used for the color conversion layer. Specifically, a quantum dot with a diameter of several nanometers can be used for the color conversion layer. Thus, light having a spectrum with a narrow half width can be emitted. Light with high saturation can be emitted.

<Structure Example 4 of Functional Panel 700>

The functional panel 700 includes a light-blocking film KBM (see FIG. 9A).

<<Light-Blocking Film KBM>>

The light-blocking film KBM has an opening portion in a region overlapping with the 30 pixel 702S(i, j). Moreover, the light-blocking film KBM includes a region interposed between the functional layer 520 and the base material 770, and has a function of providing a predetermined space between the functional layer 520 and the base material 770. A material of a dark color can be used for the light-blocking film KBM, for example. Thus, stray light that would enter the pixel 702S(i, j) can be reduced.

<Structure Example 4 of Functional Panel 700>

The functional panel 700 includes a functional film 770P or the like (see FIG. 9A).

<<Functional Film 770P and the Like>>

The functional film 770P includes a region overlapping with the light-emitting device 550G(i, j).

An anti-reflection film, a polarizing film, a retardation film, a light diffusion film, a condensing film, or the like can be used as the functional film 770P, for example.

For example, an anti-reflection film with a thickness less than or equal to 1 µm can be used as the functional film 770P. Specifically, a stacked film in which three or more layers, preferably five or more layers, and further preferably 15 or more layers of dielectrics are stacked can be used as the functional film 770P. This allows the reflectance to be as low as 0.5% or less, preferably 0.08% or less.

For example, a circularly polarizing film can be used as the functional film 770P.

Furthermore, an antistatic film inhibiting the attachment of a dust, a water repellent film inhibiting the attachment of a stain, an oil repellent film inhibiting the attachment of a stain, a non-glare film (anti-glare film), a hard coat film inhibiting generation of a scratch in use, a self-healing film that self-heals from generated scratches, or the like can be used as the functional film 770P.

Note that this embodiment can be combined with any of the other embodiments in this specification as appropriate.

Embodiment 5

In this embodiment, structures of the functional panel of one embodiment of the present invention will be described with reference to FIG. 12 to FIG. 14.

Figure 12:
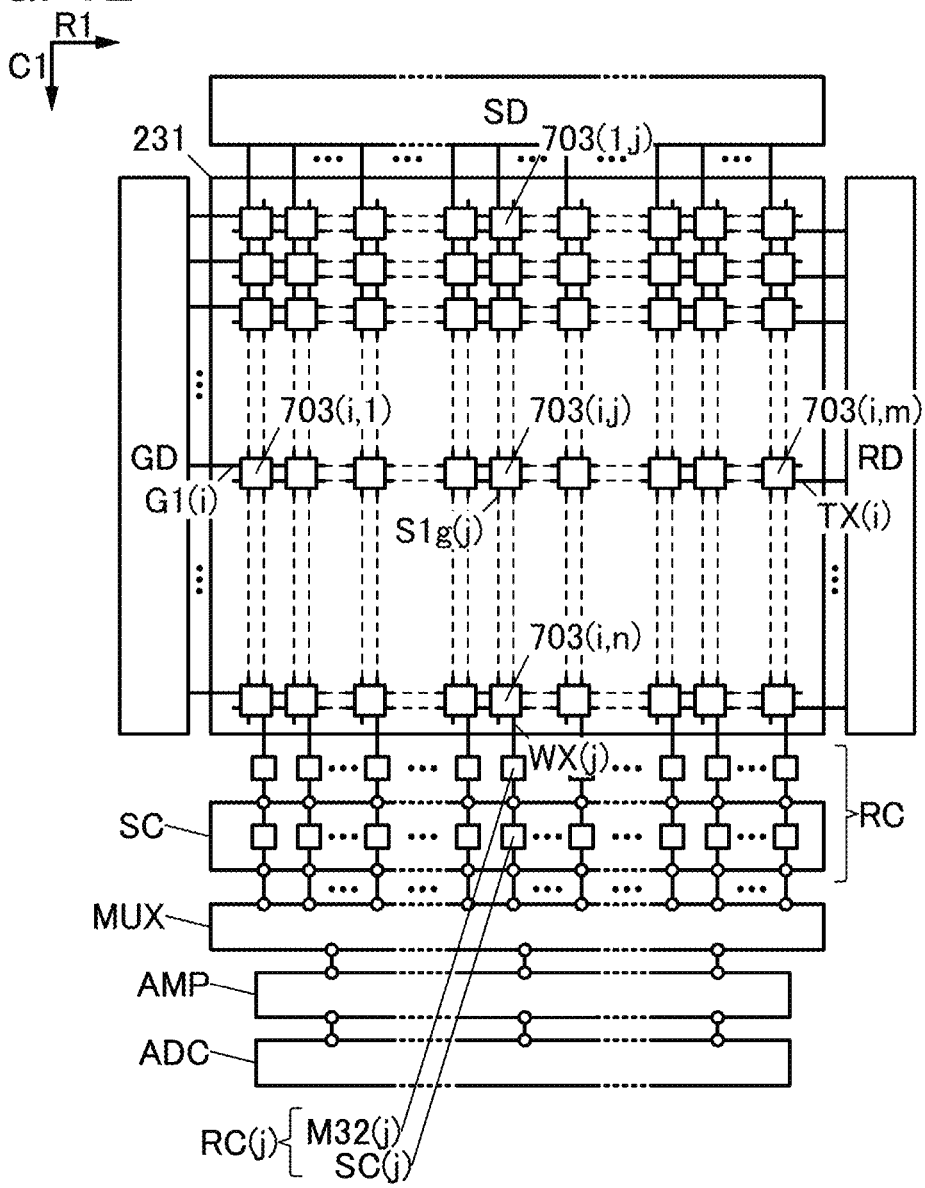
FIG. 12 is a diagram illustrating a structure of a functional panel of an embodiment.

FIG. 12 is a diagram illustrating a structure of the functional panel of one embodiment of the present invention.

Figure 13A:
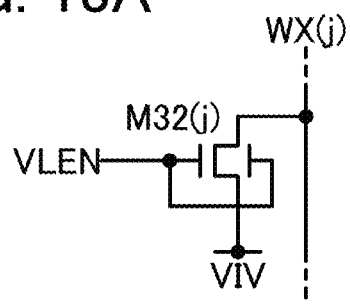
FIG. 13A and FIG. 13B are circuit diagrams illustrating a structure of a functional panel of an embodiment.
Figure 13B:
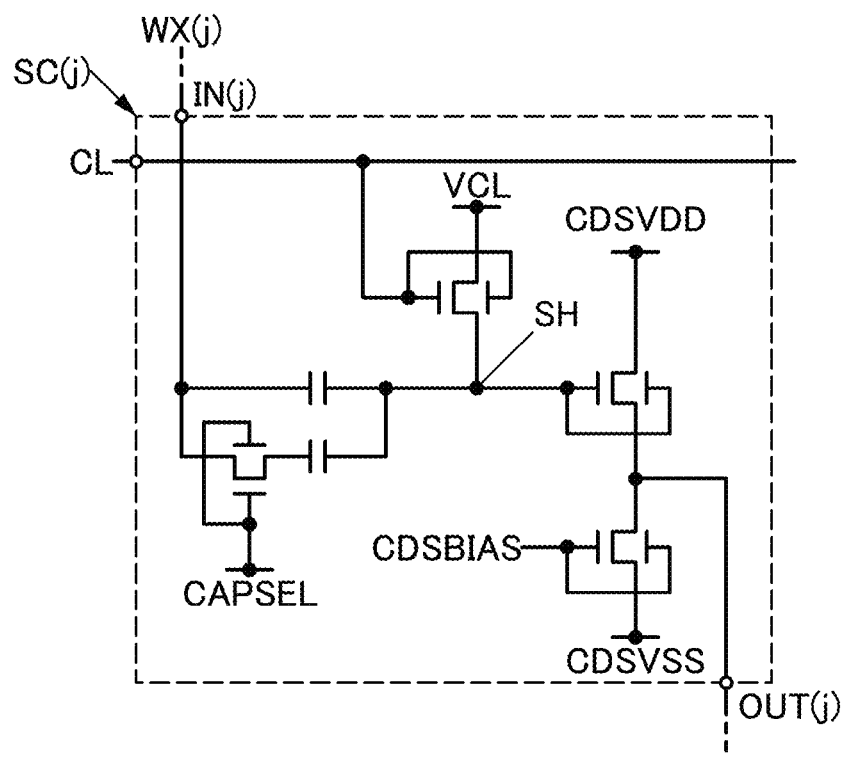

FIG. 13 shows circuit diagrams illustrating a structure of the functional panel of one embodiment of the present invention. FIG. 13A is a circuit diagram illustrating part of an amplifier circuit that can be used in the functional panel of one embodiment of the present invention, and FIG. 13B is a circuit diagram illustrating part of a sampling circuit that can be used in the functional panel of one embodiment of the present invention.

Figure 14:
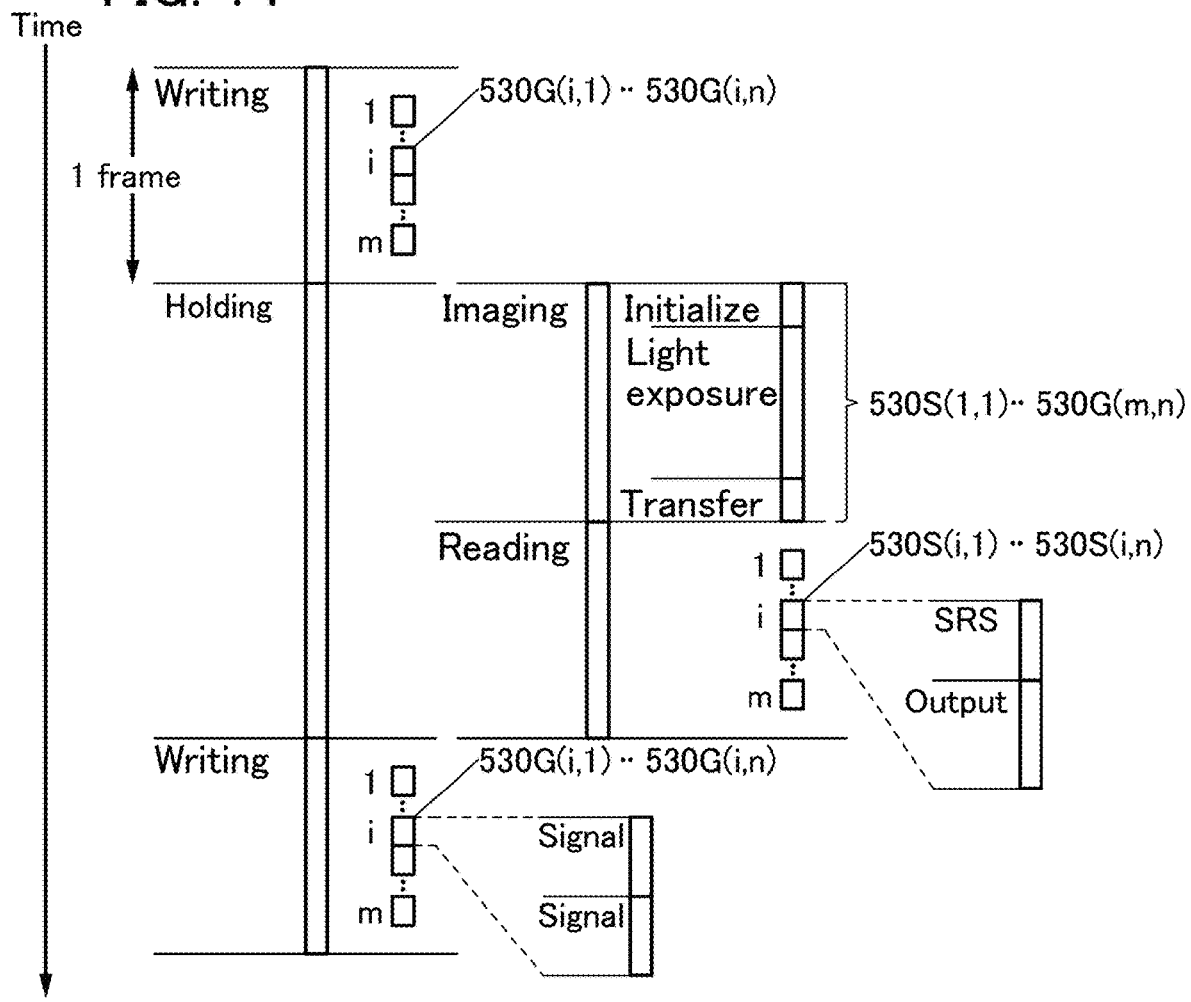
FIG. 14 is a diagram illustrating an operation of a functional panel of an embodiment.

FIG. 14 is a diagram illustrating an operation of the functional panel of one embodiment of the present invention.

<Structure Example 1 of Functional Panel 700>

The functional panel 700 described in this embodiment includes a region 231 (see FIG. 12).

<<Structure Example 1 of Region 231>>

The region 231 includes a group of pixels 703(i, 1) to 703(i, n) and a different group of pixels 703(1, j) to 703(m, j). The region 231 also includes the conductive film G1(i), the conductive film TX(i), the conductive film S1g(j), and the conductive film WX(j).

The group of pixels 703(i, 1) to 703(i, n) is arranged in the row direction (the direction indicated by an arrow R1 in the drawing), and the group of pixels 703(i, 1) to 703(i, n) includes the pixel 703(i, j).

The group of pixels 703(i, 1) to 703(i, n) is electrically connected to the conductive film G1(i), and the group of pixels 703(i, 1) to 703(i, n) is electrically connected to the conductive film TX(i).

The different group of pixels 703(1, j) to 703(m, j) is arranged in the column direction intersecting the row direction (the direction indicated by an arrow C1 in the drawing), and the different group of pixels 703(l, j) to 703(m, j) includes the pixel 703(i, j).

The different group of pixels 703(1, j) to 703(m, j) is electrically connected to the conductive film S1g(j), and the different group of pixels 703(1, j) to 703(m, j) is electrically connected to the conductive film WX(U).

Thus, imaging data can be obtained from a plurality of pixels. In addition, image data can be supplied to a plurality of pixels. Thus, a novel functional panel that is highly convenient, useful, or reliable can be provided.

<<Structure Example 2 of Region 231>>

The region 231 includes 600 or more pixels per inch. Note that the pixels include the pixel 702G(i, j).

<<Structure Example 3 of Region 231>>

The region 231 includes a plurality of pixels in a matrix. For example, the region 231 includes 7600 or more pixels in the row direction and the region 231 includes 4300 or more pixels in the column direction. Specifically, 7680 pixels are provided in the row direction and 4320 pixels are provided in the column direction.

Thus, a high-resolution image can be displayed. Thus, a novel functional panel that is highly convenient, useful, or reliable can be provided.

<<Structure Example 4 of Region 231>>

The region 231 has a diagonal greater than or equal to 114 cm and less than or equal to 200 cm.

Thus, a realistic image can be displayed. Thus, a novel functional panel that is highly convenient, useful, or reliable can be provided.

Although not shown, the region 231 includes a conductive film VCOM2 and the conductive film ANO.

<Structure Example 2 of Functional Panel 700>

The functional panel described in this embodiment includes the driver circuit GD (see FIG. 12).

<<Structure Example 1 of Driver Circuit GD>>

The driver circuit GD supplies a first selection signal.

<<Structure Example 1 of Pixel Circuit 530G(i, j)>>

The pixel circuit 530G(i, j) is supplied with the first selection signal, and the pixel circuit 530G(i, j) obtains an image signal on the basis of the first selection signal. For example, the first selection signal can be supplied using the conductive film G1(i) (see FIG. 5B). The image signal can be supplied using the conductive film S1g(U). Note that the operation of supplying the first selection signal and making the pixel circuit 530G(i, j) obtain the image signal can be referred to as "writing" (see FIG. 14).

The light-emitting device 550G(i, j) emits light in response to the image signal (see FIG. 5A).

Note that the light-emitting device 550G(i, j) includes the electrode 551G(i, j) electrically connected to the pixel circuit 530G(i, j), and the electrode 552 electrically connected to the conductive film VCOM2 (see FIG. 6 and FIG. 9A).

Structure Example 3 of Functional Panel 700

The functional panel of one embodiment of the present invention includes a reading circuit RC(j), a conductive film VLEN, a conductive film VIV, and a conductive film CL (see FIG. 12, FIG. 7, FIG. 13A, and FIG. 13B).

Structure Example of Reading Circuit RC(j)

The reading circuit RC(j) includes an amplifier circuit and a sampling circuit SC(j) (see FIG. 12).

Structure Example of Amplifier Circuit

The amplifier circuit includes a transistor M32 (see FIG. 13A).

The transistor M32 includes a gate electrode electrically connected to the conductive film VLEN, a first electrode electrically connected to the conductive film WX(j), and a second electrode electrically connected to the conductive film VIV.

Note that the conductive film WX(j) connects the transistor M31 and the transistor M32 when the switch SW33 is in a conduction state (see FIG. 7 and FIG. 13A). Thus, a source follower circuit can be configured with the transistor M31 and the transistor M32. The potential of the conductive film WX(j) can be changed on the basis of the potential of the node FD.

Structure Example of Sampling Circuit SC(j)

The sampling circuit SC(j) includes a first terminal IN(j), a second terminal, and a third 35 terminal OUT(j) (see FIG. 13B).

The first terminal is electrically connected to the conductive film WX(j), the second terminal is electrically connected to the conductive film CL, and the third terminal OUT(j) has a function of supplying a signal that changes on the basis of the potential of the first terminal IN(j).

Accordingly, an imaging signal can be obtained from the pixel circuit 530S($i, j$). A correlated double sampling method can be employed, for example. The sampling circuit SC(j) can be provided for each conductive film WX(j). A differential signal of the pixel circuit 530S(i, j) can be obtained by the corresponding conductive film WX(j). The operating frequency of the sampling circuit SC(j) can be low. Noise can be reduced. Thus, a novel functional panel that is highly convenient, useful, or reliable can be provided.

Structure Example 4 of Functional Panel 700

The functional panel 700 includes the driver circuit RD (see FIG. 12).

Structure Example 1 of Driver Circuit RD

The driver circuit RD supplies a second selection signal and a third selection signal.

Structure Example 1 of Pixel Circuit 530S(i, j)

The pixel circuit 530S(i, j) is supplied with the second selection signal and the third selection signal in a period during which the first selection signal is not supplied (see FIG. 14). In addition, the pixel circuit 530S(i, j) obtains an imaging signal on the basis of the second selection signal, and supplies the imaging signal on the basis of the third selection signal. For example, the second selection signal can be supplied using the conductive film TX(i), and the third selection signal can be supplied using the conductive film SE(i) (see FIG. 7).

Note that the operation of supplying the second selection signal and making the pixel circuit 530S(i, j) obtain an imaging signal can be referred to as "imaging" (see FIG. 14). The operation of reading an imaging signal from the pixel circuit 530S(i, j) can be referred to as "reading". The operation of supplying a predetermined voltage to the photoelectric conversion device PD(i, j) can be referred to as "initialization"; the operation of exposing the initialized photoelectric conversion device PD(i, j) to light in a predetermined period, "light exposure"; and the operation of reflecting a voltage that has been changed along with the light exposure on the pixel circuit 530S(i, j), "transfer". Moreover, in the figure, SRS corresponds to the operation of supplying a reference signal used in a correlated double sampling method, and "output" corresponds to the operation of supplying an imaging signal.

For example, image data of one frame can be written in 16.7 msec. Specifically, the operation can be performed at a frame rate of 60 Hz. Note that an image signal can be written to the pixel circuit 530G(i, j) in 15.2 psec.

For example, image data of one frame can be held in a period corresponding to 16 frames. Imaging data of one frame can be imaged and read in a period corresponding to 16 frames.

Specifically, it is possible to perform the initialization in 15 μsec, the light exposure in a period from 1 msec to 5 msec, and the transfer in 150 μsec. Moreover, the reading can be performed in 250 msec.

The photoelectric conversion device PD(i, j) includes the electrode 551S(i, j) electrically connected to the pixel circuit 530S(i, j), and the electrode 552 electrically connected to a conductive film VPD (see FIG. 7 and FIG. 10A). The electrode 552 used in the light-emitting device 550G(i, j) can be used in the photoelectric conversion device PD(i, j). Thus, the structure and the manufacturing process of the functional panel can be simplified.

Accordingly, imaging can be performed in a period during which the first selection signal is not supplied. Noise in imaging can be inhibited. An imaging signal can be read in the period during which the first selection signal is not supplied. Noise in reading can be inhibited. Thus, a novel functional panel that is highly convenient, useful, or reliable can be provided.

Structure Example 3 of Pixel 703(i, j)

The pixel 703(i, j) is supplied with the second selection signal in a period during which the pixel 703(i, j) holds one image signal. For example, in a period during which the pixel circuit 530G(i, j) holds one image signal, the pixel 703(i, j) can emit light using the light-emitting device 550G(i, j) on the basis of the image signal (see FIG. 14). The pixel circuit 530S(i, j) is supplied with the second selection signal after the pixel circuit 530G(i, j) obtains one image signal on the basis of the first selection signal by the time when the pixel circuit 530G(i, j) is supplied with the first selection signal again.

Accordingly, the intensity of light emitted from the light-emitting device 550G(i, j) can be controlled using the image signal. Light having a controlled intensity can be emitted to an object. The object can be imaged using the photoelectric conversion device PD(i, j). The object can be imaged using the photoelectric conversion device PD(i, j) while the intensity of emitted light is controlled. The influence of a change from one image signal to another image signal held in the pixel circuit 530G(i, j) on an imaging signal can be eliminated. Thus, a novel functional panel that is highly convenient, useful, or reliable can be provided.

Structure Example 5 of Functional Panel 700

The functional panel 700 of one embodiment of the present invention includes a multiplexer MUX, an amplifier circuit AMP, and an analog-digital converter circuit ADC (see FIG. 12).

Structure Example of Multiplexer MUX

The multiplexer MUX has a function of obtaining an imaging signal from one selected from the plurality of sampling circuits SC(j) and supplying the imaging signal to the amplifier circuit AMP, for example.

For example, the multiplexer MUX is electrically connected to the third terminal OUT(j) of the sampling circuit SC (see FIG. 13B). Specifically, the multiplexer MUX, which is electrically connected to a sampling circuit SC(1) to a sampling circuit SC(9), can obtain an imaging signal from a predetermined sampling circuit and supply the imaging signal to the amplifier circuit AMP.

Thus, imaging data can be obtained by selecting a predetermined pixel from a plurality of pixels arranged in the row direction. The number of imaging signals obtained at the same time can be limited to a predetermined number. It is possible to use the analog-digital converter circuit ADC in which the number of input channels is smaller than the number of pixels arranged in the row direction. Thus, a novel functional panel that is highly convenient, useful, or reliable can be provided.

<<Structure Example of Amplifier Circuit AMP>>

The amplifier circuit AMP can amplify the imaging signal and supply the amplified signal to the analog-digital converter circuit ADC.

Note that the functional layer 520 includes the multiplexer MUX and the amplifier circuit AMP.

Accordingly, for example, in the step of forming the semiconductor film used in the pixel circuit 530G(i, j), semiconductor films used in the multiplexer MUX and the amplifier circuit AMP can be formed. The manufacturing process of the functional panel can be simplified. Thus, a novel functional panel that is highly convenient, useful, or reliable can be provided.

<<Structure Example of Analog-Digital Converter Circuit ADC>>

The analog-digital converter circuit ADC has a function of converting an analog imaging signal to a digital signal.

Note that this embodiment can be combined with any of the other embodiments in this specification as appropriate.

Embodiment 6

In this embodiment, a structure of a display device of one embodiment of the present invention will be described with reference to FIG. 15.

FIG. 15 is a diagram illustrating the structure of the display device of one embodiment of the present invention. FIG. 15A is a block diagram of the display device of one embodiment of the present invention, and FIG. 15B to FIG. 15D are projection views each illustrating the appearance of the display device of one embodiment of the present invention.

<Structure Example of Display Device>

Figure 15A:
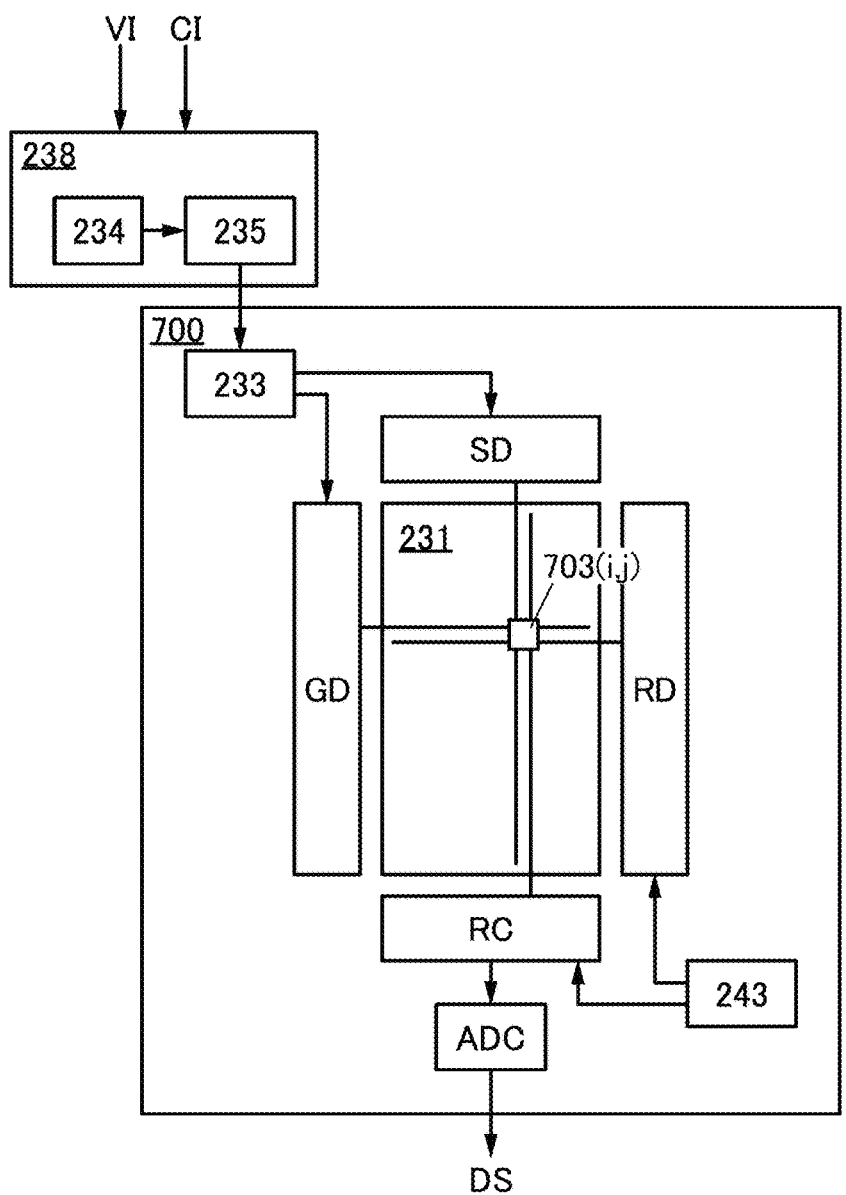
FIG. 15A to FIG. 15D are diagrams illustrating structures of a display device of an embodiment.
Figure 15B:
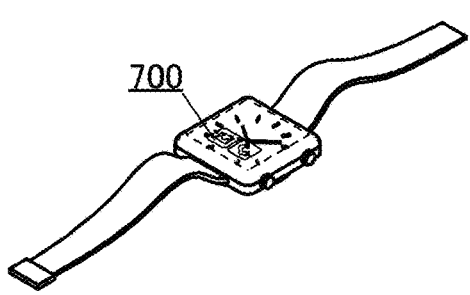
Figure 15C:
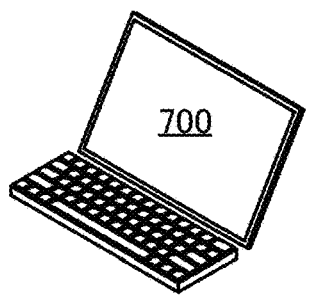
Figure 15D:
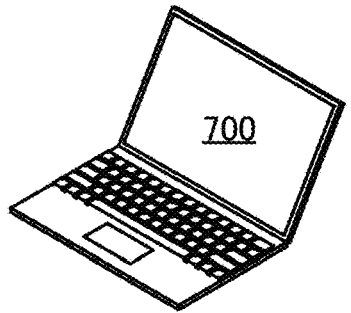

The display device described in this embodiment includes the functional panel 700 and a control portion 238 (see FIG. 15A).

<<Structure Example 1 of Control Portion 238>>

The control portion 238 is supplied with image data VI and control data CI. For example, a clock signal, a timing signal, or the like can be used as the control data CI.

The control portion 238 generates data on the basis of the image data VI and generates a control signal on the basis of the control data CI. Furthermore, the control portion 238 supplies the data and the control signal.

The data includes a grayscale of 8 bits or more, preferably 12 bits or more, for example. In addition, a clock signal, a start pulse, or the like of a shift register used for a driver circuit can be used as the control signal, for example.

<<Structure Example 2 of Control Portion 238>>

For example, a decompression circuit 234 and an image processing circuit 235 can be used in the control portion 238.

<<Decompression Circuit 234>>

The decompression circuit 234 has a function of decompressing the image data VI supplied in a compressed state. The decompression circuit 234 includes a memory portion. The memory portion has a function of storing decompressed image data, for example.

<<Image Processing Circuit 235>>

The image processing circuit 235 includes a memory region, for example. The memory region has a function of storing data included in the image data VI, for example.

The image processing circuit 235 has a function of generating the data by correcting the image data VI on the basis of a predetermined characteristic curve and a function of supplying the data, for example.

<<Structure Example 1 of Functional Panel>>

The functional panel 700 is supplied with the data and the control signal. For example, the functional panel 700 described in any one of Embodiment 1 to Embodiment 5 can be used.

<<Structure Example 5 of Pixel 703(i, j)>>

The pixel 703(i, j) performs display on the basis of the data.

Thus, the image data can be displayed using the display element. Thus, a novel display device that is highly convenient or reliable can be provided. For example, an information terminal (see FIG. 15B), a video monitor (see FIG. 15C), a laptop computer (see FIG. 15D), or the like can be provided.

<<Structure Example 2 of Functional Panel>>

The functional panel 700 includes a driver circuit and a control circuit, for example (see FIG. 15A).

<<Driver Circuit>>

The driver circuit operates on the basis of the control signal. Using the control signal enables a synchronized operation of a plurality of driver circuits.

For example, the driver circuit GD can be used in the functional panel 700. The driver circuit GD is supplied with the control signal and has a function of supplying the first selection signal.

For example, a driver circuit SD can be used in the functional panel 700. The driver circuit SD is supplied with the control signal and the data and can supply an image signal.

For example, the driver circuit RD can be used in the functional panel 700. The driver circuit RD is supplied with the control signal and can supply a second selection signal.

For example, the reading circuit RC can be used in the functional panel 700. The reading circuit RC is supplied with the control signal, and can read an imaging signal by a correlated double sampling method, for example.

<<Control Circuit>>

The control circuit has a function of generating and supplying the control signal. For example, a clock signal or a timing signal can be used as the control signal.

Specifically, the control circuit formed over a rigid substrate can be used in the functional panel. The control circuit formed over the rigid substrate and the control portion 238 can be electrically connected to each other using a flexible printed circuit.

<<Control Circuit 233>>

A timing controller can be used as a control circuit 233, for example.

Note that this embodiment can be combined with any of the other embodiments in this specification as appropriate.

Embodiment 7

In this embodiment, a structure of an input/output device of one embodiment of the present invention will be described with reference to FIG. 16.

Figure 16:
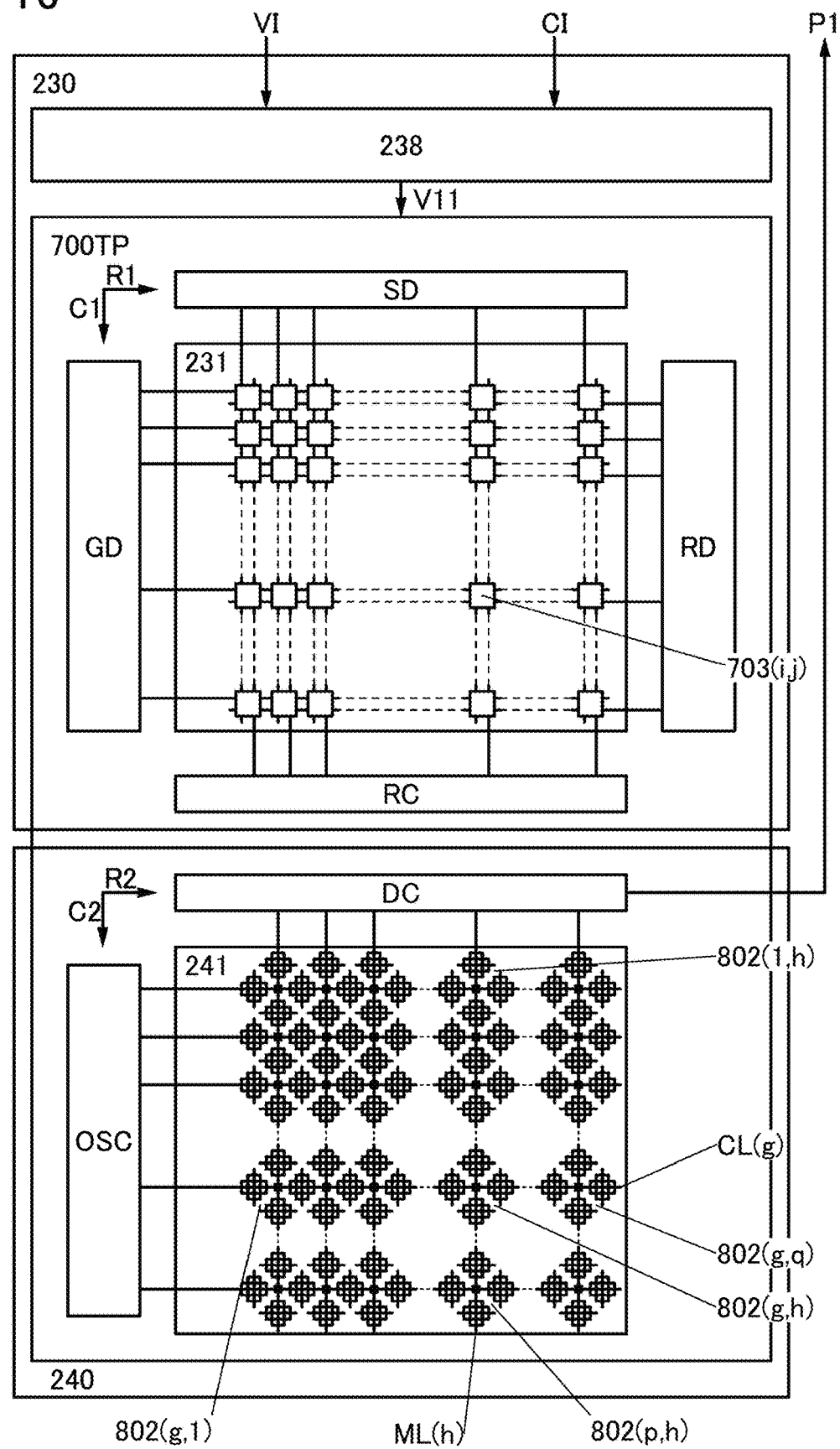
FIG. 16 is a block diagram illustrating a structure of an input/output device of an embodiment.

FIG. 16 is a block diagram illustrating the structure of the input/output device of one embodiment of the present invention.

<Structure Example 1 of Input/Output Device>

The input/output device described in this embodiment includes an input portion 240 and a display portion 230 (see FIG. 16).

<<Structure Example of Display Portion 230>>

The display portion 230 includes a functional panel. For example, the functional panel 700 described in any one of Embodiment 1 to Embodiment 5 can be used for the display portion 230. Note that a structure including the input portion 240 and the display portion 230 can be referred to as an input/output panel 700TP.

<<Structure Example of Input Portion 240>>

The input portion 240 includes a sensing region 241. The input portion 240 has a function of sensing an object approaching the sensing region 241.

The sensing region 241 includes a region overlapping with the pixel 703(*i*, *j*).

Thus, the object approaching the region overlapping with the display portion can be sensed while image data is displayed using the display portion. A finger or the like approaching the display portion can be used as a pointer to input position data. Position data can be associated with image data displayed on the display portion. Thus, a novel input/output device that is highly convenient or reliable can be provided.

<<Structure Example 1 of Sensing Region 241>>

The sensing region 241 includes one or a plurality of sensors, for example.

The sensing region 241 includes a group of sensors 802(*g*, 1) to 802(*g*, *q*) and a different group of sensors 802(1, h) to 802(*p*, h). Note that g is an integer greater than or equal to 1 and less than or equal to p, h is an integer greater than or equal to 1 and less than or equal to q, and p and q are each an integer greater than or equal to 1.

The group of sensors 802(*g*, 1) to 802(*g*, *q*) includes a sensor 802(*g*, h) and is arranged in the row direction (the direction indicated by an arrow R2 in the drawing). Note that the direction indicated by the arrow R2 may be the same as or different from the direction indicated by the arrow R1.

The different group of sensors 802(1, h) to 802(*p*, h) includes the sensor 802(*g*, h) and is arranged in the column direction intersecting the row direction (the direction indicated by an arrow C2 in the drawing).

<<Sensor>>

The sensor has a function of sensing an approaching pointer. For example, a finger or a stylus pen can be used as the pointer. For example, a piece of metal or a coil can be used for the stylus pen.

Specifically, a capacitive proximity sensor, an electromagnetic inductive proximity sensor, an optical proximity sensor, a resistive proximity sensor, or the like can be used as the sensor.

A plurality of types of sensors can be used in combination. For example, a sensor that senses a finger and a senor that senses a stylus pen can be used in combination.

This allows determination of the kind of a pointer. Different instructions can be associated with sensing data depending on the kind of a pointer that has been determined. Specifically, in the case where it is determined that a finger is used as a pointer, sensing data can be associated with a gesture. In the case where it is determined that a stylus pen is used as a pointer, sensing data can be associated with drawing processing.

Specifically, a finger can be sensed using a capacitive, pressure-sensitive, or optical proximity sensor. A stylus pen can be sensed using an electromagnetic inductive or optical proximity sensor.

<<Structure Example 2 of Input Portion 240>>

The input portion 240 includes an oscillation circuit OSC and a sensing circuit DC (see FIG. 16).

The oscillation circuit OSC supplies a search signal to the sensor 802(*g*, h). For example, a rectangular wave, a sawtooth wave, a triangular wave, or a sine wave can be used as the search signal.

The sensor 802(*g*, h) generates and supplies a sensing signal that changes in accordance with the search signal and the distance to a pointer approaching the sensor 802(*g*, h).

The sensing circuit DC supplies input data in response to the sensing signal.

Accordingly, the distance from an approaching pointer to the sensing region 241 can be sensed. The position in the sensing region 241 where the pointer comes the closest can be sensed.

Note that this embodiment can be combined with any of the other embodiments in this specification as appropriate.

Embodiment 8

In this embodiment, a structure of a data processing device of one embodiment of the present invention will be described with reference to FIG. 17 to FIG. 19.

Figure 17A:
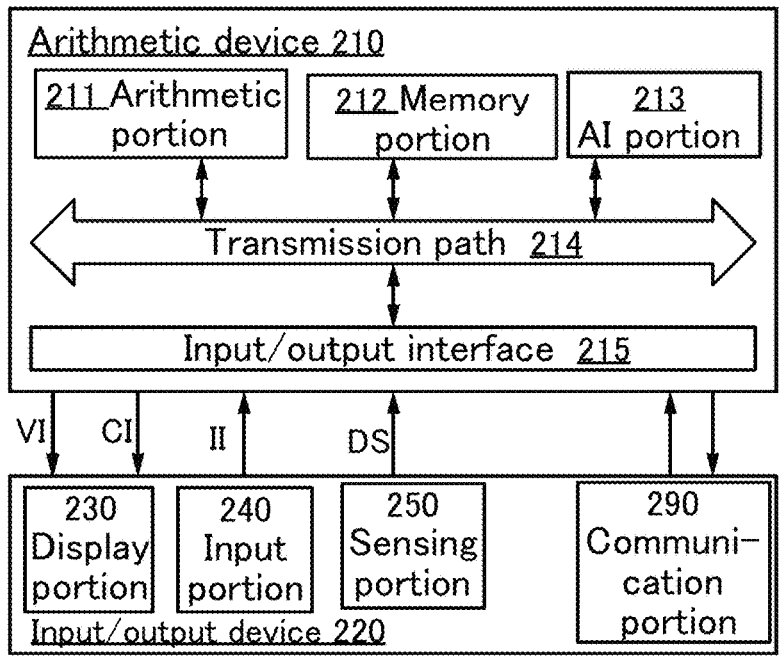
FIG. 17A to FIG. 17C are diagrams illustrating a structure of a data processing device of an embodiment.
Figure 17B:
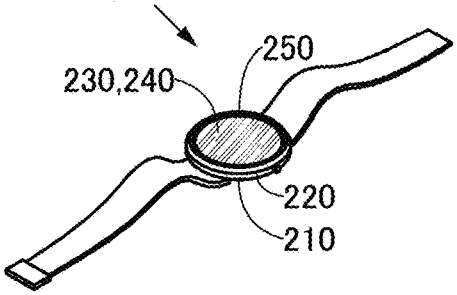
Figure 17C:
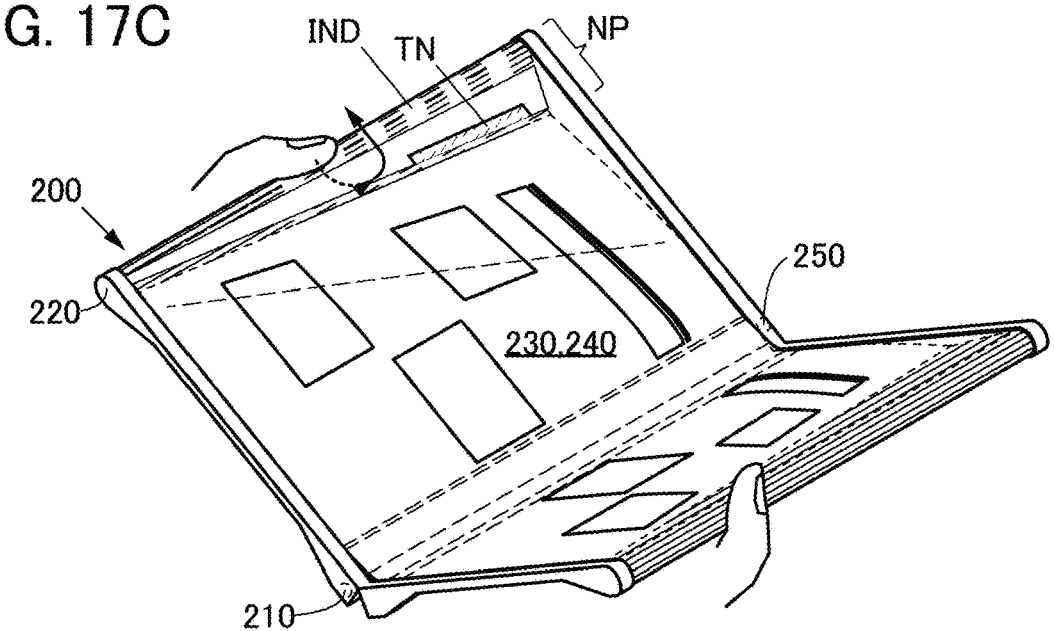

FIG. 17A is a block diagram illustrating the structure of the data processing device of one embodiment of the present invention. FIG. 17B and FIG. 17C are projection views each illustrating an example of the appearance of the data processing device.

Figure 18A:
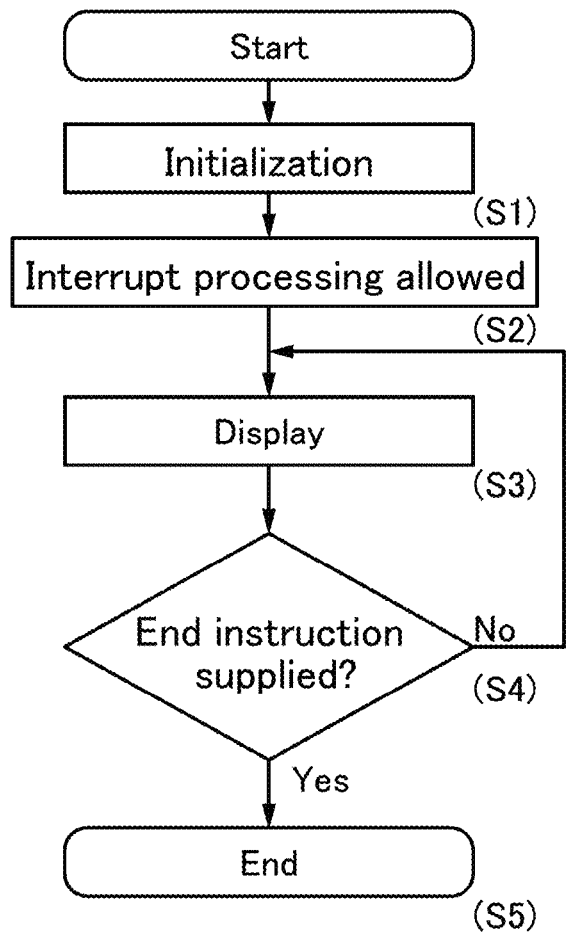
FIG. 18A and FIG. 18B are flowcharts illustrating a method for driving a data processing device of an embodiment.
Figure 18B:
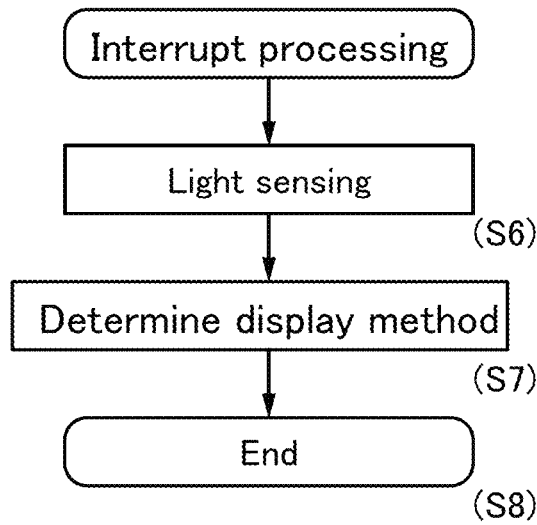

FIG. 18 shows flowcharts showing a program of one embodiment of the present invention. FIG. 18A is a flowchart showing main processing of the program of one embodiment of the present invention, and FIG. 18B is a flowchart showing interrupt processing.

Figure 19A:
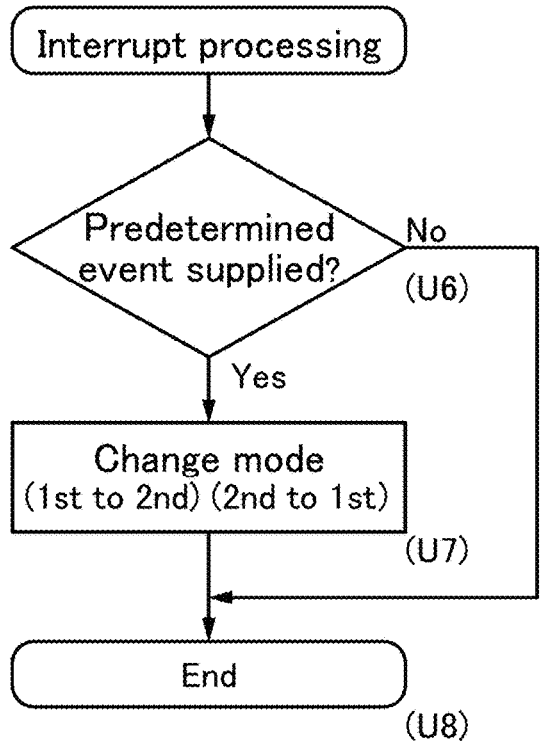
FIG. 19A to FIG. 19C are diagrams illustrating a method for driving a data processing device of an embodiment.
Figure 19B:
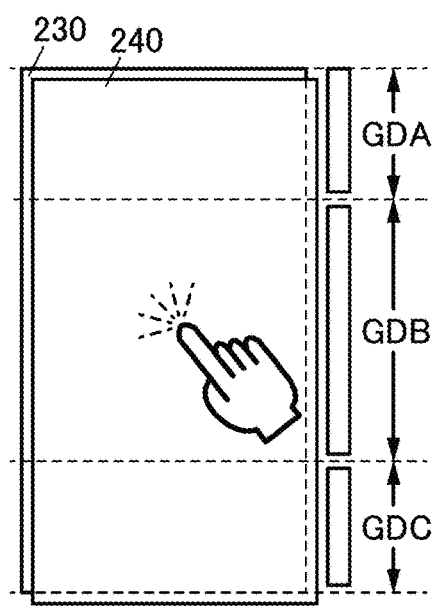
Figure 19C:
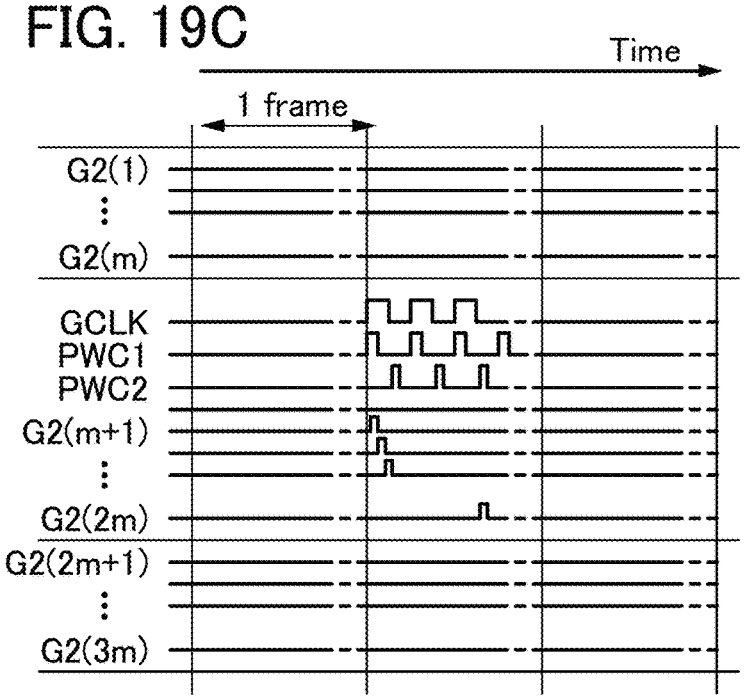

FIG. 19 shows the program of one embodiment of the present invention. FIG. 19A is a flowchart showing interrupt processing of the program of one embodiment of the present invention. FIG. 19B is a schematic view illustrating handling of the data processing device, and FIG. 19C is a timing chart showing the operation of the data processing device of one embodiment of the present invention.

<Structure Example 1 of Data Processing Device>

The data processing device described in this embodiment includes an arithmetic device 210 and an input/output device 220 (see FIG. 17A). Note that the input/output device 220 is electrically connected to the arithmetic device 210. A data processing device 200 can include a housing (see FIG. 17B and FIG. 17C).

<<Structure Example 1 of Arithmetic Device 210>>

The arithmetic device 210 is supplied with input data II or sensing data DS. The arithmetic device 210 generates the control data CI and the image data VI on the basis of the input data II or the sensing data DS, and supplies the control data CI and the image data VI.

The arithmetic device 210 includes an arithmetic portion 211 and a memory portion 212. The arithmetic device 210 also includes a transmission path 214 and an input/output interface 215.

The transmission path 214 is electrically connected to the arithmetic portion 211, the memory portion 212, and the input/output interface 215.

<<Arithmetic Portion 211>>

The arithmetic portion 211 has a function of executing a program, for example.

<<Memory Portion 212>>

The memory portion 212 has a function of storing, for example, the program executed by the arithmetic portion 211, initial data, setting data, an image, or the like.

Specifically, a hard disk, a flash memory, a memory using a transistor including an oxide semiconductor, or the like can be used.

<<Input/Output Interface 215 and Transmission Path 214>>

The input/output interface 215 includes a terminal or a wiring and has a function of supplying data and being supplied with data. The input/output interface 215 can be electrically connected to the transmission path 214, for example. The input/output interface 215 can also be electrically connected to the input/output device 220.

The transmission path 214 includes a wiring and has a function of supplying data and being supplied with data. The transmission path 214 can be electrically connected to the input/output interface 215, for example. The transmission path 214 can also be electrically connected to the arithmetic portion 211, the memory portion 212, or the input/output interface 215.

<<Structure Example of Input/Output Device 220>>

The input/output device 220 supplies the input data II and the sensing data DS. The input/output device 220 is supplied with the control data CI and the image data VI (see FIG. 17A).

As the input data II, for example, a scan code of a keyboard, position data, data on button handling, sound data, or image data can be used. As the sensing data DS, for example, illuminance data, attitude data, acceleration data, direction data, pressure data, temperature data, humidity data, or the like of the environment where the data processing device 200 is used, or the like can be used.

As the control data CI, for example, a signal controlling the luminance of display of the image data VI, a signal controlling the color saturation, or a signal controlling the hue can be used. A signal that changes display of part of the image data VI can be used as the control data CI.

The input/output device 220 includes the display portion 230, the input portion 240, and a sensing portion 250. For example, the input/output device described in Embodiment 7 can be used as the input/output device 220. The input/output device 220 can include a communication portion 290.

<<Structure Example of Display Portion 230>>

The display portion 230 displays the image data VI on the basis of the control data CI.

The display portion 230 includes the control portion 238, the driver circuit GD, the driver circuit SD, and the functional panel 700 (see FIG. 15). For example, the display device described in Embodiment 6 can be used for the display portion 230.

<<Structure Example of Input Portion 240>>

The input portion 240 generates the input data II. For example, the input portion 240 has a function of supplying position data P1.

For example, a human interface or the like can be used as the input portion 240 (see FIG. 17A). Specifically, a keyboard, a mouse, a touch sensor, a microphone, a camera, or the like can be used as the input portion 240.

A touch sensor including a region overlapping with the display portion 230 can be used. Note that an input/output device including the display portion 230 and a touch sensor including a region overlapping with the display portion 230 can be referred to as a touch panel or a touch screen.

A user can make various gestures (tap, drag, swipe, pinch in, and the like) using his/her finger touching the touch panel as a pointer, for example.

The arithmetic device 210, for example, analyzes data on the position, path, or the like of a finger in contact with the touch panel and can determine that a predetermined gesture is supplied when the analysis results meet predetermined conditions. Thus, the user can supply a predetermined operation instruction associated with a predetermined gesture in advance by using the gesture.

For instance, the user can supply a "scroll instruction" for changing the display position of image data by using a gesture of moving a finger in contact with the touch panel along the touch panel.

The user can supply a "dragging instruction" for pulling out and displaying a navigation panel NP at an edge portion of the region 231 by using a gesture of moving a finger in contact with the edge portion of the region 231 (see FIG. 17C). Moreover, the user can supply a "leafing through instruction" for displaying index images IND, some parts of other pages, or thumbnail images TN of other pages in a predetermined order on the navigation panel NP so that the user can flip through these images, by using a gesture of moving the position where a finger presses hard. The instruction can be supplied by using the finger press pressure. Consequently, the user can turn the pages of an e-book reader terminal like flipping through the pages of a paper book. The user can search a certain page with the aid of the thumbnail images TN or the index images IND.

<<Structure Example of Sensing Portion 250>>

The sensing portion 250 generates the sensing data DS. The sensing portion 250 has a function of sensing the illuminance of the environment where the data processing device 200 is used and a function of supplying illuminance data, for example.

The sensing portion 250 has a function of sensing the ambient conditions and supplying the sensing data. Specifically, illuminance data, attitude data, acceleration data, direction data, pressure data, temperature data, humidity data, or the like can be supplied For example, a photosensor, an attitude sensor, an acceleration sensor, a direction sensor, a GPS (Global positioning system) signal receiving circuit, a pressure-sensitive switch, a pressure sensor, a temperature sensor, a humidity sensor, a camera, or the like can be used as the sensing portion 250.

<<Communication Portion 290>>

The communication portion 290 has a function of supplying data to a network and obtaining data from the network.

<<Housing>>

Note that the housing has a function of storing the input/output device 220 or the arithmetic device 210. The housing has a function of supporting the display portion 230 or the arithmetic device 210.

Thus, the control data can be generated on the basis of the input data or the sensing data. The image data can be displayed on the basis of the input data or the sensing data. The data processing device is capable of operating with knowledge of the intensity of light that the housing of the data processing device receives in the environment where the data processing device is used. The user of the data processing device can select a display method. Thus, a novel data processing device that is highly convenient or reliable can be provided.

Note that in some cases, these components cannot be clearly distinguished from each other and one component may also serve as another component or may include part of another component. For example, a touch panel in which a touch sensor overlaps with a functional panel is an input portion as well as a display portion.

<<Structure Example 2 of Arithmetic Device 210>>

The arithmetic device 210 includes an artificial intelligence (AI) portion 213 (see FIG. 17A).

The artificial intelligence portion 213 is supplied with the input data II or the sensing data DS, and the artificial intelligence portion 213 infers the control data CI on the basis of the input data II or the sensing data DS. Moreover, the artificial intelligence portion 213 supplies the control data CI.

In this manner, the control data CI for display that can be felt suitable can be generated. Display that can be felt suitable is possible. The control data CI for display that can be felt comfortable can be generated. Display that can be felt comfortable is possible. Thus, a novel data processing device that is highly convenient or reliable can be provided.

[Natural Language Processing on Input Data II]

Specifically, the artificial intelligence portion 213 can perform natural language processing on the input data II to extract one feature from the whole input data II. For example, the artificial intelligence portion 213 can infer emotion or the like put in the input data II, which can be a feature. The artificial intelligence portion 213 can infer the color, design, font, or the like empirically felt suitable for the feature. The artificial intelligence portion 213 can generate data specifying the color, design, or font of a letter or data specifying the color or design of the background, and the data can be used as the control data CI.

Specifically, the artificial intelligence portion 213 can perform natural language processing on the input data II to extract some words included in the input data II. For example, the artificial intelligence portion 213 can extract expressions including a grammatical error, a factual error, emotion, and the like. The artificial intelligence portion 213 can generate the control data CI for displaying extracted part in the color, design, font, or the like different from those of another part, and the data can be used as the control data CI.

[Image Processing on Input Data II]

Specifically, the artificial intelligence portion 213 can perform image processing on the input data II to extract one feature from the input data II. For example, the artificial intelligence portion 213 can infer the age where an image of the input data II is taken, whether the image is taken indoors or outdoors, whether the image is taken in the daytime or at night, or the like, which can be a feature. The artificial intelligence portion 213 can infer the color tone empirically felt suitable for the feature and generate the control data CI for use of the color tone for display. Specifically, data specifying color (e.g., full color, monochrome, or sepia) used for expression of a gradation can be used as the control data CI.

Specifically, the artificial intelligence portion 213 can perform image processing on the input data II to extract some images included in the input data II. For example, the artificial intelligence portion 213 can generate the control data CI for displaying a boundary between extracted part of the image and another part. Specifically, the artificial intelligence portion 213 can generate the control data CI for displaying a rectangle surrounding the extracted part of the image.

[Inference Using Sensing Data DS]

Specifically, the artificial intelligence portion 213 can generate an inference R1 using the sensing data DS. The artificial intelligence portion 213 can generate the control data CI on the basis of the inference R1 so that the user of the data processing device 200 can feel comfortable.

Specifically, the artificial intelligence portion 213 can generate the control data CI for adjustment of display brightness on the basis of the ambient illuminance or the like so that the display brightness can be felt comfortable. The artificial intelligence portion 213 can generate the control data CI for adjustment of volume on the basis of the ambient noise or the like so that the volume can be felt comfortable.

As the control data CI, a clock signal, a timing signal, or the like that is supplied to the control portion 238 included in the display portion 230 can be used. A clock signal, a timing signal, or the like that is supplied to a control portion 248 included in the input portion 240 can be used as the control data CI.

<Structure Example 2 of Data Processing Device>

Another structure of the data processing device of one embodiment of the present invention will be described with reference to FIG. 18A and FIG. 18B.

<<Program>>

A program of one embodiment of the present invention has the following steps (see FIG. 18A).

[First Step]

In a first step, setting is initialized (see (S1) in FIG. 18A).

For example, predetermined image data that is to be displayed on start-up, a predetermined mode for displaying the image data, and data for determining a predetermined display method for displaying the image data are acquired from the memory portion 212. Specifically, one still image data or another moving image data can be used as the predetermined image data. Furthermore, a first mode or a second mode can be used as the predetermined mode.

[Second Step]

In a second step, interrupt processing is allowed (see (S2) in FIG. 18A). Note that an arithmetic device allowed to execute the interrupt processing can perform the interrupt processing in parallel with the main processing. The arithmetic device that has returned from the interrupt processing to the main processing can reflect the results obtained through the interrupt processing in the main processing.

The arithmetic device may execute the interrupt processing when a counter has an initial value, and the counter may be set at a value other than the initial value when the arithmetic device returns from the interrupt processing. Thus, the interrupt processing can be executed any time after the program is started up.

[Third Step]

In a third step, image data is displayed by a predetermined mode or a predetermined display method selected in the first step or the interrupt processing (see (S3) in FIG. 18A). Note that the predetermined mode determines a mode for displaying the data, and the predetermined display method determines a method for displaying the image data. For example, the image data VI can be used as data to be displayed.

One method for displaying the image data VI can be associated with the first mode, for example. Another method for displaying the image data VI can be associated with the second mode. Thus, a display method can be selected on the basis of the selected mode.

<<First Mode>>

Specifically, a method for supplying selection signals to a scan line at a frequency of 30 Hz or higher, preferably 60 Hz or higher, to perform display in response to the selection signals can be associated with the first mode.

For example, when selection signals are supplied at a frequency of 30 Hz or higher, preferably 60 Hz or higher, the movement of a displayed moving image can be smooth.

For example, when an image is refreshed at a frequency of 30 Hz or higher, preferably 60 Hz or higher, an image that changes so as to smoothly follow the user's operation can be displayed on the data processing device 200 which is being operated by the user.

<<Second Mode>>

Specifically, a method for supplying selection signals to a scan line at a frequency lower than 30 Hz, preferably lower than 1 Hz, and further preferably less than once a minute, to perform display in response to the selection signals can be associated with the second mode.

The supply of selection signals at a frequency lower than 30 Hz, preferably lower than 1 Hz, and further preferably less than once a minute enables display with a flicker or flickering suppressed. Furthermore, the power consumption can be reduced.

For example, in the case where the data processing device 200 is used for a clock, the display can be refreshed at a frequency of once a second, once a minute, or the like.

In the case where a light-emitting element is used as a display element, for example, the light-emitting element can be made to emit light in a pulsed manner so that the image data is displayed. Specifically, an organic EL element can be made to emit light in a pulsed manner, and its afterglow can be used for display. The organic EL element has excellent frequency characteristics; thus, time for driving the light-emitting element can be shortened and the power consumption can be reduced in some cases. Heat generation is inhibited; thus, the deterioration of the light-emitting element can be suppressed in some cases.

[Fourth Step]

In a fourth step, selection is performed such that the program proceeds to a fifth step when an end instruction has been supplied, whereas the program proceeds to the third step when the end instruction has not been supplied (see (S4) in FIG. 18A).

For example, the end instruction supplied in the interrupt processing may be used for the determination.

[Fifth Step]

In the fifth step, the program ends (see (S5) in FIG. 18A).

<<Interrupt Processing>>

The interrupt processing includes a sixth step to an eighth step described below (see FIG. 18B).

[Sixth Step]

In the sixth step, the illuminance of the environment where the data processing device 200 is used is sensed using the sensing portion 250, for example (see (S6) in FIG. 18B). Note that color temperature or chromaticity of ambient light may be sensed instead of the illuminance of the environment.

[Seventh Step]

In the seventh step, a display method is determined on the basis of the sensed illuminance data (see (S7) in FIG. 18B). For example, a display method is determined such that the brightness of display is not too dark or too bright.

Note that in the case where the color temperature of the ambient light or the chromaticity of the ambient light is sensed in the sixth step, the color of display may be adjusted.

[Eighth Step]

In the eighth step, the interrupt processing ends (see (S8) in FIG. 18B).

<Structure Example 3 of Data Processing Device>

Another structure of the data processing device of one embodiment of the present invention will be described with reference to FIG. 19.

FIG. 19A is a flowchart illustrating a program of one embodiment of the present invention. FIG. 19A is a flowchart showing interrupt processing different from the interrupt processing shown in FIG. 18B.

Note that the structure example 3 of the data processing device is different from the interrupt processing described with reference to FIG. 18B in that the interrupt processing includes a step of changing a mode on the basis of a supplied predetermined event. Different portions will be described in detail here, and the above description is referred to for portions that can use similar structures.

<<Interrupt Processing>>

The interrupt processing includes a sixth step to an eighth step described below (see FIG. 19A).

[Sixth Step]

In the sixth step, the program proceeds to the seventh step when a predetermined event has been supplied, whereas the program proceeds to the eighth step when the predetermined event has not been supplied (see (U6) in FIG. 19A). For example, whether the predetermined event is supplied in a predetermined period or not can be used as a condition. Specifically, the predetermined period can be longer than 0 seconds, and shorter than or equal to 5 seconds, shorter than or equal to 1 second, or shorter than or equal to 0.5 seconds, preferably shorter than or equal to 0.1 seconds.

[Seventh Step]

In the seventh step, the mode is changed (see (U7) in FIG. 19A). Specifically, the second mode is selected in the case where the first mode has been selected, and the first mode is selected in the case where the second mode has been selected.

For example, it is possible to change the display mode of a region that is part of the display portion 230. Specifically, the display mode of a region where one driver circuit in the display portion 230 including a driver circuit GDA, a driver circuit GDB, and a driver circuit GDC supplies a selection signal can be changed (see FIG. 19B).

For example, the display mode of the region where a selection signal is supplied from the driver circuit GDB can be changed when a predetermined event is supplied to the input portion 240 in a region overlapping with the region where a selection signal is supplied from the driver circuit GDB (see FIG. 19B and FIG. 19C). Specifically, the frequency of supply of the selection signal from the driver circuit GDB can be changed in accordance with a "tap" event supplied to a touch panel with a finger or the like.

A signal GCLK is a clock signal controlling the operation of the driver circuit GDB, and a signal PWC1 and a signal PWC2 are pulse width control signals controlling the operation of the driver circuit GDB. The driver circuit GDB supplies selection signals to a conductive film G2($m$+1) to a conductive film G2($2m$) on the basis of the signal GCLK, the signal PWC1, the signal PWC2, and the like.

Thus, for example, the driver circuit GDB can supply a selection signal without supply of selection signals from the driver circuit GDA and the driver circuit GDC. The display of the region where a selection signal is supplied from the driver circuit GDB can be refreshed without any change in the display of regions where selection signals are supplied from the driver circuit GDA and the driver circuit GDC. Power consumed by the driver circuits can be reduced.

[Eighth Step]

In the eighth step, the interrupt processing ends (see (U8) in FIG. 19A). Note that in a period during which the main processing is executed, the interrupt processing may be repeatedly executed.

<<Predetermined Event>>

For example, it is possible to use events supplied using a pointing device such as a mouse, such as "click" and "drag", and events supplied to a touch panel with a finger or the like used as a pointer, such as "tap", "drag", and "swipe".

For example, the position of a slide bar pointed by a pointer, the swipe speed, and the drag speed can be used to assign arguments to an instruction associated with a predetermined event.

For example, data sensed by the sensing portion 250 is compared with a predetermined threshold value, and the compared results can be used for the event.

Specifically, a pressure sensor or the like in contact with a button or the like that is arranged so as to be pushed in a housing can be used for the sensing portion 250.

<<Instruction Associated with Predetermined Event>>

For example, the end instruction can be associated with a predetermined event.

For example, "page-turning instruction" for switching display from one displayed image data to another image data can be associated with a predetermined event. Note that an argument determining the page-turning speed or the like, which is used when the "page-turning instruction" is executed, can be supplied using the predetermined event.

For example, "scroll instruction" for moving the display position of displayed part of image data and displaying another part continuing from that part, or the like can be associated with a predetermined event. Note that an argument determining the moving speed of display, or the like, which is used when the "scroll instruction" is executed, can be supplied using the predetermined event.

For example, an instruction for setting the display method, an instruction for generating image data, or the like can be associated with a predetermined event. Note that an argument determining the brightness of a generated image can be associated with a predetermined event. An argument determining the brightness of a generated image may be determined on the basis of ambient brightness sensed by the sensing portion 250.

For example, an instruction for acquiring data distributed via a push service using the communication portion 290 or the like can be associated with a predetermined event.

Note that position data sensed by the sensing portion 250 may be used for the determination of the presence or absence of a qualification for acquiring data. Specifically, it may be determined that there is a qualification for acquiring data in the case of presence in a predetermined classroom, school, conference room, company, building, or the like or in a predetermined region. Thus, for example, educational materials distributed in a classroom of a school, a university, or the like can be received, so that the data processing device 200 can be used as a schoolbook or the like (see FIG. 17C). Materials distributed in a conference room in, for example, a company can be received and used for a conference material.

<Structure Example 4 of Data Processing Device>

Another structure of the data processing device of one embodiment of the present invention will be described with reference to FIG. 20.

Figure 20A:
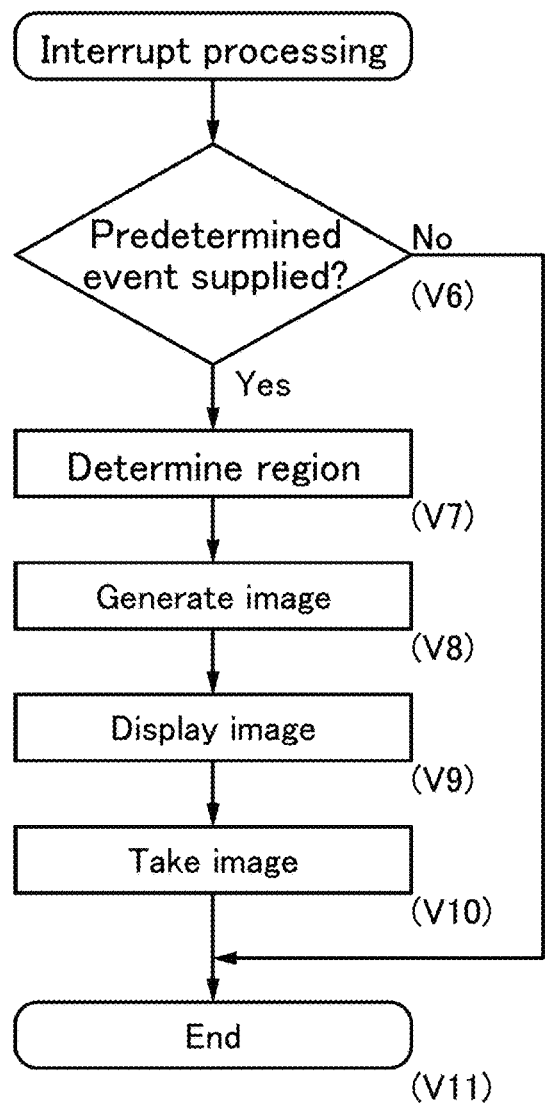
FIG. 20A to FIG. 20C are diagrams illustrating a method for driving a data processing device of an embodiment.
Figure 20B:
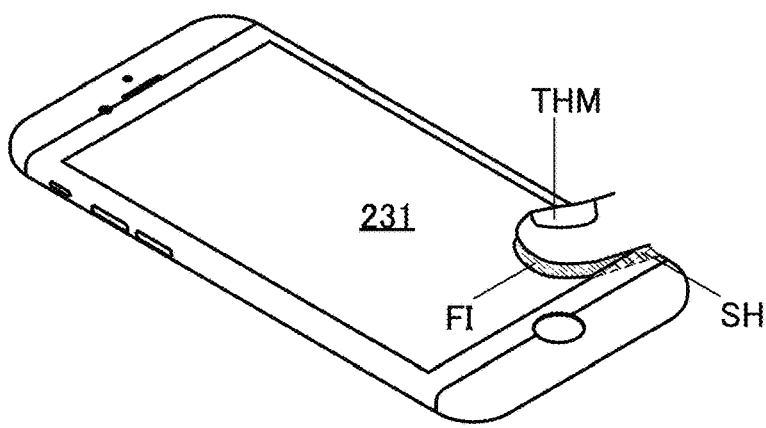
Figure 20C:

FIG. 20A is a flowchart showing a program of one embodiment of the present invention. FIG. 20A is a flowchart showing interrupt processing different from the interrupt processing shown in FIG. 18B. FIG. 20B is a schematic view illustrating operation of the program shown in FIG. 20A. FIG. 20C is a schematic view of an imaged fingerprint.

Note that the structure example 4 of the data processing device described with reference to FIG. 20A is different from the structure example described with reference to FIG. 18B in the interrupt processing. Specifically, the interrupt processing includes the step of determining a region, the step of generating an image, the step of displaying the image, and the step of imaging on the basis of a supplied predetermined event. Different portions will be described in detail here, and the above description is referred to for portions that can use similar structures.

<<Interrupt Processing>>

The interrupt processing includes a sixth step to an eleventh step (see FIG. 20A).

[Sixth Step]

In the sixth step, the program proceeds to the seventh step when a predetermined event has been supplied, whereas the program proceeds to the eleventh step when the predetermined event has not been supplied (see (V6) in FIG. 20A).

The predetermined event can be supplied using the sensing portion 250, for example. Specifically, a motion such as lifting of the data processing device can be used as the predetermined event. For example, a motion of the data processing device can be sensed using an angular sensor or an acceleration sensor. Touch or approach of an object such as a finger can be sensed using a touch sensor.

[Seventh Step]

In the seventh step, a first region SH is determined (see (V7) in FIG. 20A).

For example, a region where an object such as a finger touches or approaches the input/output device 220 of one embodiment of the present invention can be the first region SH. A region that is set in advance by the user or the like can be used as the first region SH.

Specifically, an image of a finger THM or the like that touches or approaches the functional panel of one embodiment of the present invention is taken using the pixel 703($i, j$) and subjected to image processing, whereby the first region SH can be determined (see FIG. 20B).

For example, an image of a shadow caused when external light is blocked by touch or approach of an object such as the finger THM is taken using the pixel 703($i, j$) in the functional panel of one embodiment of the present invention and subjected to image processing, whereby the first region SH can be determined.

With the use of the pixel 703($i, j$) in the functional panel of one embodiment of the present invention, an object such as the finger THM that touches or approaches the functional panel is irradiated with light, and an image of light reflected by the object is taken using the pixel 703($i, j$) and subjected to image processing, whereby the first region SH can be determined.

A region where an object such as the finger THM touches can be determined as the first region SH by a touch sensor.

[Eighth Step]

In the eighth step, an image FI including a second region and a third region is generated on the basis of the first region SH (see (V8) in FIG. 20A and FIG. 20B). For example, the shape of the first region SH is used as the shape of the second region, and a region excluding the first region SH is used as the third region.

[Ninth Step]

In the ninth step, the image FI is displayed such that the second region overlaps with the first region SH (see (V9) in FIG. 20A and FIG. 20B).

For example, an image signal is generated from the image FI and supplied to the region 231, and light is emitted from the pixel 703($i, j$). In a period during which the first selection signal is supplied to the conductive film G1($i$), the generated image signal is supplied to the conductive film S1g($j$), and the image signal can be written to the pixel 703($i, j$). The generated image signal is supplied to the conductive film S1g($j$) and the conductive film S2g($j$), and an enhanced image signal can be written to the pixel 703(i, j). The use of an enhanced image signal enables display with higher luminance.

Thus, the image FI can be displayed to overlap with the region SH that is a region where the object such as a finger touches or approaches the region 231. The region where the object such as a finger touches can be irradiated with light using the pixel 703(i, j). The touching or approaching object such as the finger THM can be illuminated with a light. The object such as a finger can be led to touch or approach the region that is determined in advance by the user or the like.

[Tenth Step]

In the tenth step, the object that touches or approaches the first region SH is imaged while the image FI is displayed (see (V10) in FIG. 20A and FIG. 20B).

For example, an image of the finger THM or the like approaching the region 231 is taken while the finger or the like is irradiated with light. Specifically, an image of a fingerprint FP of the finger THM touching the region 231 can be taken (see FIG. 20C).

For example, the supply of the first selection signal can be stopped while an image is displayed with the pixel 703(i, j). For example, imaging can be performed using the pixel 703(i, j) while the supply of the selection signal to the pixel circuit 530G(i, j) is stopped.

Accordingly, the touching or approaching object such as a finger can be imaged while the object is illuminated. Imaging can be performed in a period during which the first selection signal is not supplied. Noise in imaging can be inhibited. A clear image of a fingerprint can be obtained. An image that can be used for the authentication of the user can be obtained. In any area of the region 231, an image of the fingerprint of the finger touching the region 231 can be taken clearly. Thus, a novel data processing device that is highly convenient or reliable can be provided.

[Eleventh Step]

In the eleventh step, the interrupt processing ends (see (V11) in FIG. 20A).

Note that this embodiment can be combined with any of the other embodiments in this specification as appropriate.

Embodiment 9

In this embodiment, structures of a data processing device of one embodiment of the present invention will be described with reference to FIG. 21 to FIG. 23.

Figure 21A:
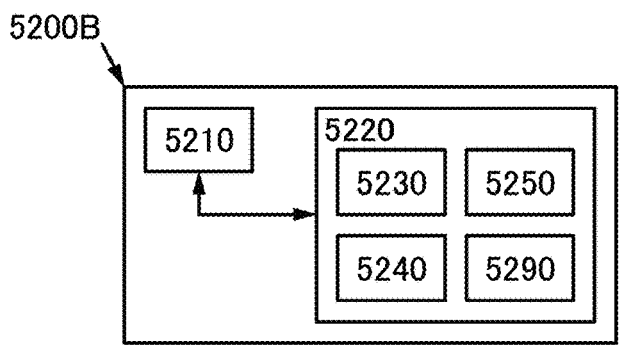
FIG. 21A to FIG. 21E are diagrams illustrating structures of a data processing device of an embodiment.
Figure 21B:
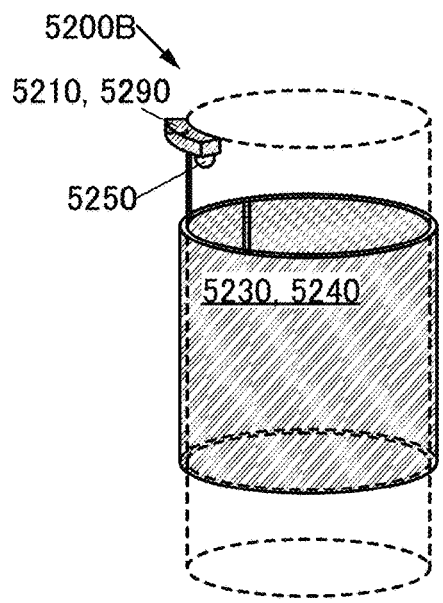
Figure 21C:
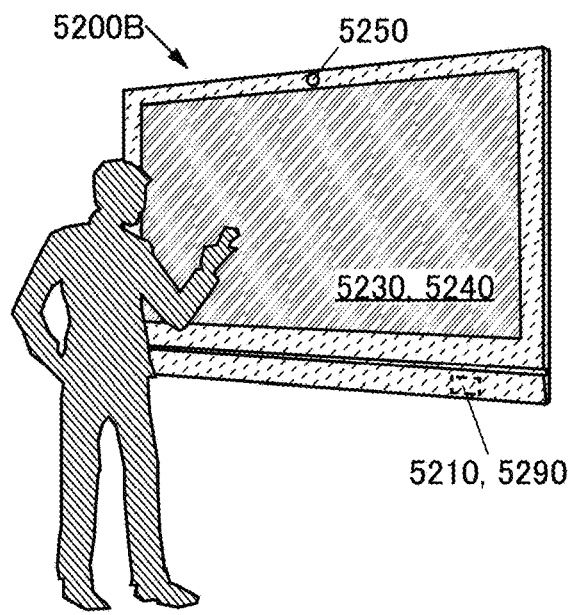
Figure 21D:
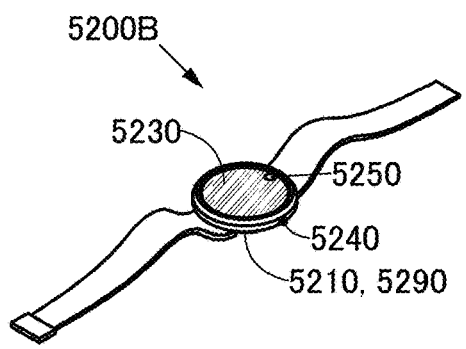
Figure 21E:
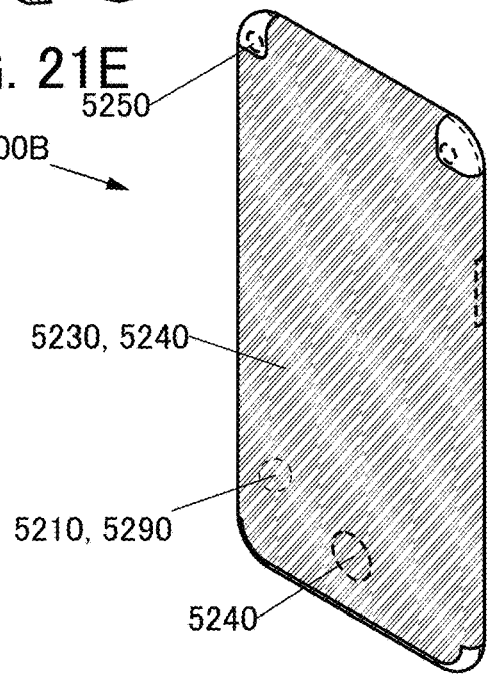
Figure 22A:
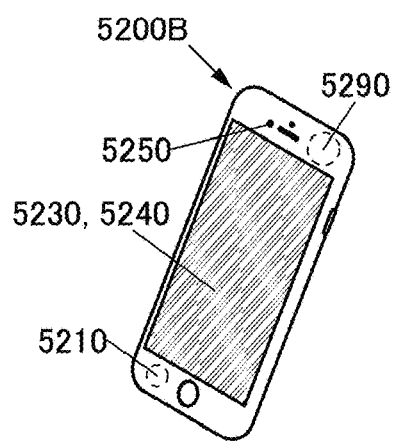
FIG. 22A to FIG. 22E are diagrams illustrating structures of a data processing device of an embodiment.
Figure 22B:
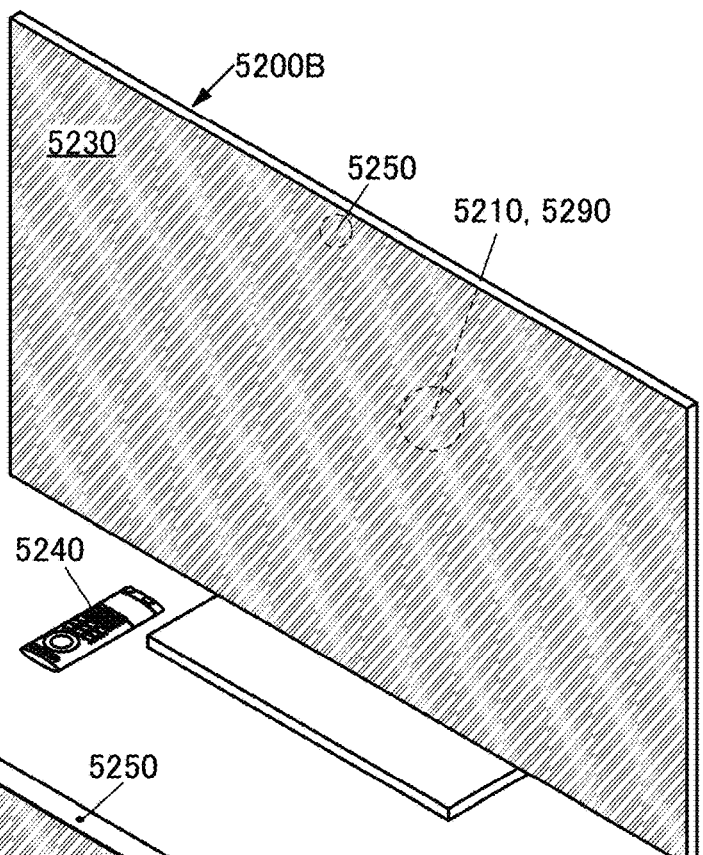
Figure 22C:
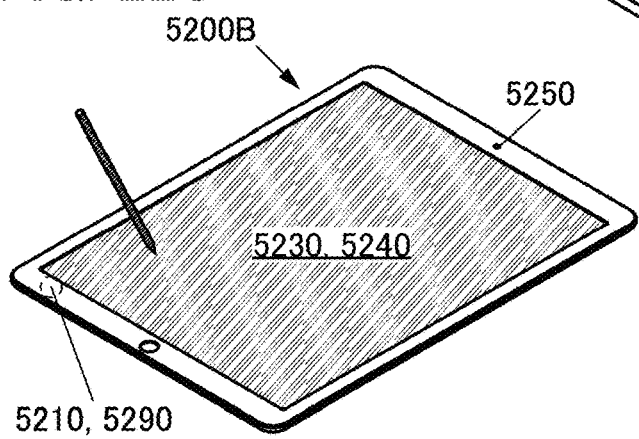
Figure 22D:
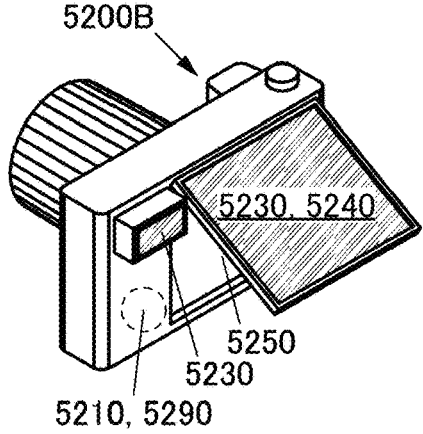
Figure 22E:
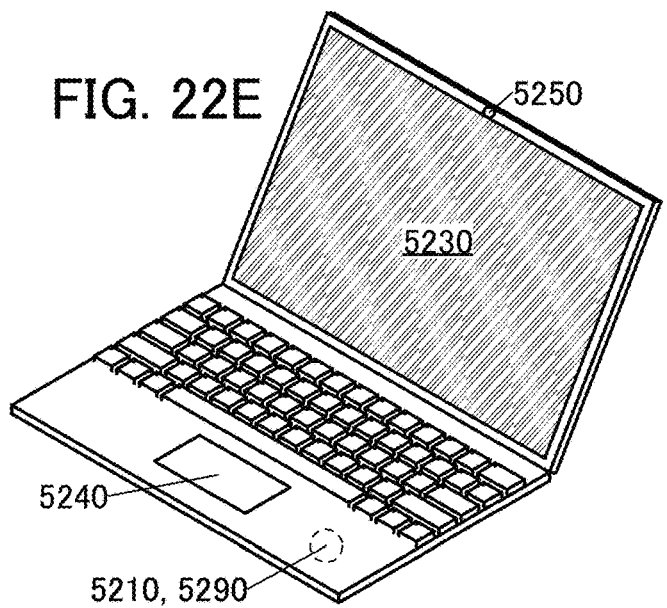
Figure 23A:
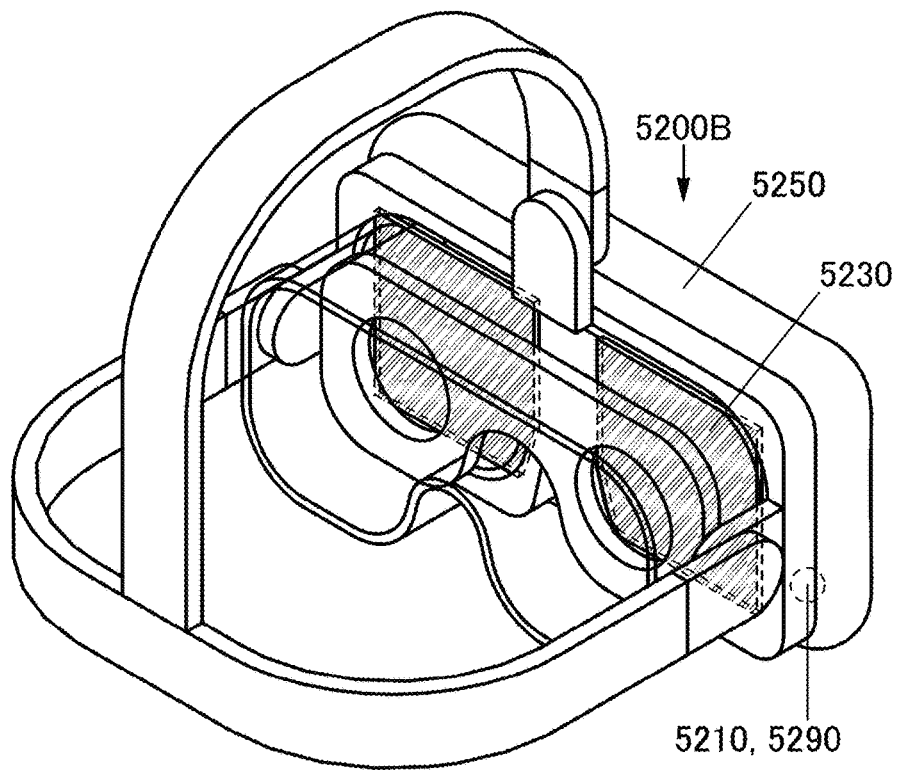
FIG. 23A and FIG. 23B are diagrams illustrating structures of a data processing device of an embodiment.
Figure 23B:
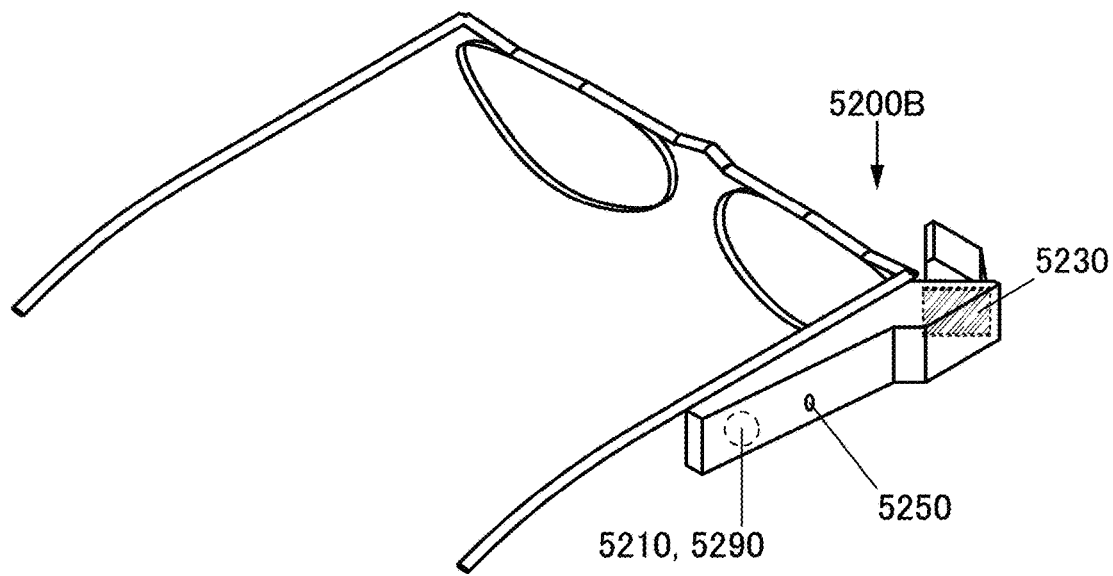

FIG. 21 to FIG. 23 are diagrams illustrating structures of the data processing device of one embodiment of the present invention. FIG. 21A is a block diagram of the data processing device, and FIG. 21B to FIG. 21E are perspective views illustrating structures of the data processing device. FIG. 22A to FIG. 22E are perspective views illustrating structures of the data processing device. FIG. 23A and FIG. 23B are perspective views illustrating structures of the data processing device.

<Data Processing Device>

A data processing device 5200B described in this embodiment includes an arithmetic device 5210 and an input/output device 5220 (see FIG. 21A).

The arithmetic device 5210 has a function of being supplied with operation data and has a function of supplying image data on the basis of the operation data.

The input/output device 5220 includes a display portion 5230, an input portion 5240, a sensing portion 5250, and a communication portion 5290 and has a function of supplying operation data and a function of being supplied with image data. The input/output device 5220 also has a function of supplying sensing data, a function of supplying communication data, and a function of being supplied with communication data.

The input portion 5240 has a function of supplying operation data. For example, the input portion 5240 supplies operation data on the basis of operation by a user of the data processing device 5200B.

Specifically, a keyboard, a hardware button, a pointing device, a touch sensor, an illuminance sensor, an imaging device, an audio input device, an eye-gaze input device, an attitude detection device, or the like can be used as the input portion 5240.

The display portion 5230 includes a functional panel and has a function of displaying image data. For example, the functional panel described in any one of Embodiment 1 to Embodiment 5 can be used for the display portion 5230.

The sensing portion 5250 has a function of supplying sensing data. For example, the sensing portion 5250 has a function of sensing a surrounding environment where the data processing device is used and supplying sensing data.

Specifically, an illuminance sensor, an imaging device, an attitude detection device, a pressure sensor, a human motion sensor, or the like can be used as the sensing portion 5250.

The communication portion 5290 has a function of being supplied with communication data and a function of supplying communication data. For example, the communication portion 5290 has a function of being connected to another electronic device or a communication network through wireless communication or wired communication. Specifically, the communication portion 5290 has a function of wireless local area network communication, telephone communication, near field communication, or the like.

<<Structure Example 1 of Data Processing Device>>

For example, the display portion 5230 can have an outer shape along a cylindrical column or the like (see FIG. 21B). In addition, the data processing device has a function of changing its display method in accordance with the illuminance of a usage environment. Furthermore, the data processing device has a function of changing displayed content in response to sensed existence of a person. This allows the data processing device to be provided on a column of a building, for example. The data processing device can display advertising, guidance, or the like. The data processing device can be used for digital signage or the like.

<<Structure Example 2 of Data Processing Device>>

For example, the data processing device has a function of generating image data on the basis of the path of a pointer used by a user (see FIG. 21C). Specifically, the functional panel with a diagonal size of 20 inches or longer, preferably 40 inches or longer, and further preferably 55 inches or longer can be used. Alternatively, a plurality of functional panels can be arranged and used as one display region. Alternatively, a plurality of functional panels can be arranged and used as a multiscreen. Thus, the data processing device can be used for an electronic blackboard, an electronic bulletin board, digital signage, or the like.

<<Structure Example 3 of Data Processing Device>>

The data processing device can receive data from another device and display the data on the display portion 5230 (see FIG. 21D). Several options can be displayed. The user can choose some from the options and send a reply to a transmitter of the data. For example, the data processing device has a function of changing its display method in accordance with the illuminance of a usage environment. Thus, the power consumption of a smartwatch can be reduced, for example. A smartwatch can display an image to be suitably used even in an environment under strong external light, e.g., outdoors in fine weather, for example.

<<Structure Example 4 of Data Processing Device>>

For example, the display portion 5230 has a surface gently curved along a side surface of a housing (see FIG. 21E). The display portion 5230 includes a functional panel, and the functional panel has a function of performing display on the front surface, the side surfaces, the top surface, and the rear surface, for example. Thus, for example, a mobile phone can display data not only on its front surface but also on its side surfaces, its top surface, and its rear surface.

<<Structure Example 5 of Data Processing Device>>

For example, the data processing device can receive data via the Internet and display the data on the display portion 5230 (see FIG. 22A). A created message can be checked on the display portion 5230. The created message can be sent to another device. The data processing device has a function of changing its display method in accordance with the illuminance of a usage environment, for example. Thus, the power consumption of a smartphone can be reduced. A smartphone can display an image to be suitably used even in an environment under strong external light, e.g., outdoors in fine weather, for example.

<<Structure Example 6 of Data Processing Device>>

A remote controller can be used as the input portion 5240 (see FIG. 22B). For example, the data processing device can receive data from a broadcast station or via the Internet and display the data on the display portion 5230. An image of a user can be taken using the sensing portion 5250. The image of the user can be transmitted. The data processing device can acquire a viewing history of the user and provide it to a cloud service. The data processing device can acquire recommendation data from a cloud service and display the data on the display portion 5230. A program or a moving image can be displayed on the basis of the recommendation data. The data processing device has a function of changing its display method in accordance with the illuminance of a usage environment, for example. Accordingly, for example, a television system can display an image to be suitably used even when irradiated with strong external light that enters a room in fine weather.

<<Structure Example 7 of Data Processing Device>>

For example, the data processing device can receive educational materials via the Internet and display them on the display portion 5230 (see FIG. 22C). An assignment can be input with the input portion 5240 and sent via the Internet. A corrected assignment or the evaluation of the assignment can be obtained from a cloud service and displayed on the display portion 5230. Suitable educational materials can be selected on the basis of the evaluation and displayed.

For example, the display portion 5230 can perform display using an image signal received from another data processing device. When the data processing device is placed on a stand or the like, the display portion 5230 can be used as a sub-display. Thus, for example, a tablet computer can display an image to be suitably used even in an environment under strong external light, e.g., outdoors in fine weather.

<<Structure Example 8 of Data Processing Device>>

The data processing device includes, for example, a plurality of display portions 5230 (see FIG. 22D). For example, the display portion 5230 can display an image that the sensing portion 5250 is capturing. A captured image can be displayed on the sensing portion. A captured image can be decorated using the input portion 5240. A message can be attached to a captured image. A captured image can be transmitted via the Internet. The data processing device has a function of changing its shooting conditions in accordance with the illuminance of a usage environment. Accordingly, for example, a digital camera can display an object in such a manner that an image is favorably viewed even in an environment under strong external light, e.g., outdoors in fine weather.

<<Structure Example 9 of Data Processing Device>>

For example, the data processing device of this embodiment is used as a master and another data processing device is used as a slave, whereby the other data processing device can be controlled (see FIG. 22E). As another example, part of image data can be displayed on the display portion 5230 and another part of the image data can be displayed on a display portion of another data processing device. Image signals can be supplied. With the communication portion 5290, data to be written can be obtained from an input portion of another data processing device. Thus, a large display region can be utilized by using a portable personal computer, for example.

<<Structure Example 10 of Data Processing Device>>

The data processing device includes, for example, the sensing portion 5250 that senses an acceleration or a direction (see FIG. 23A). The sensing portion 5250 can supply data on the position of the user or the direction in which the user faces. The data processing device can generate image data for the right eye and image data for the left eye in accordance with the position of the user or the direction in which the user faces. The display portion 5230 includes a display region for the right eye and a display region for the left eye. Thus, a virtual reality image that gives the user a sense of immersion can be displayed on a goggles-type data processing device, for example.

<<Structure Example 11 of Data Processing Device>>

The data processing device includes, for example, an imaging device and the sensing portion 5250 that senses an acceleration or a direction (see FIG. 23B). The sensing portion 5250 can supply data on the position of the user or the direction in which the user faces. The data processing device can generate image data in accordance with the position of the user or the direction in which the user faces. Accordingly, the data can be shown together with a real-world scene, for example. An augmented reality image can be displayed on a glasses-type data processing device.

Note that this embodiment can be combined with any of the other embodiments in this specification as appropriate.

Embodiment 10

In this embodiment, structures of the functional panel of one embodiment of the present invention will be described with reference to FIG. 24 to FIG. 26.

Figure 24:
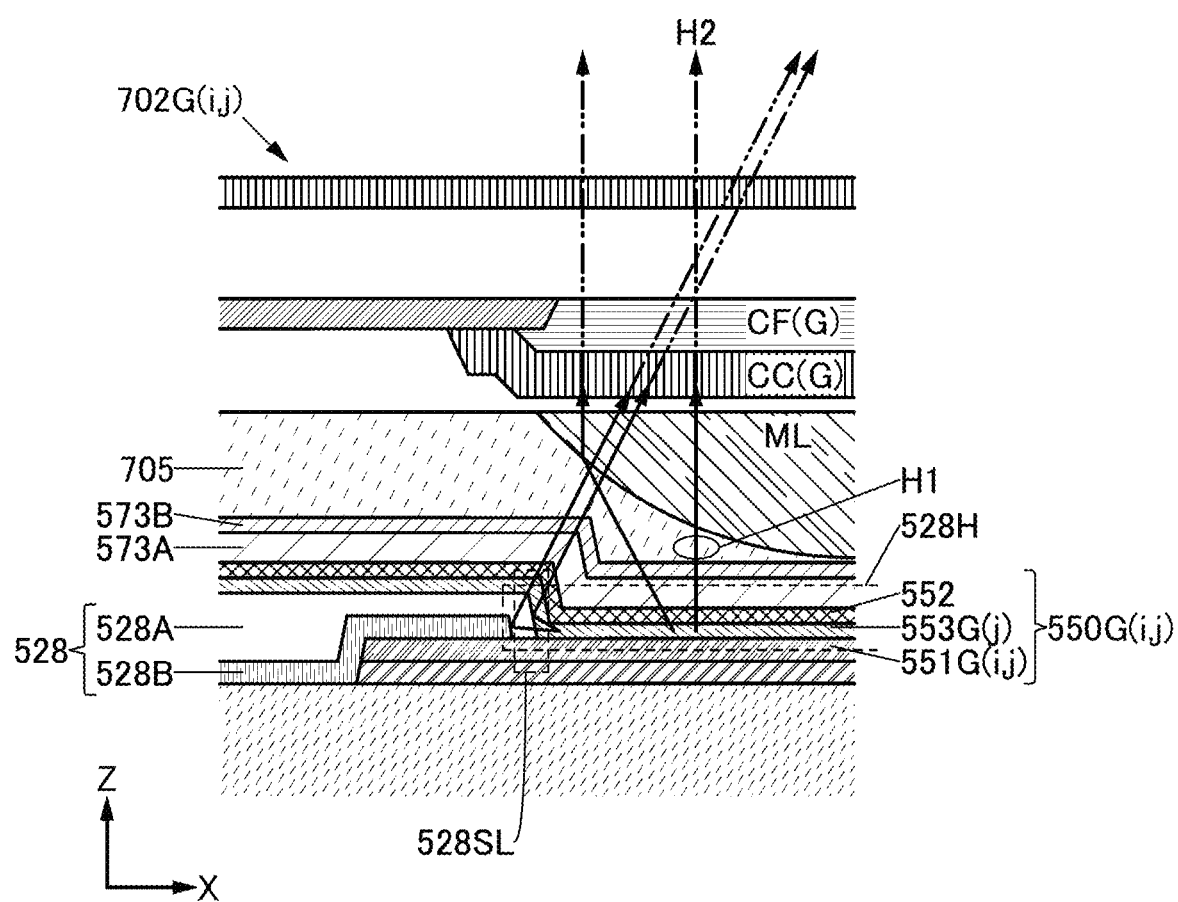
FIG. 24 is a diagram illustrating a structure of a functional panel of an embodiment.

FIG. 24 is a diagram illustrating a structure of the functional panel of one embodiment of the present invention. FIG. 24 is a cross-sectional view illustrating part of the pixel 702G(i, j) in the functional panel of one embodiment of the present invention.

Figure 25A:
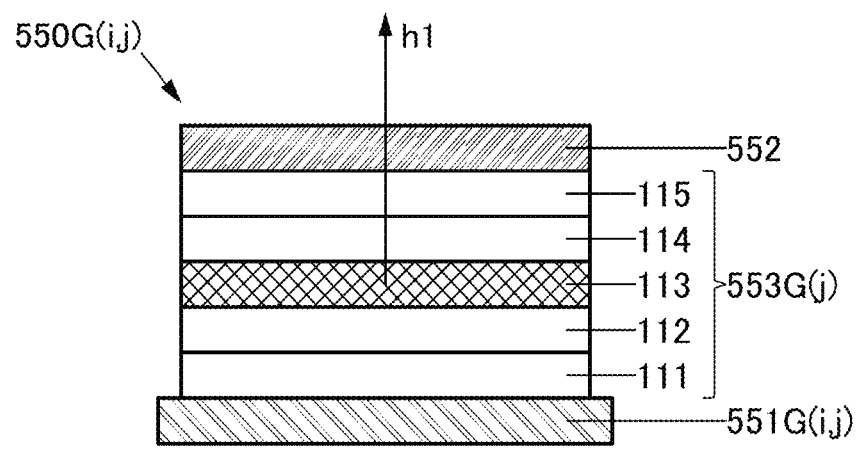
FIG. 25A and FIG. 25B are diagrams illustrating structures of a light-emitting element in a functional panel of an embodiment.
Figure 25B:
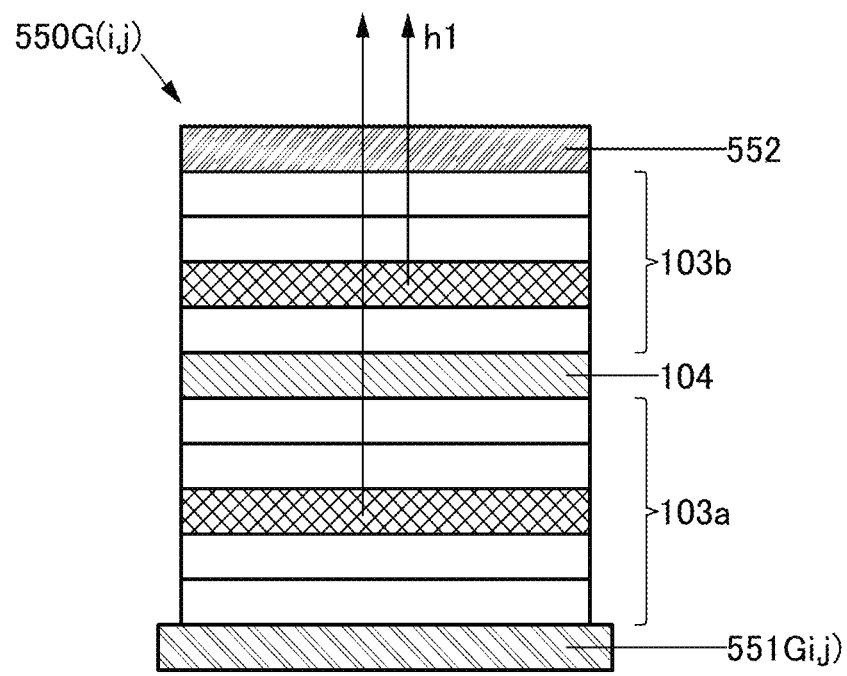

FIG. 25 is a diagram illustrating a structure of the functional panel of one embodiment of the present invention. FIG. 25A and FIG. 25B are cross-sectional views each illustrating a structure of the light-emitting device 550G(i, j).

Figure 26A:
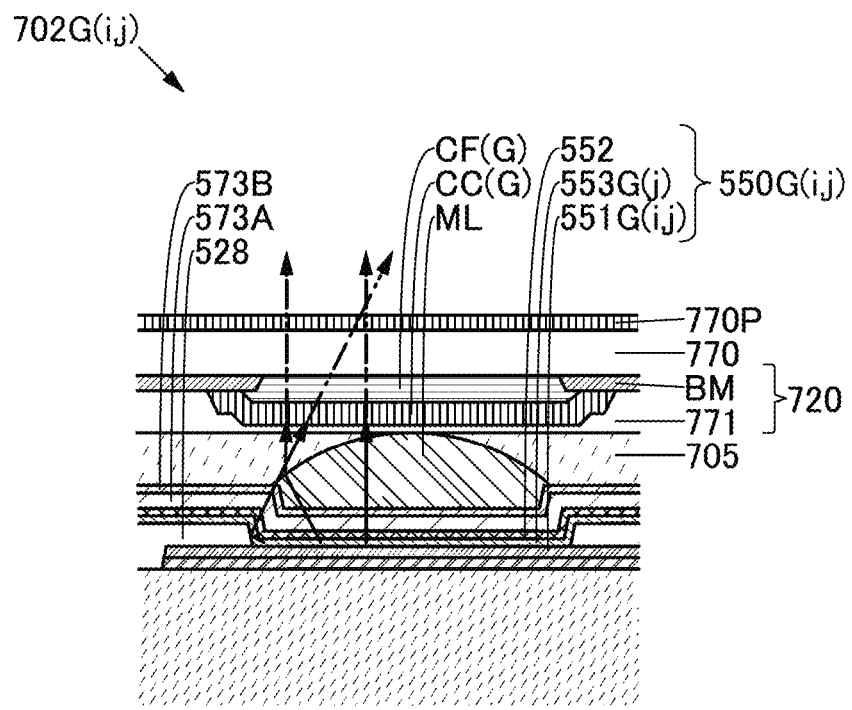
FIG. 26A and FIG. 26B are diagrams illustrating structures of a functional panel of an embodiment.
Figure 26B:
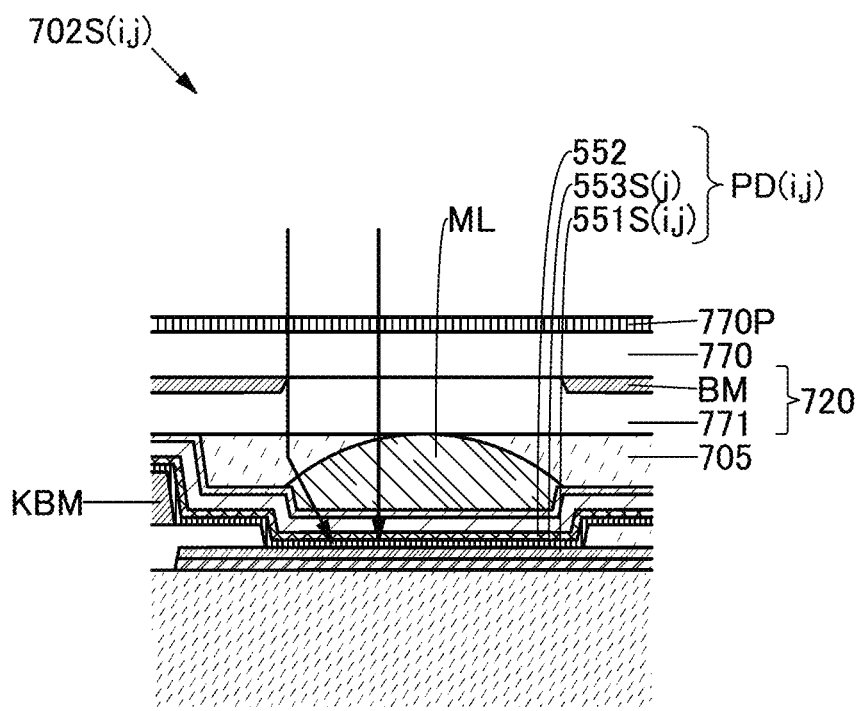

FIG. 26 is a diagram illustrating a structure of the functional panel of one embodiment of the present invention. FIG. 26A is a cross-sectional view illustrating a structure of the pixel 702G(i, j) that is different from the structure in FIG. 24; and FIG. 26B is a cross-sectional view illustrating a structure of the pixel 702S(i, j) in the functional panel of one embodiment of the present invention.

<Structure Example 1 of Functional Panel 700>

The functional panel described in this embodiment includes the pixel 702G(i, j).

<<Structure Example 1 of Pixel 702G(i, j)>>

The pixel 702G(i, j) includes the microlens ML, the light-emitting device 550G(i, j), and the color conversion layer CC(G) (see FIG. 24). Note that in this specification, a light-emitting element can be referred to as a light-emitting device, and a photoelectric conversion element can be referred to as a photoelectric conversion device.

The light-emitting device 550G(i, j) emits the light H1.

<<Structure Example 1 of Microlens ML>>

The microlens ML is interposed between the light-emitting device 550G(i, j) and the color conversion layer CC(G) and converges the light H1 on the color conversion layer CC(G). The microlens ML can have the convex portion facing the light-emitting device 550G(i, j), for example. In the case where the sealant 705, for example, is provided between the microlens ML and the light-emitting device 550G(i, j), the microlens ML has a refractive index different from that of the sealant 705. Specifically, a material having a higher refractive index than the sealant 705 can be used for the microlens.

<<Structure Example 1 of Color Conversion Layer CC(G)>>

The color conversion layer CC(G) converts the light H1 into light H2. the intensity of long-wavelength light in a spectrum of the light H2 is higher than that in a spectrum of the first light H1.

Accordingly, the first light H1 emitted from the light-emitting device 550G(i, j) can be converged on the color conversion layer CC(G). The first light H1 emitted from the light-emitting device 550G(i, j) can be converged and then converted into the second light H2. The first light H1 emitted from the light-emitting device 550G(i, j) can be efficiently converged because of its higher directivity than that of light emitted through the color conversion layer CC(G). The first light H1 emitted from the light-emitting device 550G(i, j) can be used more efficiently than in the case of converging light emitted through the color conversion layer CC(G). Thus, a novel functional panel that is highly convenient, useful, or reliable can be provided.

<<Structure Example 2 of Microlens ML>>

The microlens ML can have the convex portion facing the color conversion layer CC(G), for example (see FIG. 26A).

<Structure Example 2 of Functional Panel 700>

The functional panel described in this embodiment includes an insulating film 528.

<<Insulating Film 528>>

The insulating film 528 has an opening portion 528H, and the opening portion 528H overlaps with the light-emitting device 550G(i, j) (see FIG. 24). Note that the insulating film 528 has a function of separating a plurality of adjacent pixels and thus can be referred to as a bank.

The opening portion 528H has an inclined surface 528SL on its side wall, and the inclined surface 528SL reflects the light H1 toward the microlens ML. A material having high reflectance with respect to the light H1 can be used for the insulating film 528. For example, a film 528A and a film 528B can be used as the insulating film 528. Specifically, a metal film having high reflectivity can be used as the film 528B, and an end portion of the film 528B can be covered with the film 528A having an insulating property (see FIG. 24). In the case where the sealant 705 is provided, for example, the film 528A has a refractive index different from that of the sealant 705. Specifically, a material having a higher refractive index than the sealant 705 can be used for the microlens.

Accordingly, the light H1 emitted from the light-emitting device 550G(i, j) can be condensed on the microlens ML. The light H1 emitted from the light-emitting device 550G(i, j) can be used efficiently. Thus, a novel functional panel that is highly convenient, useful, or reliable can be provided.

<<Structure Example 2 of Color Conversion Layer CC(G)>>

The color conversion layer CC(G) includes quantum dots and a light-transmitting resin. For example, the quantum dots can be covered with a film that has a light-transmitting property and is less likely to generate or transmit a gas. Alternatively, a resin polymerized with quantum dots can be used. Alternatively, a photosensitive polymer that covers quantum dots can be used. With the use of a photosensitive polymer, a fine color conversion layer CC(G) can be formed.

Thus, the spectral width of the light H2 can be narrowed. Light with a narrow half width of a spectrum can be used. A color with high saturation can be displayed. Aggregation of quantum dots can be prevented. Thus, a novel functional panel that is highly convenient, useful, or reliable can be provided.

<Structure Example 3 of Functional Panel 700>

The functional panel of one embodiment of the present invention includes a light-blocking layer BM. In addition, a coloring layer CF(G) is included.

<<Light-Blocking Layer BM>>

The light-blocking layer BM has an opening portion, and the opening portion overlaps with the light-emitting device 550G(i, j).

<<Coloring Layer CF(G)>>

The transmittance of the coloring layer CF(G) with respect to the light H1 is lower than the transmittance with respect to the light H2.

Accordingly, the amount of external light that reaches the color conversion layer CC(G) can be reduced. Unintentional conversion of external light by the color conversion layer CC(G) can be inhibited. A reduction in contrast due to external light can be inhibited. The display quality can be improved. Thus, a novel functional panel that is highly convenient, useful, or reliable can be provided.

<<Structure Example 3 of Light-Emitting Device 550G(i, j)>>

The light-emitting device 550G(i, j) includes a layer 111, a layer 112, a layer 113, and a layer 114 (see FIG. 25A). The layer 111, the layer 112, the layer 113, and the layer 114 can be formed by a variety of known deposition methods. For example, a vacuum evaporation method or a printing method can be used. Specifically, a resistive heating vacuum evaporation method, an ink-jet method, or the like can be used.

The layer 113 is interposed between the layer 112 and the layer 114. The layer 112 is interposed between the layer 111 and the layer 113.

The layer 111 contains a material HT1 and a material AM.

The layer 112 contains a material HT2.

The layer 113 contains a light-emitting material EM and a material HOST.

The layer 114 contains a material ET and a material OMC.

[Material HT1]

The material HT1 has a HOMO level higher than or equal to −5.7 eV and lower than or equal to −5.4 eV. For example, a hole-transport material that has a hole-transport property is preferable, and a material having any of a carbazole skeleton, a dibenzofuran skeleton, a dibenzothiophene skeleton, and an anthracene skeleton can be used as the material HT. Alternatively, aromatic amine having a substituent that includes a dibenzofuran ring or a dibenzothiophene ring, aromatic monoamine that includes a naphthalene ring, or aromatic monoamine in which a 9-fluorenyl group is bonded to nitrogen of amine through an arylene group can be used as the material HT. Thus, holes are easily injected into the layer 112.

Specific examples of a compound that can be used as the material HT1 include N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβPNB), 4-[4-(2-naphthyl)phenyl]-4',4"-diphenyltriphenylamine (abbreviation: BBAβNBi), 4,4'-diphenyl-4"-(6; 1'-binaphthyl-2-yl)triphenylamine (abbreviation: BBAαNβNB), 4,4'-diphenyl-4"-(7; 1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4,4'-diphenyl-4"-(6; 2'-binaphthyl-2-yl)triphenylamine (abbreviation: BBA(βN2)B), 4,4'-diphenyl-4"-(7; 2'-binaphthyl-2-yl)triphenylamine (abbreviation: BBA(βN2)B-03), 4,4'-diphenyl-4"-(4; 2'-binaphthyl-1-yl)triphenylamine (abbreviation: BBAβNαNB), 4,4'-diphenyl-4"-(5; 2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBi1BP-02), 4-diphenyl-4'-(2-naphthyl)-4"-{9-(4-biphenylyl)carbazole)}triphenylamine (abbreviation: YGTBiβNB), N-[4-(9-phenyl-9H-carbazol-3-yl)phenyl]-N-[4-(1-naphthyl)phenyl]-9,9'-spirobi(9H-fluoren)-2-amine (abbreviation: PCBNBSF), N,N-bis(4-biphenylyl)-9,9'-spirobi[9H-fluoren]-2-amine (abbreviation: BBASF), N,N-bis(1,1'-biphenyl-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi(9H-fluoren)-4-amine (abbreviation: oFBiSF), N-(4-biphenyl)-N-(dibenzofuran-4-yl)-9,9-dimethyl-9H-fluoren-2-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]spiro-9,9'-bifluoren-2-amine (abbreviation: PCBASF), and N-(1,1'-biphenyl-4-yl)-9,9-dimethyl-N-[4-(9-phenyl-9H-carbazol-3-yl)phenyl]-9H-fluoren-2-amine (abbreviation: PCBBiF).

[Material AM]

The material AM has an acceptor property. For example, an organic compound or the like that includes an electron-withdrawing group (in particular, a halogen group such as a fluoro group, or a cyano group) is used as the material AM, and a substance that exhibits an electron-accepting property with respect to the material HT1 is selected as appropriate. Examples of such organic compounds include 7,7,8,8-tetracyano-2,3,5,6-tetrafluoroquinodimethane (abbreviation: F4-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), and 2-(7-dicyanomethylen-1,3,4,5,6,8,9,10-octafluoro-7H-pyren-2-ylidene)malononitrile. A compound in which electron-withdrawing groups are bonded to a condensed aromatic ring having a plurality of heteroatoms, such as HAT-CN, is particularly preferable because it is thermally stable. A [3]radialene derivative having an electron-withdrawing group (in particular, a halogen group such as a fluoro group, or a cyano group) has a very high electron-accepting property and thus is preferable. Specific examples include α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile].

[Material HT2]

The material HT2 has a lower HOMO level than the material HT1. For example, a material selected appropriately from the above compounds shown as the examples of the compound that can be used as the material HT1 can be used as HT2.

[Material HOST]

The material HOST has a lower HOMO level than the material HT2.

For example, a variety of carrier-transport materials such as an electron-transport material, a hole-transport material, and the TADF material can be used as the material HOST. As specific examples of the hole-transport material, the electron-transport material, and the like, one or more kinds of materials appropriately selected from the materials described in this specification or known materials can be used.

[Light-Emitting Material EM]

For example, a substance exhibiting fluorescence (fluorescent substance), a substance exhibiting phosphorescence (phosphorescent substance), a thermally activated delayed fluorescence (TADF) material exhibiting thermally activated delayed fluorescence, or other light-emitting substances can be used as the light-emitting material EM.

[Material ET]

The material ET has a HOMO level higher than or equal to −6 eV. Moreover, the material ET has an electron mobility higher than or equal to $1 \times 10^{-7}$ cm$^2$/Vs and lower than or equal to $5 \times 10^{-5}$ cm$^2$/Vs when the square root of the electric field strength [V/cm] is 600. Thus, the use of the material ET for the layer 114 changes the carrier balance in the light-emitting device 550G(i, j), whereby recombination in the layer 114 is less likely to occur. Controlling the carrier balance in the layer 114 cancels out a drastic luminance reduction caused in an initial stage of driving of a light-emitting device, that is, initial decay; thus, a long-life light-emitting device can be provided. Note that in this specification and the like, the structure of the light-emitting element including the above material ET is referred to as a Recombination-Site Tailoring Injection structure (ReSTI structure) in some cases.

For example, a compound having an anthracene skeleton can be used as the material ET, and it is further preferable that an anthracene skeleton and a heterocyclic skeleton be contained. The heterocyclic skeleton is preferably a nitrogen-containing five-membered ring skeleton. The nitrogen-containing five-membered ring skeleton particularly preferably includes two heteroatoms in a ring, like a pyrazole ring, an imidazole ring, an oxazole ring, or, a thiazole ring.

[Material OMC]

The material OMC is an organic complex of alkali metal or an organic complex of alkaline earth metal. For example, an organic complex of lithium is preferable, and 8-quinolinato-lithium (abbreviation: Liq) is particularly preferable.

Note that an anion may be generated in a layer that is on the layer 114 side than the layer 113. Alternatively, the light-emitting device 550G(i, j) may be degraded by an anion after the start of use. Alternatively, the luminance of the light-emitting device 550G(i, j) may be decreased.

Thus, a decrease in display quality that would occur after the start of use can be inhibited. A decrease in color reproducibility that would occur after the start of use can be inhibited. A decrease in luminance that would occur after the start of use can be inhibited. Entry of impurities that would degrade characteristics can be inhibited. A bright color can be displayed. High productivity is achieved. As a result, a novel functional panel that is highly convenient, useful, or reliable can be provided.

<<Structure Example 4 of Light-Emitting Device 550G(i, j)>>

The light-emitting device 550G(i, j) includes a light-emitting unit 103a, a light-emitting unit 103b, and an intermediate layer 104 (see FIG. 25B).

The intermediate layer 104 includes a region sandwiched between the light-emitting unit 103a and the light-emitting unit 103b. The intermediate layer 104 supplies holes to one of the light-emitting unit 103a and the light-emitting unit 103b and supplies electrons to the other thereof. The light-emitting unit 103a and the light-emitting unit 103b may have identical structures or different structures. Note that the term "different structures" means, for example, that the light-emitting unit 103a contains a fluorescent substance and the light-emitting unit 103b contains a phosphorescent substance. The term "identical structures" means, for example, that the light-emitting unit 103a and the light-emitting unit 103b each contain a fluorescent substance. Light emitted from the light-emitting unit 103a and light emitted from the light-emitting unit 103b may have the same color or different colors. For example, when the light-emitting unit 103a and the light-emitting unit 103b have a function of emitting blue light, a light-emitting element that can be driven at low voltage and has low power consumption can be achieved. Note that the light-emitting device 550G(i, j) having the structure shown in FIG. 25B may be referred to as a stacked element or a tandem element.

Accordingly, light emission efficiency can be increased. Power consumption can be reduced. As a result, a novel functional panel that is highly convenient, useful, or reliable can be provided.

Note that this embodiment can be combined with any of the other embodiments in this specification as appropriate.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relationship, for example, a connection relationship shown in drawings or texts, a connection relationship other than one shown in drawings or texts is regarded as being disclosed in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y (e.g., a switch, a transistor, a capacitor, an inductor, a resistor, a diode, a display element, a light-emitting element, and a load) provided therebetween.

For example, in the case where X and Y are electrically connected, one or more elements that allow an electrical connection between X and Y (e.g., a switch, a transistor, a capacitor, an inductor, a resistor, a diode, a display element, a light-emitting element, and a load) can be connected between X and Y. Note that a switch has a function of being controlled to be turned on or off. That is, a switch has a function of being in a conduction state (on state) or a non-conduction state (off state) to control whether or not current flows. Alternatively, the switch has a function of selecting and changing a current path. Note that the case where X and Y are electrically connected includes the case where X and Y are directly connected.

An example of the case where X and Y are functionally connected is the case where one or more circuits that allow functional connection between X and Y (for example, a logic circuit (an inverter, a NAND circuit, a NOR circuit, or the like), a signal converter circuit (a DA converter circuit, an AD converter circuit, a gamma correction circuit, or the like), a potential level converter circuit (a power supply circuit (for example, a step-up circuit, a step-down circuit, or the like), a level shifter circuit for changing the potential level of a signal, or the like), a voltage source, a current source, a switching circuit, an amplifier circuit (a circuit capable of increasing signal amplitude, the amount of current, or the like, an operational amplifier, a differential amplifier circuit, a source follower circuit, a buffer circuit, or the like), a signal generator circuit, a memory circuit, a control circuit, or the like) can be connected between X and Y. For example, even when another circuit is interposed between X and Y, X and Y are functionally connected when a signal output from X is transmitted to Y. Note that the case where X and Y are functionally connected includes the case where X and Y are directly connected and the case where X and Y are electrically connected.

Note that in the case where there is an explicit description, X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are disclosed in this specification and the like. That is, in the case where there is an explicit description, being electrically connected, the same contents as the case where there is only an explicit description, being connected, are disclosed in this specification and the like.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y can be expressed as follows.

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, the expression "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order" can be used. Alternatively, the expression "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order" can be used. When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path through the transistor and between the source (or the first terminal or the like) of the transistor and a drain (or a second terminal or the like) of the transistor, the first connection path is a path through Z1, the drain (or the second terminal or the like) of the transistor is electrically connected to Y through at least a third connection path, the third connection path does not include the second connection path, and the third connection path is a path through Z2" and "a source (or a first terminal or the like) of a transistor is electrically connected to X through Z1 by at least a first connection path, the first connection path does not include a second connection path, the second connection path includes a connection path through the transistor, a drain (or a second terminal or the like) of the transistor is electrically connected to Y through Z2 by at least a third connection path, and the third connection path does not include the second connection path". Alternatively, the expression "a source (or a first terminal or the like) of a transistor is electrically connected to X by at least a first electrical path through Z1, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y by at least a third electrical path through Z2, the third electrical path does not include a fourth electrical path, and the fourth electrical path is an electrical path from the drain (or the second terminal or the like) of the transistor to the source (or the first terminal or the like) of the transistor" can be used. When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and the expression is not limited to these expressions. Here, X, Y, Z1, and Z2 denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, "electrical connection" in this specification includes in its category such a case where one conductive film has functions of a plurality of components.

REFERENCE NUMERALS

ANO: conductive film, C21: capacitor, C31: capacitor, CI: control data, CL: conductive film, CP: conductive material, DS: sensing data, FD: node, G1: conductive film, G2: conductive film, GCLK: signal, II: input data, IN: terminal, MD: transistor, M21: transistor, M31: transistor, M32: transistor, N21: node, OUT: terminal, P1: position data, PD(i, j): photoelectric conversion device, PWC1: signal, PWC2: signal, RS: conductive film, S1g: conductive film, S2g: conductive film, SE: conductive film, SH: region, SW1: switch, SW21: switch, SW22: switch, SW31: switch, SW32: switch, SW33: switch, TX: conductive film, VCOM2: conductive film, VCP: conductive film, VI: image data, VIV: conductive film, VLEN: conductive film, VPD: conductive film, VPI: conductive film, VR: conductive film, WX: conductive film, FPC1: flexible printed circuit, 200: data processing device, 210: arithmetic device, 211: arithmetic portion, 212: memory portion, 213: artificial intelligence portion, 214: transmission path, 215: input/output interface, 220: input/output device, 230: display portion, 231: region, 233: control circuit, 234: decompression circuit, 235: image processing circuit, 238: control portion, 240: input portion, 241: sensing region, 248: control portion, 250: sensing portion, 290: communication portion, 501C: insulating film, 501D: insulating film, 504: conductive film, 506: insulating film, 508: semiconductor film, 508A: region, 508B: region, 508C: region, 510: base material, 512A: conductive film, 512B: conductive film, 516: insulating film, 518: insulating film, 519B: terminal, 520: functional layer, 521: insulating film, 524: conductive film, 528: insulating film, 528H: opening portion, 530G: pixel circuit, 530S: pixel circuit, 550G: light-emitting device, 551G: electrode, 551S: electrode, 552: electrode, 553G: layer containing light-emitting material, 553S: layer containing photoelectric conversion material, 573: insulating film, 573A: insulating film, 573B: insulating film, 591G: opening portion, 591S: opening portion, 700: functional panel, 700TP: input/output panel, 702B: pixel, 702G: pixel, 702R: pixel, 702S: pixel, 703: pixel, 705: sealant, 720: functional layer, 770: base material, 770P: functional film, 771: insulating film, 802: sensor, 5200B: data processing device, 5210: arithmetic device, 5220: input/output device, 5230: display portion, 5240: input portion, 5250: sensing portion, 5290: communication portion

The invention claimed is:

1. A display device comprising a panel, the panel comprising:
a pixel, the pixel comprising:
a light-emitting element;
a microlens; and
a color conversion layer,
wherein the light-emitting element comprises:
a first electrode;
a layer containing a light-emitting material over the first electrode; and
a second electrode over the layer containing a light-emitting material,
wherein the microlens is interposed between the light-emitting element and the color conversion layer,
wherein the microlens has a convex portion,
wherein the light-emitting element is configured to emit a first light,
wherein the color conversion layer is configured to convert the first light into a second light,
wherein an insulating film is provided over the first electrode,
wherein the insulating film comprises an opening portion overlapping with the light-emitting element,
wherein the opening portion has an inclined surface on a first side wall,
wherein the inclined surface is configured to reflect the first light toward the microlens,
wherein the convex portion of the microlens is covered by a sealant, and
wherein the microlens has an inclined side surface which is not covered by the sealant.

2. The display device according to claim 1, wherein the insulating film is configured to function as a bank.

3. The display device according to claim 1, wherein the panel further comprises a sealant between the light-emitting element and the color conversion layer.

4. The display device according to claim 1, wherein the color conversion layer comprises a quantum dot and a light-transmitting resin.

5. The display device according to claim 1, wherein the insulating film comprises a metal film and a film having an insulating property.

6. The display device according to claim 1, wherein the microlens and the color conversion layer are spaced apart from each other.

7. The display device according to claim 1, wherein the layer containing a light-emitting material is in contact with the inclined surface of the opening portion and a top surface of the insulating film.

8. A display device comprising a panel, the panel comprising:
a pixel, the pixel comprising:
a light-emitting element;
a microlens; and
a color conversion layer,
wherein the light-emitting element comprises:
a first electrode;
a layer containing a light-emitting material over the first electrode; and
a second electrode over the layer containing a light-emitting material,
wherein the microlens is interposed between the light-emitting element and the color conversion layer,
wherein the microlens has a convex portion facing the color conversion layer,
wherein the light-emitting element is configured to emit a first light,
wherein the color conversion layer is configured to convert the first light into a second light,
wherein an insulating film is provided over the first electrode,
wherein the insulating film comprises an opening portion overlapping with the light-emitting element,
wherein the opening portion has an inclined surface on a first side wall,
wherein the inclined surface is configured to reflect the first light toward the microlens,
wherein the color conversion layer is in contact with a bottom surface of a light-blocking film, and
wherein a distance from an edge of the convex portion of the microlens to a bottom surface of the color conversion layer is longer than a distance from a bottom surface of the microlens to a top surface of the second electrode.

9. The display device according to claim 8, wherein the insulating film is configured to function as a bank.

10. The display device according to claim 8, wherein the panel further comprises a sealant between the light-emitting element and the color conversion layer.

11. The display device according to claim 8, wherein the color conversion layer comprises a quantum dot and a light-transmitting resin.

12. The display device according to claim 8, wherein the insulating film comprises a metal film and a film having an insulating property.

13. The display device according to claim 8, wherein the microlens and the color conversion layer are spaced apart from each other.

14. A display device comprising a panel, the panel comprising:
a first pixel and a second pixel, the first pixel comprising:
a light-emitting element;
a microlens; and
a color conversion layer,
wherein the light-emitting element comprises:
a first electrode;
a layer containing a light-emitting material over the first electrode; and
a second electrode over the layer containing a light-emitting material,
wherein the microlens is interposed between the light-emitting element and the color conversion layer,
wherein the microlens has a convex portion facing the color conversion layer,
wherein the light-emitting element is configured to emit a first light, wherein the color conversion layer is configured to convert the first light into a second light,
wherein an insulating film is provided over the first electrode,
wherein the insulating film comprises an opening portion overlapping with the light-emitting element,
wherein the opening portion has an inclined surface on a first side wall,
wherein the inclined surface is configured to reflect the first light toward the microlens,
wherein the insulating film is configured to separate the first pixel and the second pixel,
wherein the convex portion of the microlens is covered by a sealant, and
wherein the microlens has an inclined side surface which is not covered by the sealant.

15. The display device according to claim 14, wherein the panel further comprises a sealant between the light-emitting element and the color conversion layer.

16. The display device according to claim 14, wherein the color conversion layer comprises a quantum dot and a light-transmitting resin.

17. The display device according to claim 14, wherein the insulating film comprises a metal film and a film having an insulating property.

18. The display device according to claim 14, wherein the microlens and the color conversion layer are spaced apart from each other.

* * * * *